(12) United States Patent
Yanai et al.

(10) Patent No.: US 7,399,662 B2
(45) Date of Patent: Jul. 15, 2008

(54) METHOD OF MANUFACTURING A THIN FILM TRANSISTOR DEVICE

(75) Inventors: Ken-ichi Yanai, Kawasaki (JP); Yoshio Nagahiro, Kawasaki (JP); Kazushige Hotta, Kawasaki (JP); Koji Ohgata, Sagamihara (JP); Yasuyoshi Mishima, Kawasaki (JP); Nobuo Sasaki, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/246,812

(22) Filed: Oct. 7, 2005

(65) Prior Publication Data

US 2006/0081946 A1 Apr. 20, 2006

Related U.S. Application Data

(62) Division of application No. 10/832,544, filed on Apr. 27, 2004, now abandoned, which is a division of application No. 10/105,137, filed on Mar. 22, 2002, now Pat. No. 7,038,283.

(30) Foreign Application Priority Data

Aug. 2, 2001 (JP) .............................. 2001-235283

(51) Int. Cl.
*H01L 21/00* (2006.01)

(52) U.S. Cl. ..................... 438/149; 438/153; 438/154; 257/E21.679; 257/E21.689

(58) Field of Classification Search ............. 438/217, 438/276, 289, 291, 149, 153, 154, E21.689; 257/E21.679

See application file for complete search history.

(56) References Cited

U.S. PATENT DOCUMENTS

| 5,518,940 | A | 5/1996 | Hodate et al. ............ 437/41 |
| 6,259,120 | B1 | 7/2001 | Zhang et al. ............ 257/72 |
| 6,365,917 | B1 | 4/2002 | Yamazaki ............ 257/72 |
| 2002/0142554 | A1 | 10/2002 | Nakajima ............ 438/301 |
| 2004/0232423 | A1 | 11/2004 | Ohtani ............ 257/66 |

FOREIGN PATENT DOCUMENTS

| JP | 5-142571 | 6/1993 |
| JP | 7-249766 | 9/1995 |
| JP | 8-220505 | 8/1996 |
| JP | 10-27909 | 1/1998 |
| JP | 10-170953 | 6/1998 |

*Primary Examiner*—Long K. Tran
(74) *Attorney, Agent, or Firm*—Greer, Burns & Crain, Ltd.

(57) ABSTRACT

A method of making a thin film transistor device, including forming and patterning a semiconductor film to form first and second semiconductor films in, respectively, low-voltage driven and high-voltage driven thin film transistor formation regions. The method also includes forming a first insulating film on the first and second semiconductor films, and forming a first gate electrode on the first insulating film in the low-voltage driven thin film transistor formation region. Additionally, a second insulating film is formed on the entire surface of the resultant structure above the substrate, and a second gate electrode is formed on the second insulating film in the high-voltage driven thin film transistor formation region. The method also includes etching the first and second insulating films, thus forming first and second gate insulating films below, respectively, the first and second gate electrodes, with the second gate insulating film being wider than the second gate electrode.

4 Claims, 53 Drawing Sheets

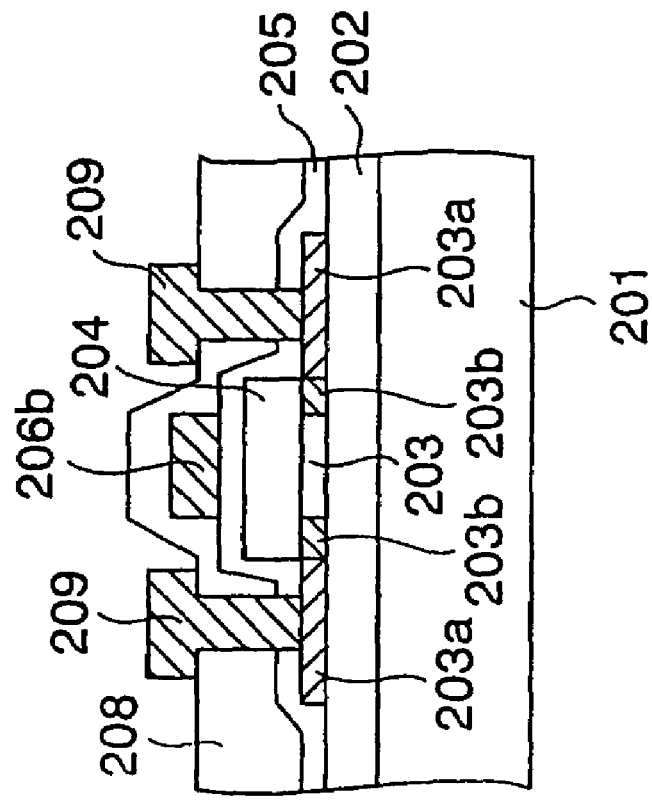
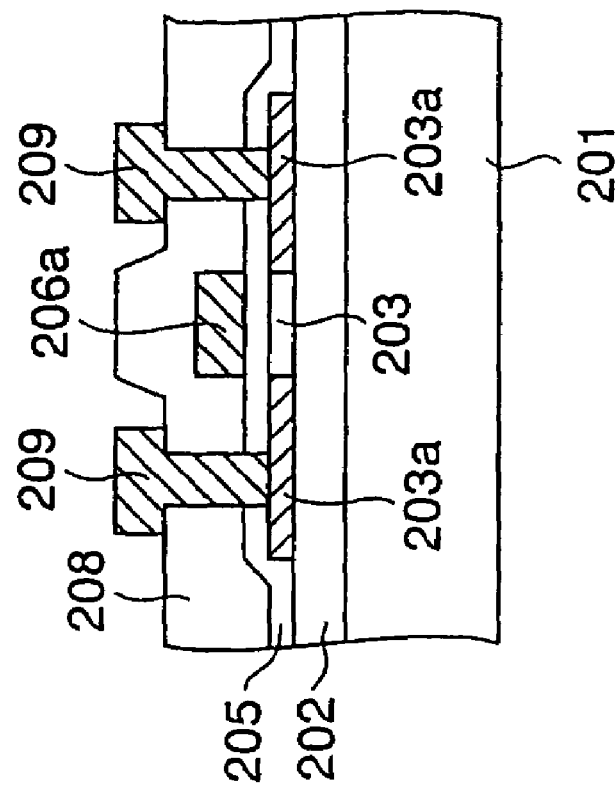

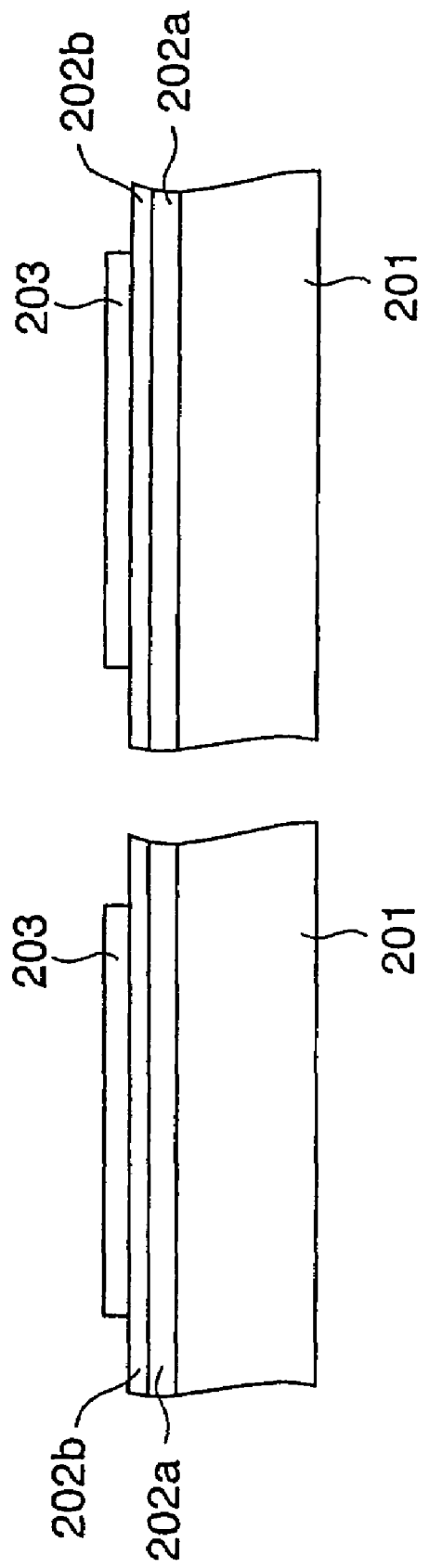

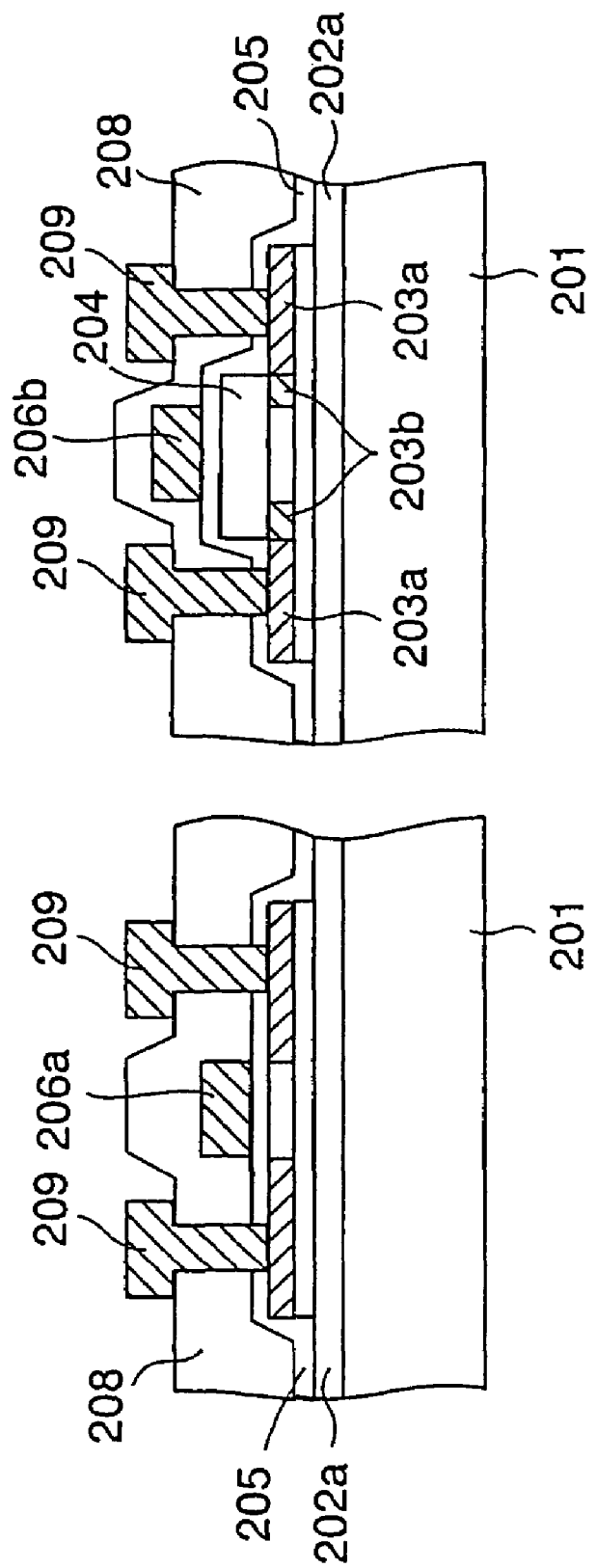

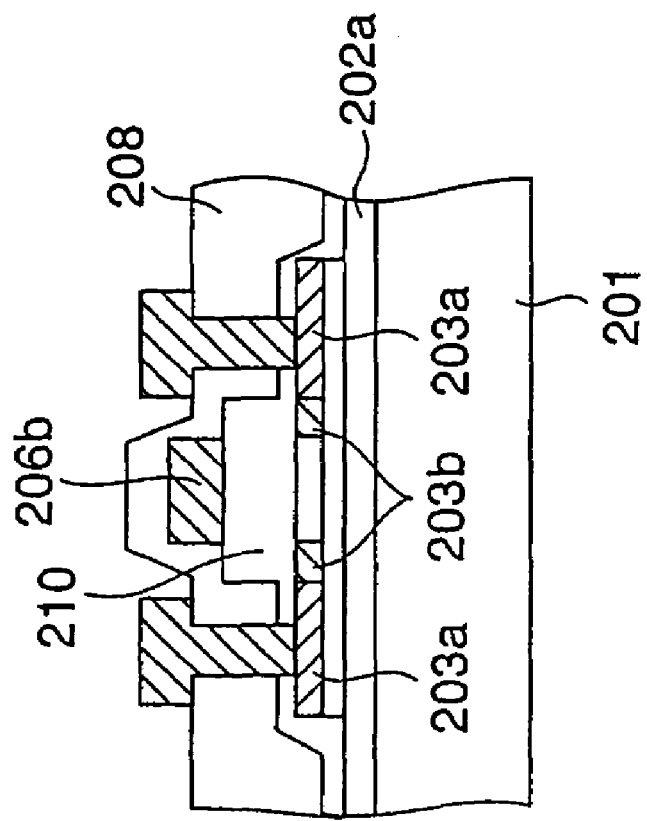
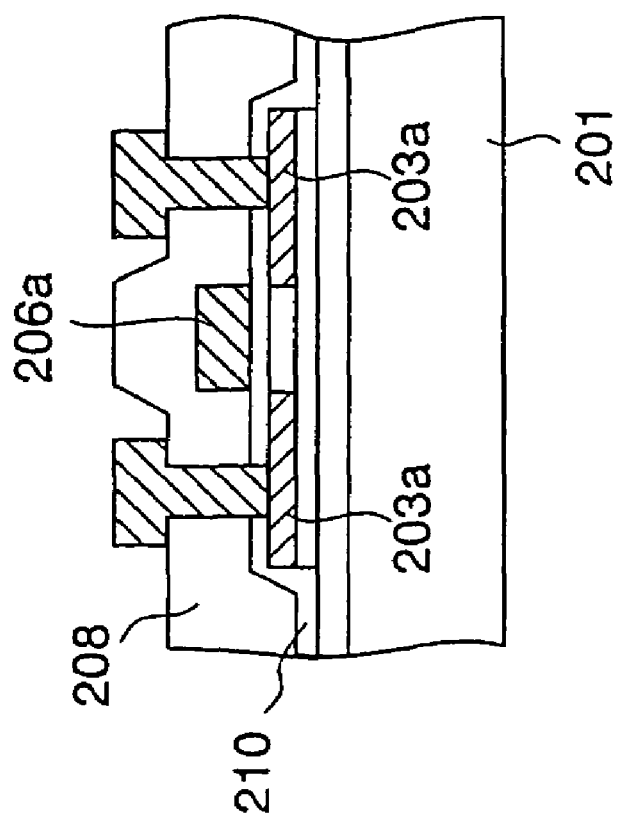

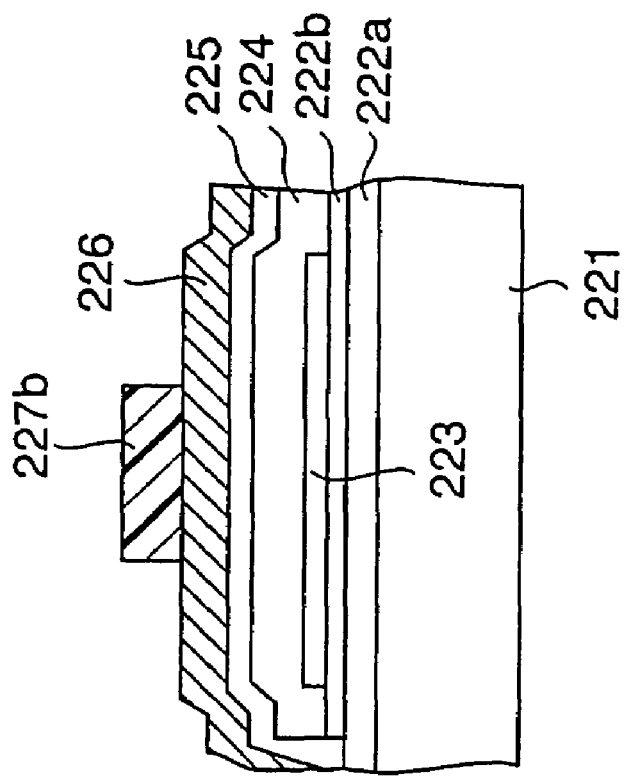
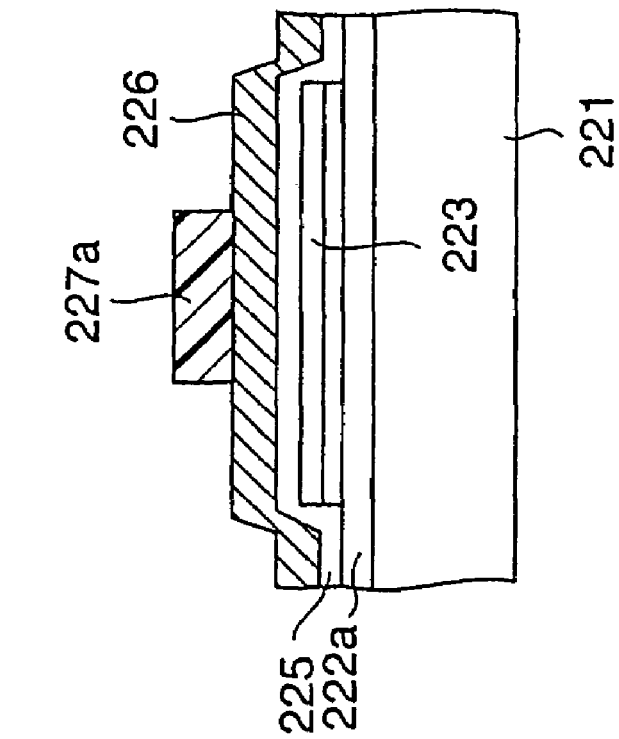

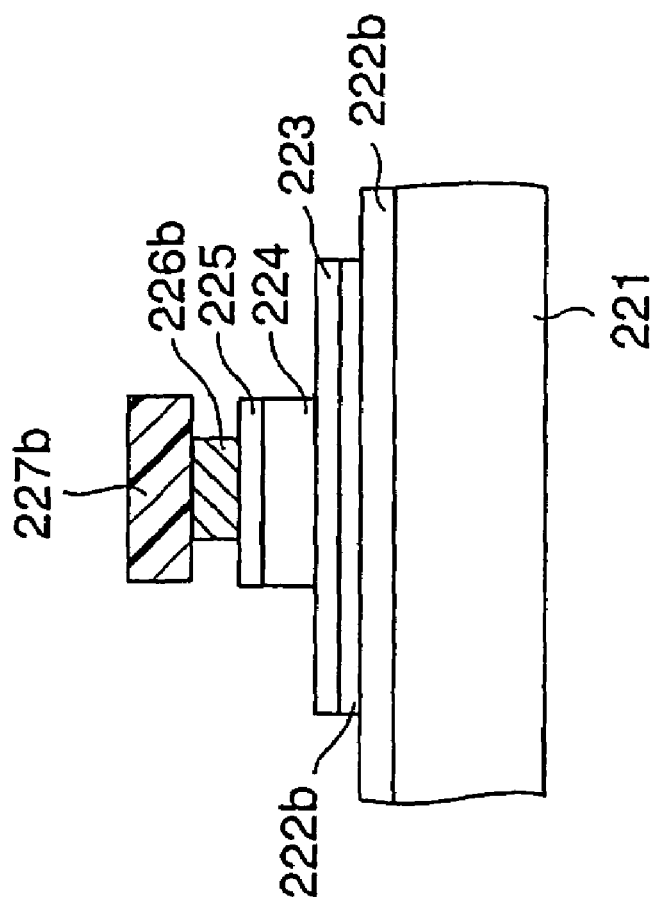
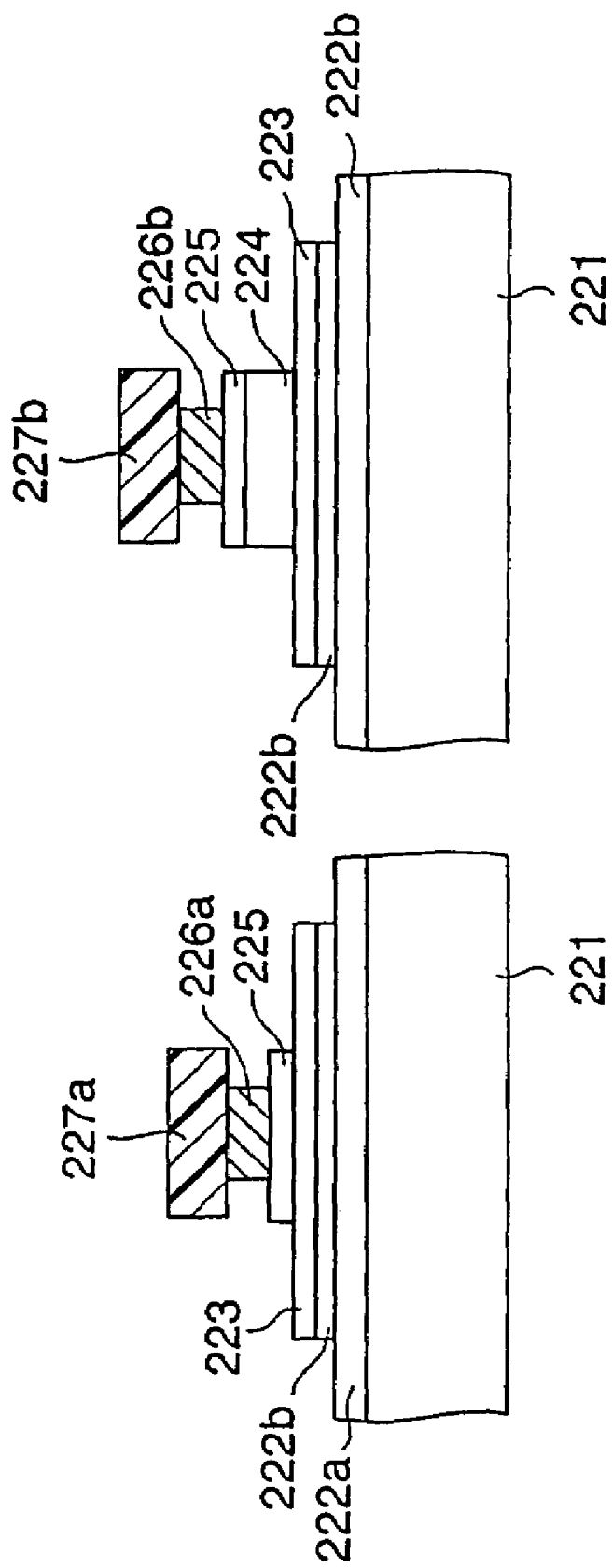

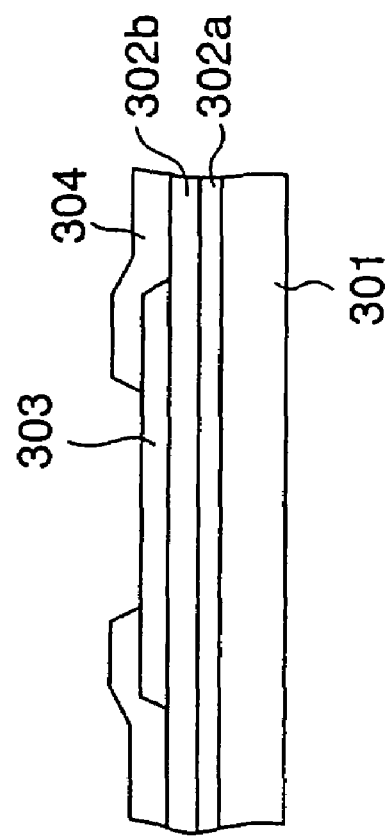
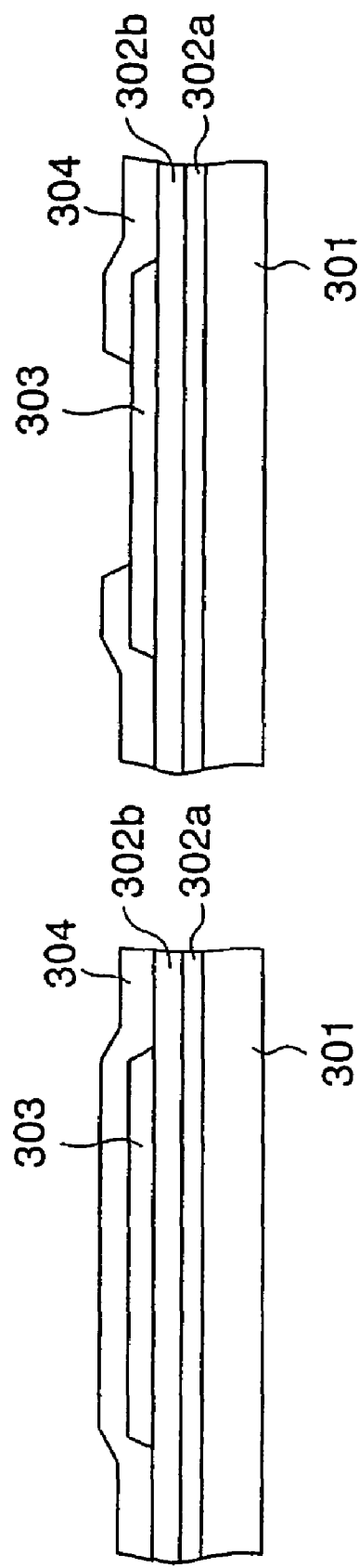
FIG. 36A
FIG. 36B

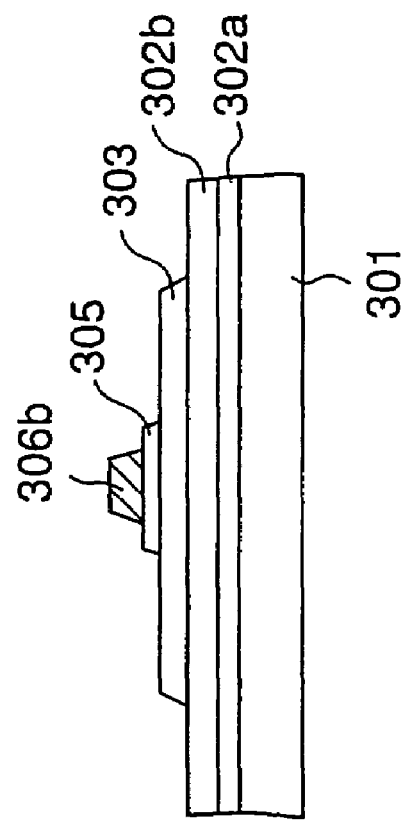
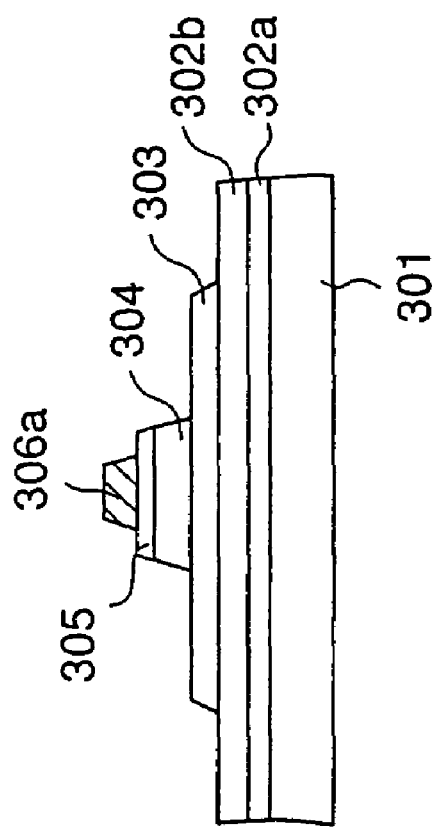

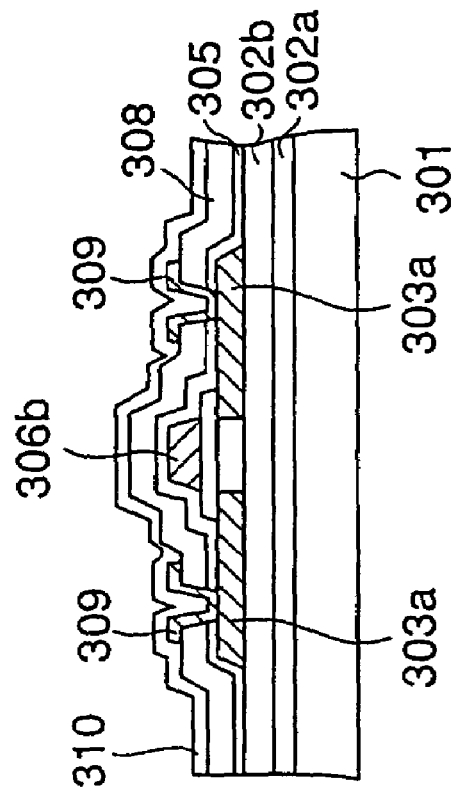
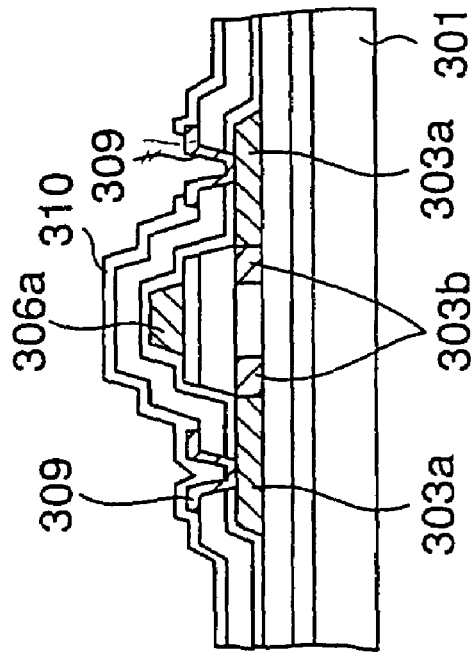
FIG. 42A
FIG. 42B

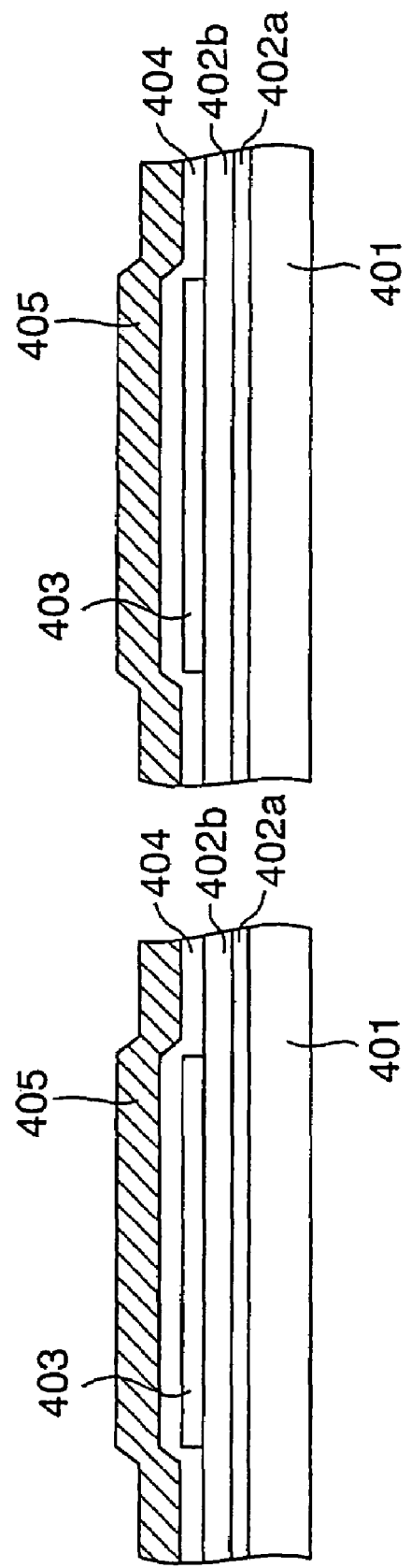

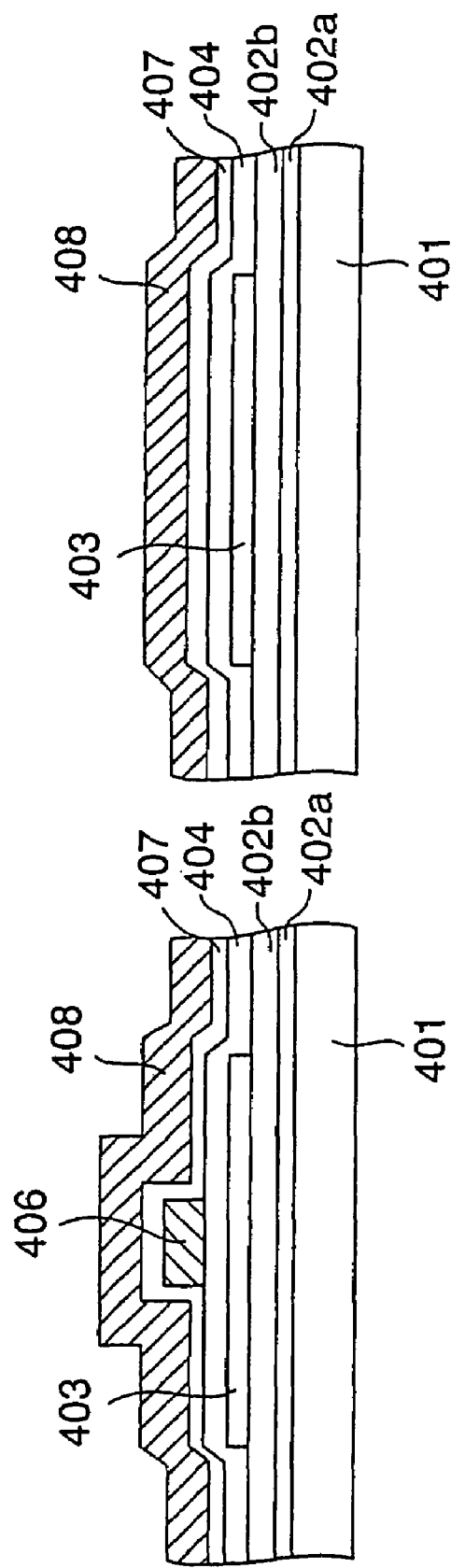

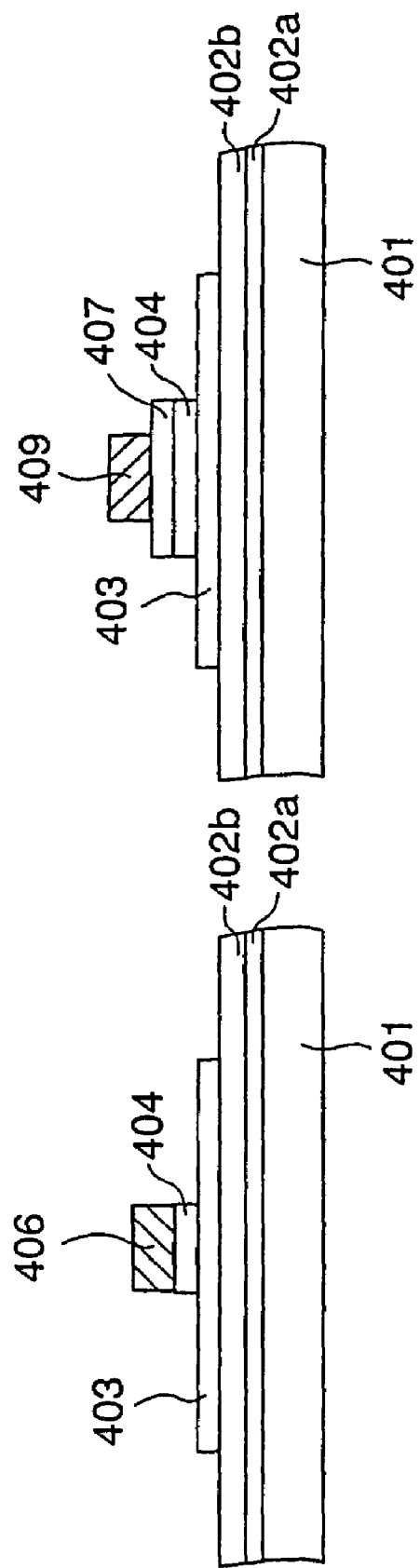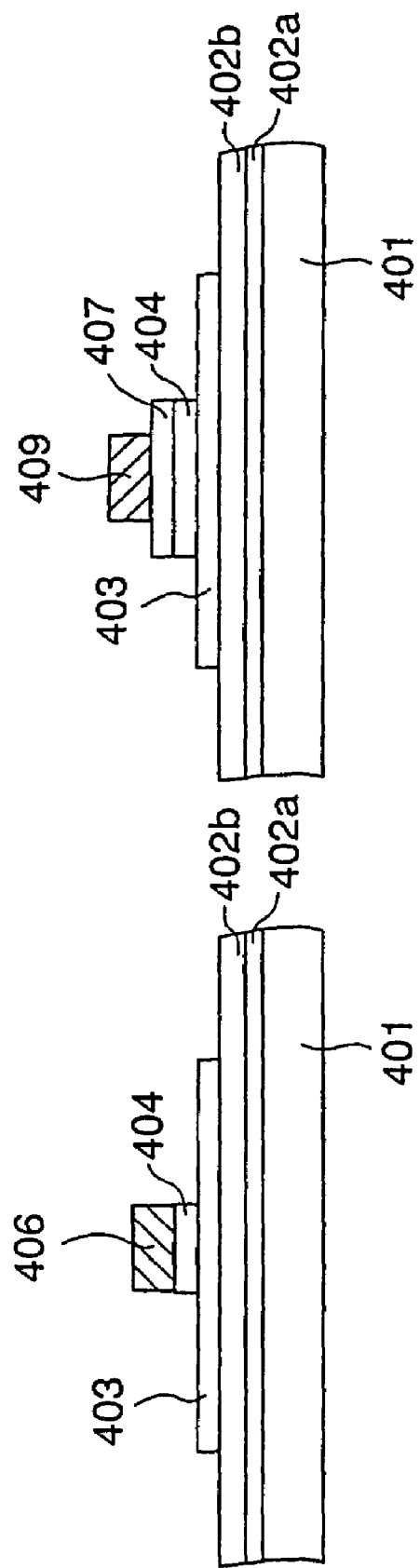

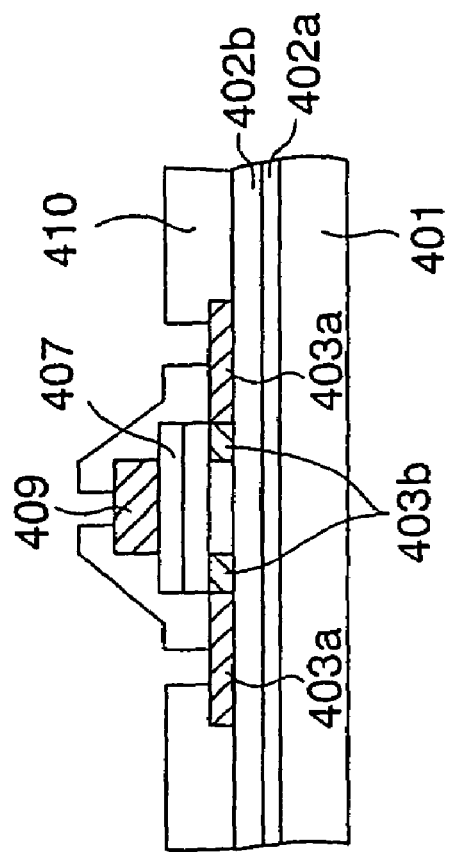
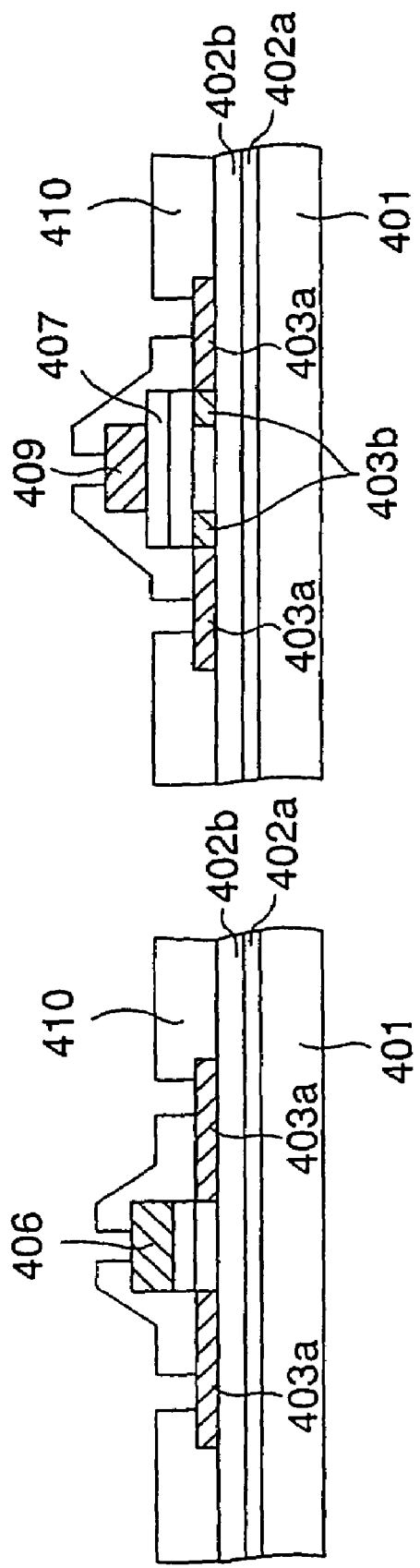
FIG. 56A
FIG. 56B

METHOD OF MANUFACTURING A THIN FILM TRANSISTOR DEVICE

CROSS-REFERENCE TO RELATED APPLICATIONS

This application is based upon and claims priority of Japense Patent Application No. 2001-235283, filed on Aug. 2, 2001, and is a divisional of U.S. application Ser. No. 10/832,544, filed Apr. 27, 2004, which is a divisional of U.S. application Ser. No. 10/105,137, filed Mar. 22, 2002, now U.S. Patent No. 7,038,283, the contents being corporated herein by reference.

This application is based upon and claims priority of Japanese Patent Applications No. 2001-235283, filed in Aug. 2, 2001, the contents being incorporated herein by reference.

BACKGROUND OF THE INVENTION

1. Field of the Invention

The present invention relates to a thin film transistor device having at least two kinds of thin film transistors, each having a gate insulating film, a thickness of which is different from that of the other, and to a method of manufacturing the same. More particularly, the present invention relates to a thin film transistor device which can be applied to a liquid crystal display apparatus united with peripheral circuits and an organic EL display apparatus and to a method of manufacturing the same.

2. Description of the Prior Art

As display apparatuses of electronic instruments such as notebook type personal computers and portable terminals, a liquid crystal display panel and an organic electro luminescence (EL) display panel have been used. A plurality of pixels are arranged in horizontal and vertical directions in these display panels, and a desired image is displayed by controlling a voltage applied to each pixel. In an active matrix type liquid crystal display panel, one or a plurality of thin film transistors (TFTs) are provided for each pixel.

In recent years, development of a display panel united with peripheral circuits such as a driver (driving circuit), which are formed on a substrate thereof, has proceeded, and such products of the display panel have been put into practical use. Moreover, development of a so-called system-on-glass device, in which a memory, an image correction arithmetic circuit, and an arithmetic circuit having a high data processing function are formed on a display panel, has proceeded.

FIG. 1 is a section view showing an example of a TFT (n-type) used for a conventional liquid crystal display apparatus united with a peripheral circuit.

An underlayer insulating film 11 made of a silicon oxide film or the like is formed on a substrate 10, and a polysilicon film 12 serving as an operational layer of the TFT is selectively formed on the underlayer insulating film 11. In the polysilicon film 12, a pair of high concentration impurity regions (source/drain) 13 formed by doping n-type impurities thereinto at a high concentration are formed so as to sandwich a channel region therebetween. In tip portions of these high concentration impurity regions 13 closer to the channel region, low concentration impurity regions, lightly doped drain (hereinafter referred to as LDD region) 14, which are formed by doping n-type impurities thereinto at a low concentration, are respectively formed.

A gate insulating film 15 made of a silicon oxide film or the like is formed on the underlayer insulating film 11 and the polysilcon film 12, and a gate electrode 16 is formed on the gate insulating film 15. Moreover, an interlayer insulating film 17 made of a silicon oxide film or the like is formed on the gate insulating film 15 and the gate electrode 16.

Electrodes (source electrode and drain electrode) 18 are formed on the interlayer insulating film 17. These electrodes 18 are electrically connected to the respective high concentration impurity regions 13 via contact holes formed in the interlayer insulating film 17 and the gate insulating film 15.

As shown in FIG. 1, in order to suppress deterioration of an ON characteristic due to hot carriers and to decrease an OFF current, the TFT of the liquid crystal display apparatus united with peripheral circuits generally has an LDD structure, in which the low concentration impurity regions 14 are formed in the tip portions of the high concentration impurity regions 13 closer to the channel region. When viewed from above, an edge of each low concentration impurity region 14 is located approximately just below the gate electrode 16. Note that the portions corresponding to the low concentration impurity regions 14 may be used also as an offset region without doping the impurities into those portions.

FIGS. 2A and 2B are section views showing other examples of conventional TFTs. FIG. 2A shows a structure of a low-voltage driven TFT, and FIG. 2B shows a structure of a high-voltage driven TFT. These low and high-voltage driven TFTs are formed on the same substrate 20.

An underlayer insulating film 21 is formed on the substrate 20, and a polysilicon film 22 serving as an operational layer of the TFT is formed on the underlayer insulating film 21. The underlayer insulating film 21 is made of, for example, a silicon oxide film ($SiO_2$), and has a thickness of about 80 nm. Moreover, a thickness of the polysilicon film 22 is about 50 nm.

As shown in FIG. 2A, a pair of high concentration impurity regions 23 serving as a source/drain are formed in the polysilicon film 22 of the low-voltage driven TFT so as to sandwich a channel region. A thin gate insulating film 25a is formed on the channel region of the low-voltage driven TFT, which is formed in the polysilicon film 22, and a gate electrode 26a is formed on the gate insulating film 25a. The gate insulating film 25a is made of, for example, a silicon oxide film, and has a thickness of about 30 nm.

On the other hand, as shown in FIG. 2B, in a polysilicon film 22 of the high-voltage driven TFT, a pair of high concentration impurity regions 23 are formed so as to sandwich a channel region. Moreover, in this polysilicon film 22, low concentration impurity regions (LDD regions) 24 are formed so that each is located between the respective high concentration impurity regions 23 and the channel region. A thick gate insulating film 25b is formed on the channel region and the low concentration impurity regions 24 in the polysilcon film of the high-voltage driven TFT, and a gate electrode 26b is formed on the gate insulating film 25b. The gate insulating film 25b is made of, for example, a silicon oxide film, and has a thickness of about 130 nm. Moreover, the gate electrodes 26a and 26b of the low and high-voltage driven TFTs are made of, for example, Cr (chromium), and have a thickness of about 400 nm.

The polysilicon film 22 and the gate electrodes 26a and 26b are covered with an interlayer insulating film 27 made of a silicon nitride film (SiN) or the like. A thickness of the interlayer insulating film is, for example, 300 nm. Electrodes (source electrodes and drain electrodes) 28, which are electrically connected to the respective high concentration impurity regions 23 via contact holes formed in the interlayer insulating film 27, are formed on the interlayer insulating film 27.

Since the low-voltage driven TFT shown in FIG. 2A has a thin gate insulating film and no LDD region showing a high resistivity, this TFT can perform a high speed operation with a low voltage. Since the high-voltage driven TFT shown in FIG. 2B has a thick gate insulating film and the low concentration impurity regions (LDD region) 24 provided therein, which prevent occurrence of hot carriers, this TFT can prevent deterioration of characteristics even when this TFT is driven with a high voltage.

In Japanese Patent Laid-open No. 10(1998)-27909, No. 10(1998)-170953, No. 5(1993)-142571 and No. 7(1995)-249766, technologies for forming transistors having gate insulating films of different thickness in the same semiconductor substrate are disclosed.

In Japanese Patent Laid-open No. 8(1996)-220505, a technology is proposed, in which of a high and low-voltage driven transistors used for a liquid crystal display apparatus, only the high-voltage driven transistor is constructed of an LDD structure.

The inventors of this application consider that there are the following problems in the above described conventional thin film transistor device.

Since the TFT shown in FIG. 1 has the LDD structure, this TFT can suppress deterioration of characteristics due to hot carriers. An ON characteristic is restricted by a resistivity of the low concentration impurity regions (LDD layer) 14. Therefore, a high speed operation of the TFT is disturbed, thus producing obstacles in incorporating high function circuits such as an image data memory and an image processing arithmetic circuit, of which a high speed operation is required, into a display panel.

In the TFT shown in FIG. 2A, the thickness of the gate insulating film 25a is small, and the gate insulating film 25a is formed so as to have the same width as that of the electrode 26a. Accordingly, a gap between the gate electrode 26a and the source/drain (high concentration impurity region 23) is very small. Impurities, contaminant ions and the like adhere to a side wall of the gate insulating film 25a in a step such as etching, and a leak current is apt to occur when a gap between the gate electrode 26a and the source/drain is small.

When the conventional low and high-voltage driven TFTs shown in FIGS. 2A and 2B are formed on the same substrate, the gate insulating film 25a and the gate electrode 26a of the low-voltage driven TFT are formed, and then the gate insulating film 25b and the gate electrode 26b of the high-voltage driven TFT are formed. In this case, a surface of the polysilicon film 22 is treated by solution containing hydrofluoric acid to purify an interface between the polysilicon film 22 and the gate insulating film 25b. At this time, the gate insulating film 25a of the low-voltage driven TFT is corroded by the hydrofluoric acid solution, and the leak current is more apt to occur.

SUMMARY OF THE INVENTION

An object of the present invention is to provide a thin film transistor device which can be applied to a liquid crystal display apparatus, an organic EL display apparatus and the like, which comprise low and high-voltage driven TFTs, any of which has a good characteristic, and to provide a method of manufacturing the same.

A thin film transistor device, which comprises a plurality of first, second and third thin film transistors, each including first, second and third semiconductor films formed on a substrate, first and second insulating films, and first, second and third gate electrodes, wherein in a formation region for forming the first thin film transistor, the first insulating film is formed on the first semiconductor film, the first gate electrode is formed on the first insulating film, the second insulating film is formed on the first insulating film and the first gate electrode, and a pair of high concentration impurity regions in which tip portions thereof closer to a channel region are positioned below edges of the first gate electrode are formed in the first semiconductor film, thus forming the first thin film transistors; in a formation region for forming second thin film transistor, the first and second insulating films are laminated on the second semiconductor film, the second gate electrode is formed on the second insulating film, and a pair of high concentration impurity regions in which at least one tip portion thereof closer to a channel region overlaps an edge portion of the second gate electrode when viewed from above are formed in the second semiconductor film, thus forming the second thin film transistors; and in a formation region of the third thin film transistor, the first and second insulating films are laminated on the third semiconductor film, the third gate electrode is formed on the second insulating film, a pair of high concentration impurity regions and a pair of low concentration impurity regions, which are arranged between the respective high concentration impurity regions and a channel region and in which a tip portion closer to the channel region is disposed below an edge of the third gate electrode, are formed, thus forming the third thin film transistors.

In the present invention, the first insulating film is used as a gate insulating film of the first thin film transistor, and the first and second insulating films are laminated to be used as gate insulating films of the second and third thin film transistors. Specifically, in the thin film transistor device of the present invention, the first thin film transistor having the thin gate insulating film and the second and third thin film transistors having the thick gate insulating film are formed on the same substrate. The thin film transistor having the thin gate insulating film can operate at a high speed even at a low voltage of, for example, 5 V or less. Moreover, since the thin film transistor having the thick gate insulating film shows a high withstand voltage, this thin film transistor can be driven at a high voltage.

Accordingly, like the thin film transistor device of the present invention, by providing on the same substrate a circuit which is constituted by the thin film transistor having the thin gate insulating film and operates at a high speed and at a low voltage and a circuit which is constituted by the thin film transistor having the thick gate insulating film and operates at a high voltage, high performance of electronic apparatuses such as a liquid crystal display apparatus and an organic EL display apparatus can be achieved.

For example, in the case of the liquid crystal display apparatus, three kinds of thin film transistors are necessary, which include transistors for a logic circuit, which operate at a high speed, transistors (high-voltage driven TFT) for a driving circuit, which operate at a high voltage, and pixel transistors (pixel TFT) arranged for each of the pixel elements.

It is important to lower a driving voltage in order to allow the thin film transistor to operate at a high speed. As described above, it is possible to lower the driving voltage by forming the gate insulating film to be thin. Moreover, since hot electrons are not apt to be generated by lowering the driving voltage, LDD regions and an offset region need not to be provided. Thus, edges of the impurity region (source/drain) closer to the channel region can be arranged approximately just below edges of the gate electrode. In addition, it is possible to form the impurity region in self-alignment with the gate electrode, thus making it possible to fabricate minute devices. Furthermore, since this thin film transistor has no LDD region, an ON characteristic is enhanced, thus realizing a high speed operation of the circuit. By constituting the driving circuit by the thin film transistor which is driven at a low voltage, power consumption can be reduced.

In an n-type TFT among the high-voltage driven TFTs, a source potential never becomes higher than a drain potential, there is possibility of generation of the hot electron only on the drain side. Accordingly, in the n-type high-voltage driven TFT, the LDD region or the offset region may be provided only on the drain side. With such a structure, a decrease of the ON characteristic due to LDD resistance can be suppressed to a minimum.

Furthermore, in a p-type TFT among the high-voltage driven TFT, since carriers are holes, it is unlikely that hot electrons are generated. Accordingly, in the p-type high-voltage driven TFT, it is unnecessary to provide the LDD region or the offset region.

In the pixel TFT, positive and negative signals are supplied as a display signal. Accordingly, in the pixel TFT, it is necessary to provide the LDD region or the offset region on both of the source and drain sides.

A method of manufacturing a thin film transistor device, which comprises a step for forming a semiconductor film on a substrate, patterning the semiconductor film to form first, second and third semiconductor films; a step for forming a first insulating film on the substrate, the first insulating film covering the first, second and third semiconductor films; a step for forming a first metal film on the first insulating film, patterning the first metal film, forming a first gate electrode on the first insulating film above the first semiconductor film, and forming first and second metal patterns on the first insulating film above the second and third semiconductor films; a first impurity injection step for injecting impurities into the first, second and third semiconductor films using the first gate electrode and the first and second metal patterns as a mask; a step for removing the first and second metal patterns; a step for forming a second insulating film on the first insulating film and the first gate electrode above the first, second and third semiconductor films; a step for forming second and third gate electrodes on the second insulating film above the second and third semiconductor films; and a second impurity injection step for injecting impurities into the third semiconductor film using said third gate electrode as a mask.

In the present invention, the first metal film is formed on the first insulating film, and the first metal film is patterned, thus forming the gate electrode (the first gate electrode) of the first thin film transistor and the first and second metal patterns. Then, impurities are injected into the first, second and third semiconductor films using the first gate electrode and the first and second metal patterns as a mask. Thus, the impurity regions serving as source/drain of the first, second and third thin film transistors are formed.

Thereafter, the first gate electrode is left, and the first and second metal patterns are removed. Then, the second insulating film is formed on the first insulating film and the first gate electrode, and the gate electrodes (the second and third gate electrodes) of the second and third thin film transistors are formed on the second insulating film.

In the present invention, the gate insulating film of the first thin film transistor is constituted by the first insulating film alone, and the gate insulating films of the second and third thin film transistors are constituted by laminating the first and second insulating films. Accordingly, it is possible to manufacture the thin film transistors having the gate insulating films with different thicknesses in the same step. Furthermore, since in the first thin film transistor, the impurity regions are formed in self-alignment with the gate electrode (the first gate electrode), minute devices can be manufactured. At the same time, since the first thin film transistor has no LDD region or offset region, the ON characteristic is excellent.

In the second and third thin film transistor formation regions, after impurity regions serving as source/drain are formed, the second insulating film is formed, and the gate electrodes (the second and third gate electrodes) are formed on the second insulating film. At this time, by adjusting a width and a position of resist for forming the gate electrode, the LDD region can be provided, and it is possible to allow tip portions of the high concentration impurity regions closer to the channel region to overlap edge portions of the gate electrode when viewed from above.

A thin film transistor device, which comprises first and second thin film transistors formed on a substrate, wherein the first thin film transistor includes a first semiconductor film having a pair of high concentration impurity regions which are formed so as to sandwich a channel region; a first gate insulating film formed on the channel region of the first semiconductor film and the pair of high concentration impurity regions; and a first gate electrode formed on the first gate insulating film, and the second thin film transistor includes a second semiconductor film having a pair of high concentration impurity regions formed so as to sandwich a channel region, and a pair of low concentration impurity regions, each being formed between the corresponding one of the high concentration impurity regions and the channel region; a second gate insulating film constituted by a thick film portion covering the channel region and the low concentration impurity regions of the second semiconductor film and a thin film portion covering the high concentration impurity regions; and a second gate electrode formed on the thick film portion of the second gate insulating film.

In the present invention, the low-voltage driven thin film transistor having the thin gate insulating film under the gate electrode and the high-voltage driven thin film transistor having the thick gate insulating film under the gate electrode are formed on the same substrate. Moreover, in these thin film transistors, the gate insulating film is formed not only below the gate electrode but also on the high concentration impurity region (source/drain).

Accordingly, it is possible to prevent leak current from flowing between the gate electrode and the high concentration impurity region via a side wall of the gate insulating film. Furthermore, in the high-voltage driven thin film transistor formation region, the impurities are injected into the semiconductor film via the thick film portion of the gate insulating film, whereby the LDD regions (low concentration impurity region) can be formed. Moreover, in the low-voltage driven thin film transistor formation region, the high concentration impurity regions can be formed in self-alignment with the gate electrode. Specifically, a mask for forming the LDD regions is unnecessary, and the manufacturing steps for forming the thin film transistor, which has the low-voltage driven thin film transistor without the LDD regions and the high-voltage driven thin film transistor with the LDD regions on the same substrate, are simplified.

A thin film transistor device, which comprises first and second thin film transistors formed on a substrate, wherein the first thin film transistor includes a first semiconductor film having a pair of high concentration impurity regions which are formed so as to sandwich a channel region, and a pair of pseudo LDD regions, each being formed by introducing impurities between the corresponding one of the high concentration impurity regions and the channel region; a first gate insulating film formed on the channel region of the first semiconductor film and the pair of pseudo LDD regions; and a first gate electrode formed on the gate insulating film, the second thin film transistor includes a second semiconductor film having a pair of high concentration impurity regions formed so as to sandwich a channel region, and a pair of low concentration impurity regions, each having a impurity concentration lower than that of the pseudo LDD region of the first thin film transistor arranged between these impurity regions and the channel region; a second gate insulating film formed on the channel region and the low concentration impurity region of the second semiconductor film so as to be thicker than the first gate insulating film; and a second gate electrode formed on the second gate insulating film.

In the present invention, the low-voltage driven thin film transistor having the thin gate insulating film under the gate electrode and the high-voltage driven thin film transistor having the thick gate insulating film under the gate electrode are formed on the same substrate. The source/drain of the low-voltage driven thin film transistor is constituted by the high concentration impurity regions and the pseudo LDD regions. The pseudo LDD regions are the ones doped with the impurities at a concentration higher than that of the LDD regions, and show a low resistivity. Accordingly, it is possible to operate the low-voltage driven thin film transistor at a high speed even at a low voltage. Moreover, since the pseudo LDD regions and the LDD regions of the second thin film transistor can be formed in self-alignment with the gate insulating film, a special mask is unnecessary, and the sources/drains of the low and high-voltage driven thin film transistors can be formed by comparatively simple steps.

A method of manufacturing a thin film transistor device, which comprises a step for forming a semiconductor film on a substrate, patterning the semiconductor film to form a first semiconductor film in a low-voltage driven thin film transistor formation region, and to form a second semiconductor film in a high-voltage driven thin film transistor formation region; a step for forming a first insulating film only on the second semiconductor film of the first and second semiconductor films; a step for forming a second insulating film on the entire surface of the resultant structure above the substrate; a step for forming a first gate electrode on the second insulating film above the first semiconductor film, and forming a second gate electrode on the second insulating film above the second semiconductor film, the second gate electrode having a width smaller than that of the first insulating film; and a step for ion-implanting impurities into the first and second semiconductor films under conditions that the impurities pass through the second insulating film, thus forming high concentration impurity regions respectively at positions sandwiching the first gate electrode and at positions sandwiching the first insulating film, and ion-implanting impurities into the second semiconductor film under conditions that the impurities pass through the first and second insulating films laminated on the second semiconductor film, thus forming low concentration impurity regions at positions sandwiching the second gate electrode.

In the present invention, after the first semiconductor film is formed in the low-voltage driven thin film transistor formation region, and after the second semiconductor film is formed in the high-voltage driven thin film transistor formation region, the first insulating film is formed only on the second semiconductor film. Thereafter, the first insulating film and the first and second semiconductor films are covered with the second insulating film. Thus, the thin gate insulating film formed of the one-layered insulating film is formed in the low-voltage driven thin film transistor formation region. The thick gate insulating film formed of the two-layered insulating films is formed in the high-voltage driven thin film transistor formation region.

Thereafter, the gate electrode is formed on the second insulating film. At this time, in the high-voltage driven thin film transistor formation region, the width of the gate electrode is made smaller than that of the first insulating film, whereby a step difference is formed. Then, the LDD regions (low concentration impurity region) are formed by use of this step difference.

By adopting the above described method, the low and high-voltage driven thin film transistors can be formed on the same substrate comparatively easily. In addition, since the gate insulating film is formed on the source/drain regions (high concentration impurity region) of each thin film transistor, a leak current flowing between the gate electrode and the high concentration impurity region via a side portion of the gate insulating film can be prevented.

A method of manufacturing a thin film transistor device, which comprises a step for forming a semiconductor film on a substrate, patterning the semiconductor film to form a first semiconductor film in a low-voltage driven thin film transistor formation region and a second semiconductor film in a high-voltage driven thin film transistor formation region; a step for forming a first insulating film only on the second semiconductor film of the first and second semiconductor films; a step for forming a second insulating film on the entire surface of the resultant structure above the substrate; a step for forming a conductive film on the second insulating film; a step for forming a first mask pattern on the conductive film above the first semiconductor film, and forming a second mask pattern on the conductive film above the second semiconductor film; a step for side-etching the conductive film using the first and second mask patterns as a mask, and forming first and second gate electrodes having widths smaller than those of the first and second mask patterns; a step for etching the first and second insulating films anisotropically using the first and second mask patterns as a mask to form a first gate insulating film on the first semiconductor film and a second gate insulating film on the second semiconductor film; a step for removing the mask patterns; and a step for ion-implanting impurities into both sides of the first gate electrode of the first semiconductor film to form a pair of high concentration impurity regions, ion-implanting impurities into both sides of the second gate electrode of the second semiconductor film to form a pair of high concentration impurity regions, and ion-implanting impurities into the second semiconductor film using the second gate electrode as a mask under conditions that the impurities pass through the second gate insulating film, thus forming a pair of low concentration impurity regions on both sides of the second gate electrode.

In this embodiment, after the first semiconductor film is formed in the low-voltage driven thin film transistor formation region, and after the second semiconductor film is formed in the high-voltage driven thin film transistor formation region, the first insulating film is formed on the second semiconductor film. Then, the first insulating film and the first and second semiconductor films are covered with the second insulating film. Thereafter, the conductive film is formed on the second insulating film, and the first and second mask patterns are formed on the conductive film. The conductive film and the first and second insulating films are etched by use of these mask patterns as a mask, thus forming the gate electrode and the gate insulating film. At this time, the conductive film is side-etched, so that a width of the gate electrode is made smaller than those of the mask patterns. Moreover, the first and second insulating films are etched anisotropically, thus making a width of the gate insulating film equal to those of the mask patterns. Thus, a step difference between the gate electrode and the gate insulating film is formed. By utilizing the step difference, the LDD regions (low concentration impurity region) of the high-voltage driven thin film transistor can be formed in a self-alignment manner.

A thin film transistor device, which comprises a high-voltage driven thin film transistor and a low-voltage driven thin film transistor, which are formed on a substrate, wherein a gate insulating film of the high-voltage driven thin film transistor is constituted by laminating first and second insulating films; and a portion of a gate insulating film below a gate electrode of the low-voltage driven thin film transistor, where an edge portion of a semiconductor film of the low-voltage driven thin film transistor and the gate electrode intersect, is constituted by laminating the first and second insulating films, and other portions thereof is constituted by the second insulating film alone.

In the present invention, a portion of a gate insulating film below a gate electrode of the low-voltage driven thin film transistor, where an edge portion of a semiconductor film of the low-voltage driven thin film transistor and the gate electrode intersect, is constituted by laminating the first and second insulating films, and other portions thereof is constituted by the second insulating film alone. Accordingly, when the gate electrode is formed, the edge portions of the semiconductor film below the gate electrode is never exposed, and deterioration of a withstand voltage is avoided.

A method of manufacturing a thin film transistor, which comprises a step for forming a semiconductor film on a substrate, and patterning the semiconductor film to form a first semiconductor film in a low-voltage driven thin film transistor formation region and a second semiconductor film in a high-voltage driven film transistor formation region; a step for forming a first insulating film on the first and second semiconductor films; a step for removing by wet-etching the first insulating film on a central portion of the first semiconductor film; a step for forming a second insulating film on the entire surface of the resultant structure above the substrate; a step for forming a conductive film on the second insulating film; a step for forming a resist pattern with a predetermined shape of a gate electrode on the conductive film; a step for side-etching the conductive film using the resist pattern as a mask to form a first gate electrode above the first semiconductor film and a second gate electrode above the second semiconductor film; a step for etching the first and second insulating films anisotropically using the resist pattern as a mask; and an impurity injection step for injecting impurities into the first and second semiconductor films.

In the present invention, the first semiconductor film is formed in the low-voltage driven thin film transistor formation region, and the second semiconductor film is formed in the high-voltage driven thin film transistor formation region. The first insulating film is formed on the first and second semiconductor films. Then, the insulating film on the central portion of the first semiconductor film is removed. Thereafter, the second insulating film is formed on the entire surface of the resultant structure above the substrate. The gate insulating film can be formed, in which a portion below a gate electrode, where an edge portion of a semiconductor film and the gate electrode intersect, is thick, and other portions is thin. Etching of the underlayer film at the portion where the gate electrode and the edges of the semiconductor film intersect can be avoided by the gate insulating film, and a decrease in a gate withstand voltage can be avoided.

Moreover, in the present invention, the first insulating film on the central portion of the first semiconductor film is removed by wet-etching. Accordingly, since the semiconductor film is never exposed to plasma, damages of the semiconductor film due to the plasma is avoided, and deterioration of characteristics is prevented.

When the first insulating film on the central portion of the first semiconductor film is removed, the first insulating film on the region served as the high concentration impurity region in the second semiconductor film may be simultaneously removed. Thus, the LDD region of the high-voltage driven thin film transistor can be formed in a self-alignment manner without use of a mask.

A thin film transistor device, which comprises a high-voltage driven thin film transistor formed on a substrate; and a low-voltage driven thin film transistor formed on the substrate, wherein the low-voltage driven thin film transistor includes a first semiconductor film having a pair of high concentration impurity regions formed so as to sandwich a channel region; a first gate insulating film formed on the channel region of the first semiconductor film; and a first gate electrode formed on the first gate insulating film, and the high-voltage driven thin film transistor includes a second semiconductor film having a pair of high concentration impurity regions formed so as to sandwich a channel region, and low concentration impurity regions which are formed between these high concentration impurity regions and the channel regions; a second gate insulating film formed on the channel region and the low concentration impurity regions, the second gate insulating film being formed to be thicker than first gate insulating film; and a second gate electrode formed on the second gate insulating film.

The low-voltage driven thin film transistor of the thin film transistor device of the present invention has no LDD region, and has a thin gate insulating film. Accordingly, the low-voltage driven thin film transistor can be operated at a high speed even at a low voltage. In addition, since the high-voltage driven thin film transistor thereof has the thick gate insulating film and the LDD regions (low concentration impurity region) provided therein, the high-voltage driven thin film transistor can operate at a high voltage.

A method of manufacturing a thin film transistor device, which comprises a step for forming a semiconductor film on a substrate, and patterning said semiconductor film, thus forming a first semiconductor film in a low-voltage driven thin film transistor formation region and a second semiconductor film in a high-voltage driven thin film transistor formation region; a step for forming a first insulating film on said first and second semiconductor films; a step for forming a first gate electrode on the first insulating film above said first semiconductor film; a step for forming a second insulating film on the entire surface of the resultant structure above the substrate; a step for forming a second gate electrode on the second insulating film above the second semiconductor film; a step for etching the first and second insulating films, thus forming a first gate insulating film below the first gate electrode and a second gate insulating film below the second gate electrode, the second gate insulating film having a width larger than that of the second gate electrode; and a step for forming a pair of high concentration impurity regions by injecting impurities into the first semiconductor film of both sides of the first gate electrode film, for forming a pair of high concentration impurity regions by injecting impurities into the second semiconductor film of both sides of the second insulating film, and forming a pair of low concentration impurity regions by introducing impurities into the second semiconductor film on both sides of the second gate electrodes under conditions that the impurities pass through the second gate insulating film.

In the present invention, the first semiconductor film is formed in the low-voltage driven thin film transistor formation region, and the second semiconductor film is formed in the high-voltage driven thin film transistor formation region. Thereafter, the first insulating film is formed on the first semiconductor film, thus using the first insulating film as the gate insulating film of the low-voltage driven thin film transistor. The first and second insulating films are laminated on the second semiconductor film, thus using the first and second insulating films as the gate insulating film of the high-voltage driven thin film transistor. Thus, the two kinds of the gate insulating films having different thicknesses can be formed easily.

Moreover, in the present invention, when the gate electrode of the high-voltage driven thin film transistor is formed, a step difference is formed by making the width of the gate electrode smaller than that of the gate insulating film, and the LDD regions (low concentration impurity region) are formed by utilizing the step difference. Thus, the manufacturing steps are simplified.

BRIEF DESCRIPTION OF THE DRAWINGS

FIG. 20A is a section view showing a structure of a low-voltage driven TFT of a thin film transistor device (liquid crystal display apparatus) of a third embodiment of the present invention.

FIG. 20B is a section view showing a structure of a high-voltage driven TFT thereof.

FIG. 21 is a section view (1) showing a method of manufacturing the thin film transistor device of the third embodiment.

FIG. 25 is a section view (5) showing a method of manufacturing the thin film transistor device of the third embodiment.

FIG. 26 is a section view showing a modification of the thin film transistor device of the third embodiment.

FIG. 29 is a section view (2) showing a method of manufacturing the thin film transistor device of the fourth embodiment.

FIG. 30 is a section view (3) showing a method of manufacturing the thin film transistor device of the fourth embodiment.

FIG. 36 is a section view (2) showing a method of manufacturing the thin film transistor device of the fifth embodiment.

FIG. 38 is a section view (4) showing a method of manufacturing the thin film transistor device of the fifth embodiment.

FIG. 42 is a section view (8) showing a method of manufacturing the thin film transistor device of the fifth embodiment.

FIG. 50 is a section view (1) showing a method of manufacturing a thin film transistor device of a seventh embodiment of the present invention.

FIG. 52 is a section view (3) showing a method of manufacturing the thin film transistor device of the seventh embodiment of the present invention.

FIG. 54 is a section view (5) showing a method of manufacturing the thin film transistor device of the seventh embodiment of the present invention.

FIG. 56 is a section view (7) showing a method of manufacturing the thin film transistor device of the seventh embodiment of the present invention.

DETAILED DESCRIPTION OF THE PREFERRED EMBODIMENTS

Embodiments of the present invention will be described with reference to the accompanying drawings below.

First Embodiment

Figure 3:
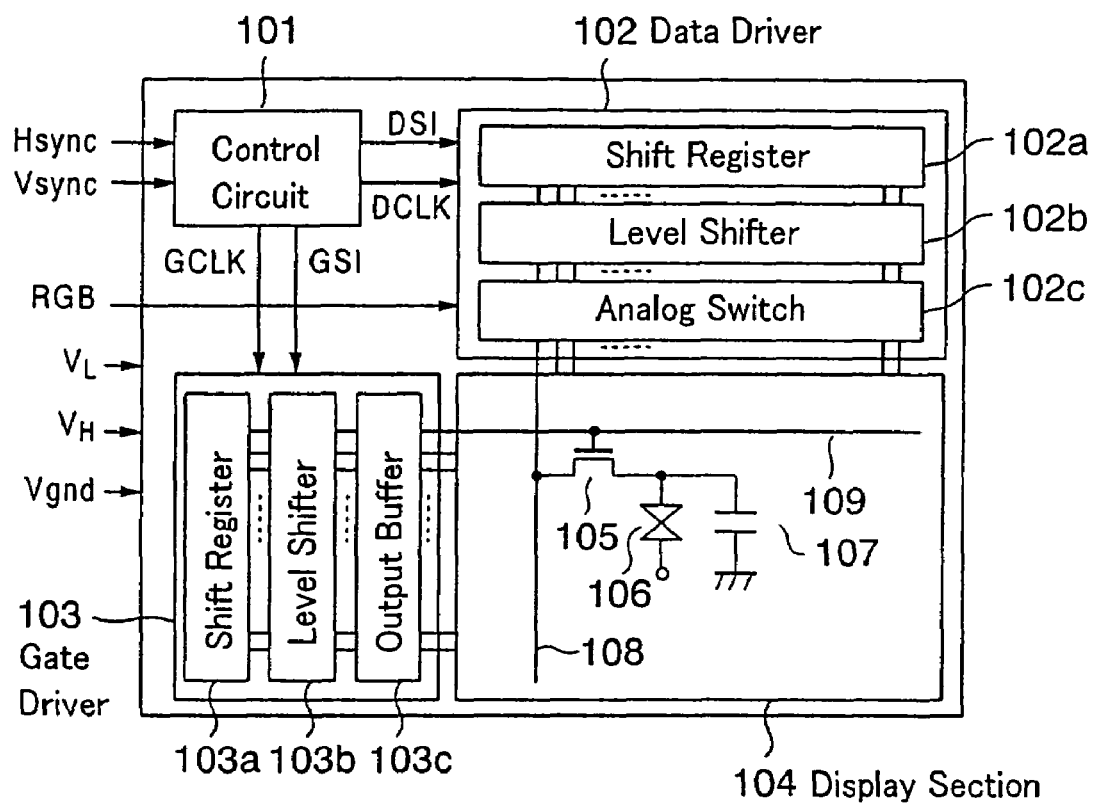
FIG. 3 is a block diagram showing a structure of a thin film transistor device (transmission type liquid crystal display apparatus) of a first embodiment of the present invention.

FIG. 3 is a block diagram showing a constitution of a thin film transistor device (transmission type liquid crystal display apparatus) of a first embodiment of the present invention. Note that a liquid crystal display apparatus in a XGA (1024× 768 pixels) mode is described in this embodiment. One pixel is composed of three pixel electrodes of R (red), G (green) and B (blue).

The liquid crystal display apparatus of this embodiment is constituted by a control circuit 101, a data driver 102, a gate driver 103 and a display section 104. Display signals RGB (a R (red) signal, a G (green) signal and a B (blue) signal), a horizontal synchronous signal Hsync, a vertical synchronous signal Vsync and the like are supplied to the liquid crystal display apparatus from an external apparatus such as a computer (not shown), and a high voltage (18V) VH, a low voltage VL (3.3 V or 5V), and a ground potential Vgnd are supplied from a power source (not shown) thereto.

In the display section 104, 3072 (1024×RGB) pixel elements are horizontally arranged and 768 pixel elements are vertically arranged. Each pixel element is constituted by an n-type TFT 105, a display cell (liquid crystal cell) 106 connected to a source electrode of the n-type TFT 105 and a storage capacitor 107. The display cell 106 is constituted by a pair of electrodes and a liquid crystal between the electrodes.

In the display section 104, 3072 data bus lines 108 vertically extending and 768 gate bus lines 109 horizontally extending are provided. A gate electrode of each of the TFTs 105 of the pixel elements arranged horizontally is connected to the same gate bus line 109, and a drain electrode of each of the TFTs 105 of the pixel elements arranged vertically is connected to the same data bus line 108.

The control circuit 101 receives the horizontal synchronous signal Hsync and the vertical synchronous signal Vsync, and outputs a data start signal DSI which is rendered to be enabled at a start of one horizontal synchronous period, a data clock DCLK which divides one horizontal period into certain intervals, a gate start signal GSI which is rendered to be enabled at a start of one vertical synchronous period, and a gate clock GCLK which divides one vertical synchronous period into certain intervals. The control circuit 101 is constituted by an n-type TFT and a p-type TFT which is driven by a low voltage VL.

The data driver 102 is constituted by a shift register 102a, a level shifter 102b and an analog switch 102c.

The shift register 102a has 3072 output terminals. This shift register 102a is initialized by data start signals DSI, and outputs active signals of a low voltage (3.3 V or 5 V) sequentially from each output terminal at timings in synchronization with the data clock DCLK. This shift register 102a is constituted by an n-type TFT and a p-type TFT which are driven by the low voltage VL.

The level shifter 102b comprises 3072 input terminals and 3072 output terminals. The level shifter 102b converts active signals of the low voltage output from the shift register 102a to a high voltage (18V), and outputs the active signals converted to the high voltage. The level shifter 102b is constituted by an n-type TFT and a p-type TFT which are driven by the low voltage VL and by an n-type TFT and a p-type TFT which are driven by the high voltage VH.

Also an analog switch 102c has 3072 input terminals and 3072 output terminals. Each of the output terminals of the analog switch 102c is connected to the corresponding one of the data bus lines 108. When the analog switch 102c receives the active signals from the level shifter 102b, the analog switch 102c outputs the display signal RGB (any one of the R, G and B signals) to the output signals corresponding to the input terminals which receive the active signals. This analog switch 102c is constituted by an n-type TFT and a p-type TFT which are driven by the high voltage VH.

Specifically, the data driver 102 outputs the R signal, the G signal and the B signal to the 3072 data bus lines 108 of the display section 104 sequentially at timings in synchronization with the data clocks DCLK within one horizontal period.

The gate driver 103 is constituted by a shift register 103a, a level shifter 103b and an output buffer 103c.

The shift register 103a has 768 output terminals. This shift register 103a is initialized by the gate start signals GSI, and outputs scan signals of a low voltage (3.3 V or 5 V) sequentially from each output terminal at timings in synchronization with the gate clocks GCLK. This shift register 103a is constituted by an n-type TFT and a p-type TFT which are driven by the low voltage VL.

The level shifter 103b comprises 768 input terminals and 768 output terminals. The level shifter 103b converts scan signals of a low voltage received from the shift register 103a to high voltage signals of 18 V, and outputs them. This level shifter 103b is constituted by an n-type TFT and a p-type TFT which are driven by the low voltage VL and an n-type TFT and a p-type TFT which are driven by the high voltage VH.

Also the output buffer 103c has 768 input terminals and 768 output terminals. Each of the output terminals of the output buffer 103c is connected to the corresponding one of the gate bus lines 109. The output buffer 103c supplies the scan signals received from the level shifter 103b to the gate bus lines 109 via the output terminals corresponding to the input terminals. The output buffer 103c is constituted by an n-type TFT and a p-type TFT which are driven by the high voltage VH.

Specifically, the scan signals are supplied to the 768 gate bus lines 109 of the display section 104 from the gate driver 103 sequentially at timings in synchronization with the gate clocks GCLK within one vertical synchronization period.

Each of the TFTs 105 of the display section 104 is turned on when the scan signals is supplied to the corresponding one of the gate bus lines 109. At this time, when the display signal RGB (any one of the R signal, the G signal and the B signal) is supplied to the data bus line 108, the display signal RGB is written to the display cell 106 and the storage capacitor 107. In the display cell 106, an inclination of liquid crystal molecules is changed by the display signal RGB written thereto, leading to a change in a light transmittance rate of the display cell 106. By controlling the light transmittance rate of the display cell 106 for each pixel element, a desired image is displayed.

In this embodiment, the TFT provided in the display section 104 is referred to as a pixel TFT below. Among the TFTs in the data driver 102 and the gate driver 103, the TFTs which are driven by the high voltage (18 V ) are referred to as a high-voltage driven TFT. Moreover, among the TFTs in the control circuit 101, the data driver 102 and the gate driver 103, the TFTs which are driven by the low voltage (3.3 V or 5 V) are referred to as a low-voltage driven TFT.

Figure 4A:
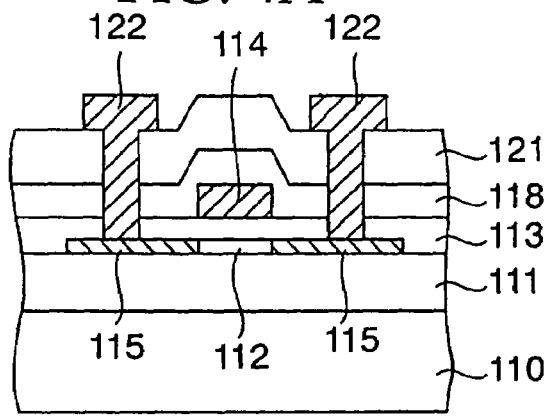
FIG. 4A is a section view showing a structure of a low-voltage driven TFT of the thin film transistor device of the first embodiment.

FIG. 4A is a section view showing a structure of the low-voltage driven TFT. A underlayer insulating film 111 is formed on a glass substrate 110, and a polysilicon film 112 serving as an operational layer of the TFT is formed on the underlayer insulating film 111. In the polysilicon film 112, a pair of high concentration impurity region (ohmic contact region) 115 which are a source/drain of the TFT are formed so as to sandwich a channel region therebetween.

A silicon oxide film (SiO2) 113 having a thickness of 30 nm is formed on the underlayer insulating film 111 and the polysilicon film 112. A gate electrode 114 is formed on the silicon oxide film 113. In the low-voltage driven TFT, all edges of the high concentration impurity regions 115 closer to the channel regions are positioned approximately just below the edge of the gate electrode 114.

A silicon oxide film 118 having a thickness of 90 nm and a silicon nitride film (SiN) 121 having a thickness of 350 nm are laminated on the silicon oxide film 113 and the gate electrode 114. Electrodes 122 that are a source electrode and a drain electrode are formed on the silicon nitride film 121. These electrodes 122 are electrically connected to the high concentration impurity regions 115 respectively by metals buried in contact holes communicating with the high concentration impurity regions 115 from an upper surface of the silicon nitride film 121.

Since in the low-voltage driven TFT, a gate insulating film is constituted by the silicon oxide film 113 alone having a thickness of 30 nm and an LDD region is not provided, the low-voltage driven TFT is capable of performing a high speed operation at a low voltage. In addition, since the impurity regions 115 can be formed in self-alignment with the gate electrode 114, microfabrication of the device (low-voltage driven TFT) is easy. Note that though the LDD region is not provided in this low-voltage driven TFT, this TFT is driven at the low voltage, so that less hot electrons are generated and deterioration of an ON characteristic and an increase in an OFF current, both of which are owing to the hot electrons, are avoided.

Figure 4B:
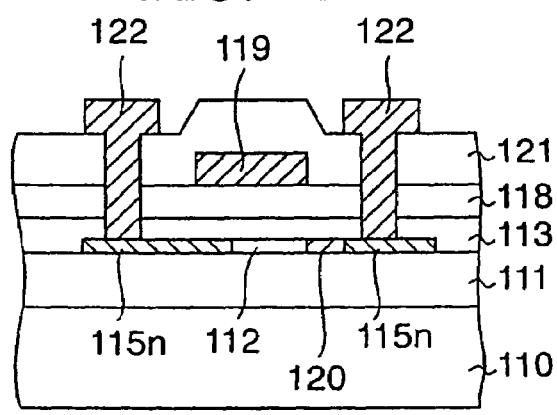
FIG. 4B is a section view showing a structure of a high-voltage driven n-type TFT.
Figure 4C:
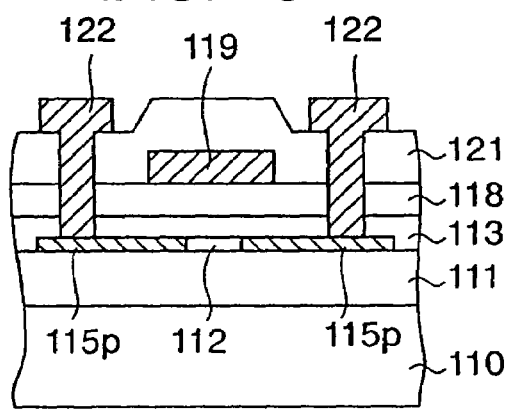
FIG. 4C is a section view showing a structure of a high-voltage driven p-type TFT.

FIG. 4B is a section view showing a structure of a high-voltage driven n-type TFT, and FIG. 4C is a section view showing a structure of a high-voltage driven p-type TFT. An underlayer insulating film 111 is formed on a glass substrate 110. A polysilicon film 112 serving as an operational layer of the TFT is formed on the underlayer insulating film 111.

In an n-type TFT formation region, a pair of n-type high concentration impurity regions (ohmic contact region) 115n that is a source and a drain of the TFT are formed in the polysilicon film 112 so as to sandwich a channel region therebetween. An LDD region (n-type low concentration impurity region) 120 is formed in a portion of a channel region closer to the n-type high concentration impurity region which is the high concentration impurity region on the right in FIG. 4B and serves as a drain of the TFT, so that the LDD region 120 contacts with the impurity region 115n.

On the other hand, in a p-type TFT formation region, a pair of p-type high concentration impurity regions 115p which are a source and a drain of the TFT are formed in the polysilicon film 112 so as to sandwich a channel region. In this high-voltage driven p-type TFT formation region, an LDD region is not provided unlike the high-voltage driven n-type TFT.

On the underlayer insulating film 111 and the polysilicon film 112, a silicon oxide film 113 having a thickness of 30 nm and a silicon oxide film 118 having a thickness of 90 nm are laminated. Then, a gate electrode 119 is formed on the silicon oxide film 118.

In the n-type TFT formation region, a tip portion of the source-side impurity region 115n closer to the channel region vertically overlaps the edge portion of the gate electrode 119 when viewed from above. In addition, a channel region-side edge of the LDD region 120 is disposed approximately just below a drain-side edge of the gate electrode 119.

On the other hand, in the p-type TFT formation region, channel region-side tip portions of the pair of the impurity regions 115p vertically overlap the edge portions of the gate electrode 119 when viewed from above.

A silicon nitride film 121 having a thickness of 350 nm is formed on the gate electrode 119 and the silicon oxide film 118. Electrodes 122 which are a source electrode and a drain electrode are formed on the silicon nitride film 121. These electrodes 122 are electrically connected to the high concentration impurity regions 115n and 115p respectively by metals buried in contact holes communicating with the high concentration impurity regions 115n and 115p from an upper surface of the silicon nitride film 121.

Since in these high-voltage driven TFTs, a gate insulating film is formed by the silicon oxide film composed of the silicon oxide film 113 and the silicon oxide film 118, which is as thick as 120 nm, these TFTs offer a high withstand voltage, and can be driven at a high voltage.

Furthermore, in the n-type TFT, the LDD region 120 is provided only on the drain side, and an LDD region is not provided on the source side. In the n-type TFT used for the level shifters 102b and 103b, the analog switch 102c and the output buffer 103c of the liquid crystal display apparatus, a source voltage is never higher than a drain voltage, and hot electrons are not generated on the source side though the hot electrons are generated on the drain side. Therefore, deterioration of transistor characteristics due to the hot electrons does not occur though the LDD region is not provided on the source side.

On the other hand, the p-type impurity region 115p alone is provided in the polysilicon film 112 in the high-voltage driven p-type TFT formation region, and the LDD region is not provided therein. When viewed from above, both of the tip portions of these impurity regions 115p closer to the channel region overlap the edge portions of the gate electrode 119. In the case of the p-type TFT, carriers are positive holes, and hot carriers are scarcely generated. If the LDD region is not provided, there is no trouble to the transistor characteristic at all.

Figure 4D:
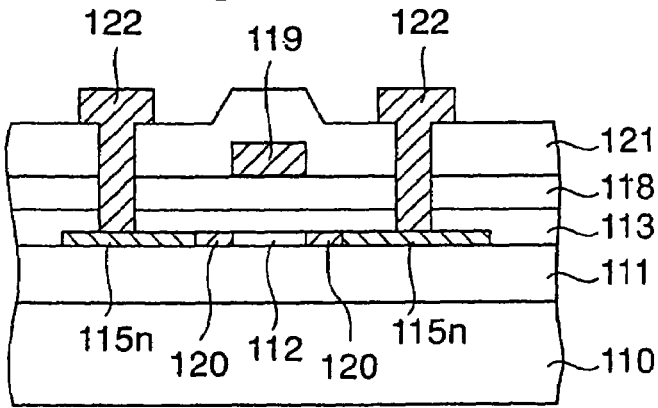
FIG. 4D is a section view showing a structure of a pixel TFT (n-type).

FIG. 4D is a section view showing a structure of the pixel TFT (n-type). An underlayer insulating film 111 is formed on a glass substrate 110, and a polysilicon film 112 serving as an operational layer of the TFT is formed on the underlayer insulating film 111. A pair of n-type high concentration impurity regions (ohmic contact region) 115n which are a source and a drain of the TFT are formed in the polysilicon film 112 so as to sandwich a channel region therebetween, and LDD regions 120 are respectively formed in the edge portions of the n-type high concentration impurity regions 115n closer to the channel side so as to contact with the n-type high concentration impurity regions 115n.

On the underlayer insulating film 111 and the polysilicon film 112, a silicon oxide film 113 having a thickness of 30 nm and a silicon oxide film 118 having a thickness of 90 nm are laminated similarly to the high-voltage driven TFT shown in FIGS. 4B and 4C. Then, a gate electrode 119 is formed on the silicon oxide film 118.

In this pixel TFT, channel region-side edges of the LDD regions 120 are disposed approximately just below both of the edges of the gate electrode 119.

A silicon nitride film 121 having a thickness of 350 nm is formed on the gate electrode 119 and the silicon oxide film 118. Electrodes (a source electrode and a drain electrode) 122 are formed on the silicon nitride film 121. These electrodes 122 are electrically connected to the respective n-type high concentration impurity regions 115n by metals buried in contact holes communicating with the n-type high concentration impurity regions 115n from an upper surface of the silicon nitride film 121.

Since positive and negative signals are supplied to the pixel TFT as a display signals, deterioration of transistor characteristics due to hot electrons occurs if the LDD regions 120 are not provided in both of the source and the drain unlike the illustration of FIG. 4D.

A method of manufacturing the liquid crystal display apparatus of this embodiment will be described with reference to FIGS. 5A to 13C below. In FIGS. 5A to 13C, FIGS. 5A, 6A, 7A, 8A, 9A, 10A, 11A, 12A and 13A show section views in a low-voltage driven TFT formation region, FIGS. 5B, 6B, 7B, 8B, 9B, 10B, 11B, 12B and 13B show section views in a high-voltage driven TFT formation region, and FIGS. 5C, 6C, 7C, 8C, 9C, 10C, 11C, 12C and 13C show section views in a pixel TFT formation region.

Figure 5A:
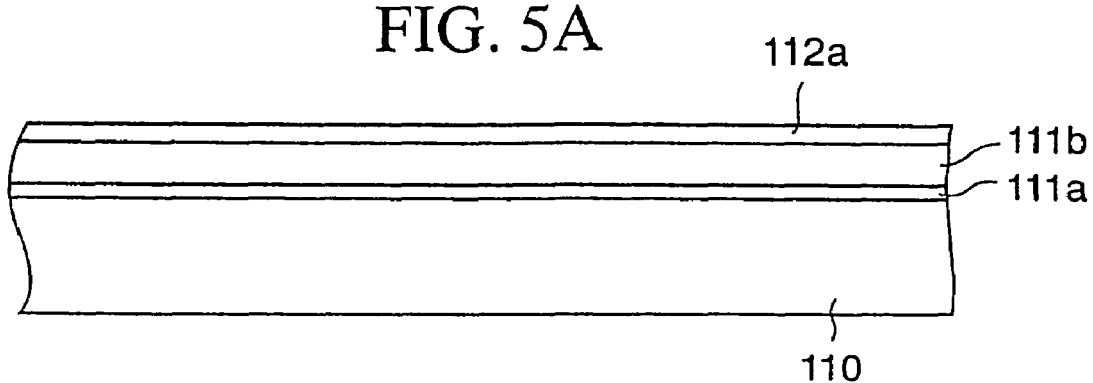
FIG. 5 is a section view (1) showing a method of manufacturing a thin film transistor device of the first embodiment.
Figure 5B:
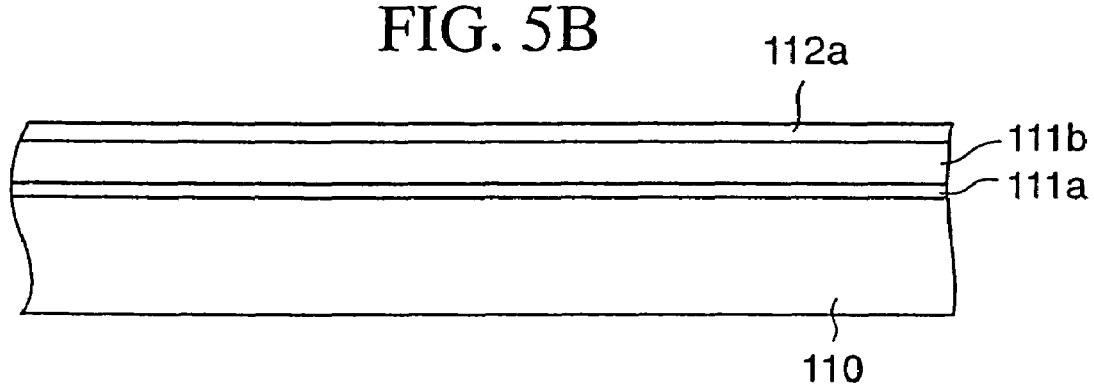
Figure 5C:
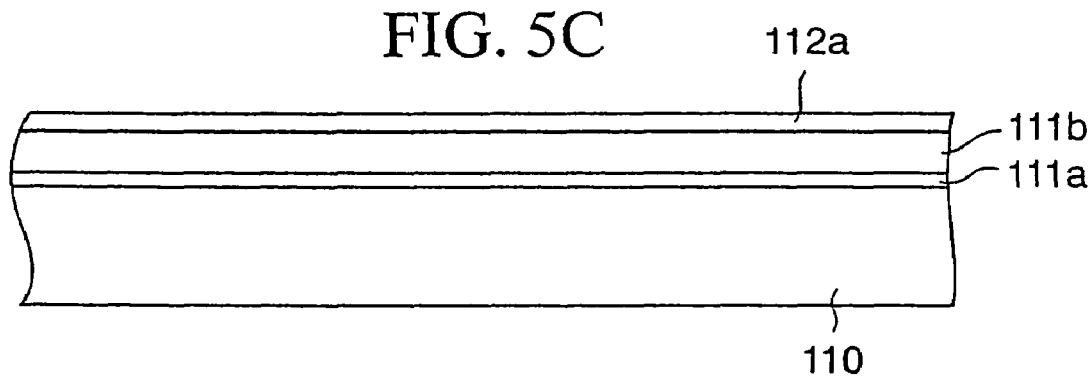

First, as shown in FIGS. 5A to 5C, by use of a plasma CVD method, the silicon nitride film 111a as an underlayer insulating film is formed to a thickness of about 50 nm on the glass substrate 110 and the silicon oxide film 111b is formed on the silicon nitride film 111a to a thickness of 200 nm. Subsequently, the amorphous silicon film 112a is formed on the silicon oxide film 111b to a thickness of about 50 nm.

Next, to reduce hydrogen in the amorphous silicon film 112a, annealing is performed at temperature of 450° C. Thereafter, the amorphous silicon film 112a is converted to a polysilicon film by radiating excimer laser onto the amorphous silicon film 112a.

Figure 6A:
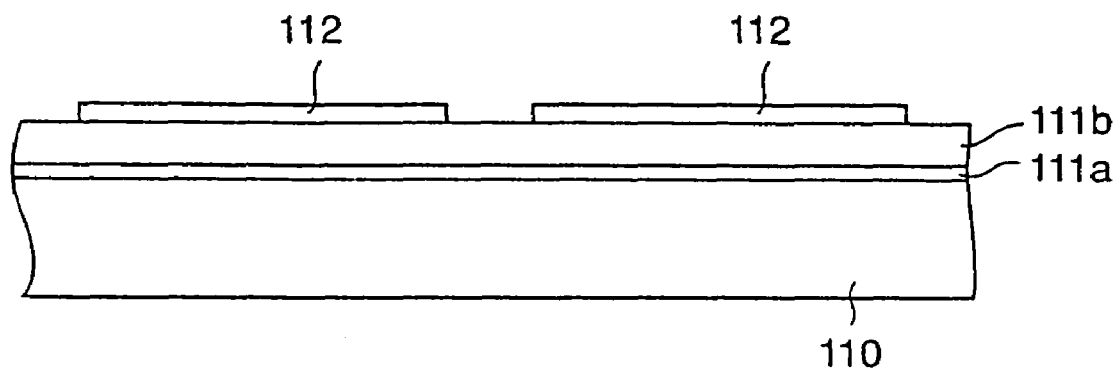
FIG. 6 is a section view (2) showing a method of manufacturing the thin film transistor device of the first embodiment.
Figure 6B:
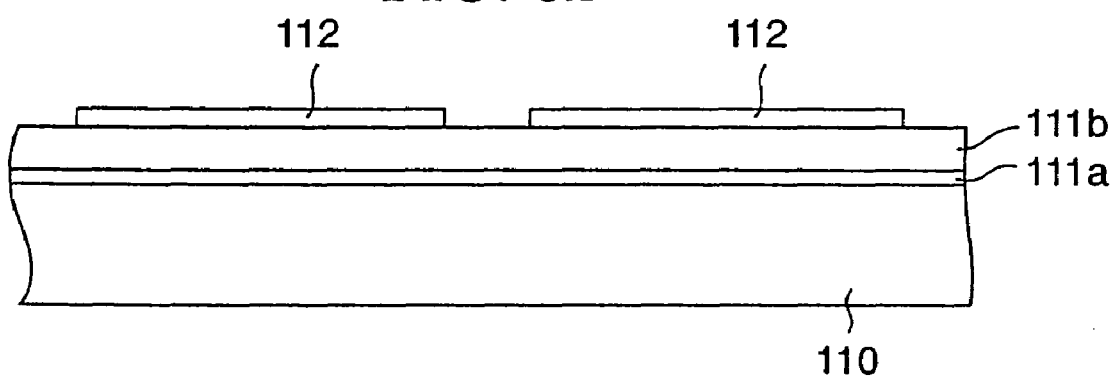
Figure 6C:
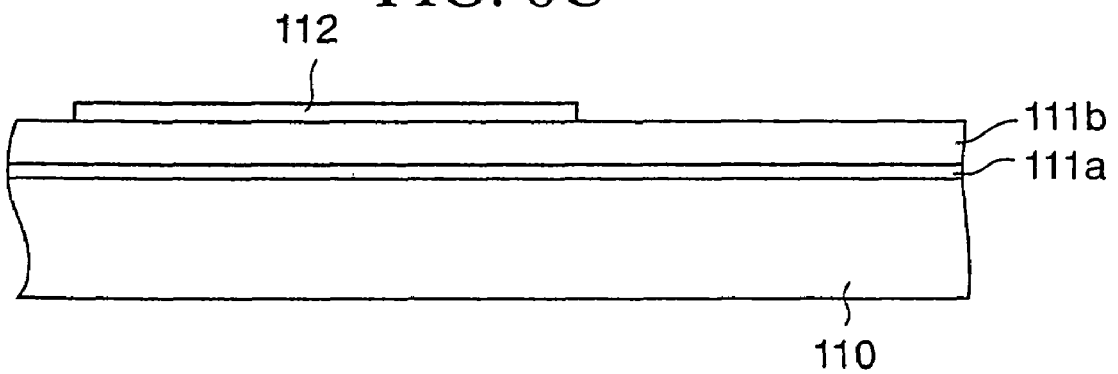

Subsequently, photoresist is coated on the polysilicon film, and the photoresist is subjected to a selective exposure step and a developing step, thus forming a predetermined resist pattern (not shown). Then, the polysilicon film is dry-etched by use of the resist pattern as a mask, and the polysilicon film 112 is left only in predetermined regions as shown in FIGS. 6A to 6C. Thereafter, the resist pattern is removed.

Figure 7A:
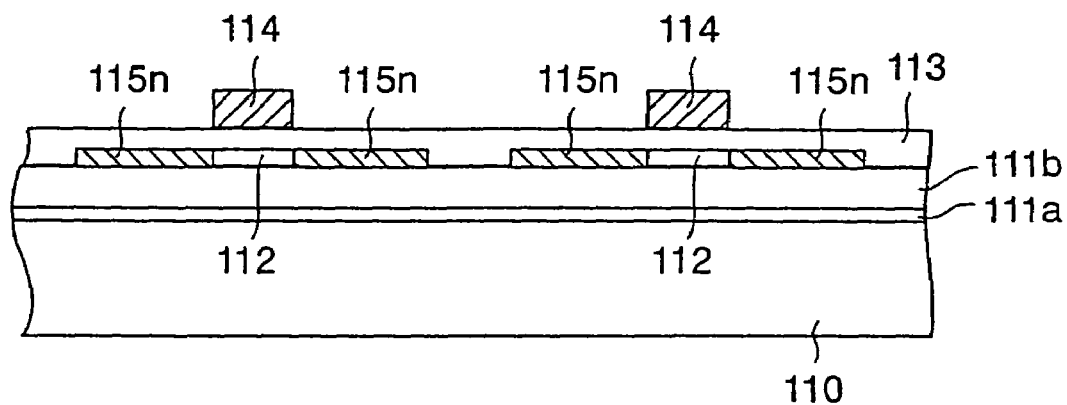
FIG. 7 is a section view (3) showing a method of manufacturing the thin film transistor device of the first embodiment.
Figure 7B:
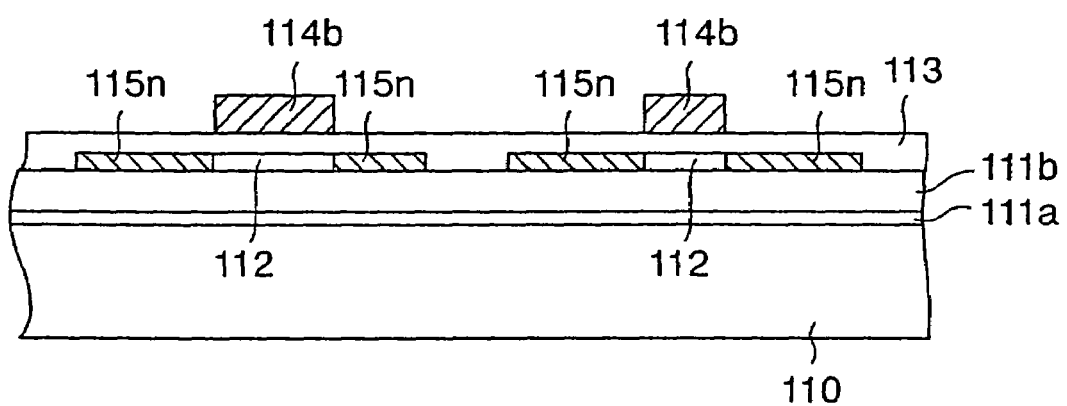
Figure 7C:
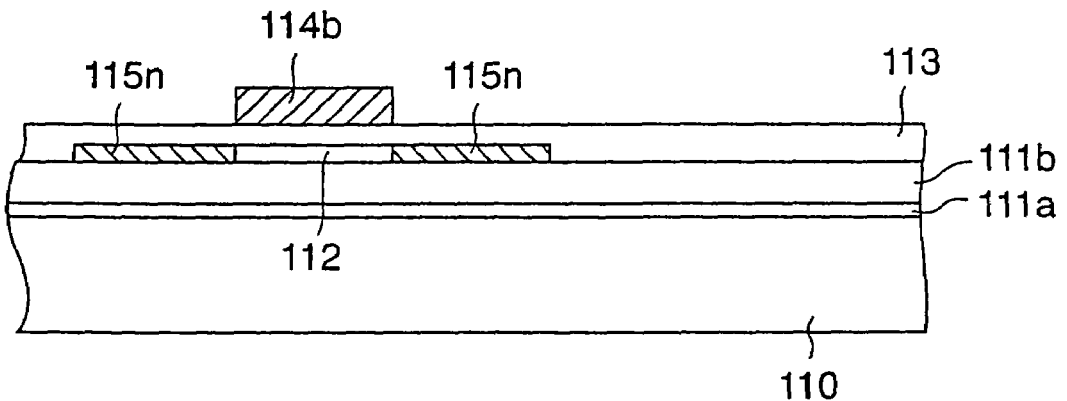

Next, as shown in FIGS. 7A to 7C, the silicon oxide film 113 is formed on the entire surface of the resultant structure to a thickness of 30 nm by use of a plasma CVD method. Then, an Al—Nd (alminium-neodybium) film, which contains Nd by 2 at. %, is formed on the silicon oxide film 113 to a thickness of about 300 nm by use of a sputtering method. Thereafter, a predetermined resist pattern is formed on the Al—Nd film by use of photoresist, and the Al—Nd film is dry-etched by using the resist pattern as a mask. Thus, the gate electrode 114 of the low-voltage driven TFT and a metal pattern 114b serving as a mask in forming the sources and the drains of the high-voltage driven TFT and the pixel TFT are formed. Thereafter, the resist pattern is removed. P (phosphorus) is injected into the polysilicon film 112 by use of the gate electrode 114 and the metal pattern 114b as a mask under conditions of an acceleration voltage of 25 kV and a dose amount of $7 \times 10^{14}$ cm$^{-2}$, and thus the n-type impurity region 115n serving as the source and the drain of the n-type TFT is formed. At this time, P (phosphorus) is injected also into the polysilicon film 112 of the p-type TFT.

Figure 8A:
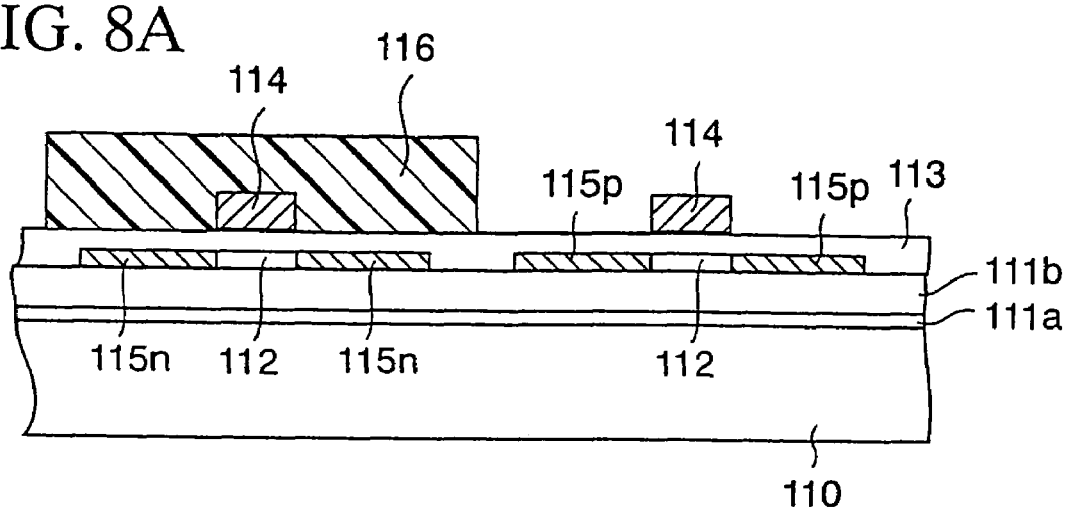
FIG. 8 is a section view (4) showing a method of manufacturing the thin film transistor device of the first embodiment.
Figure 8B:
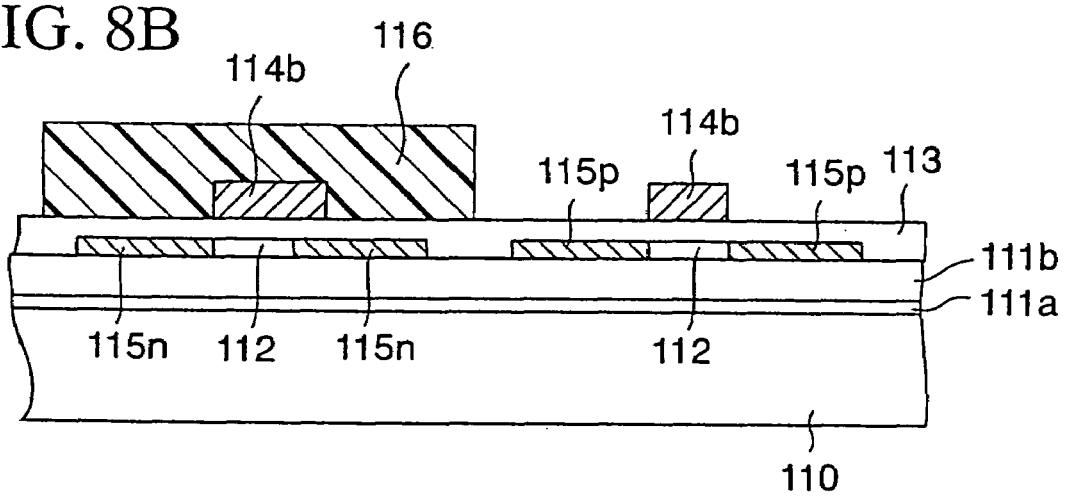
Figure 8C:
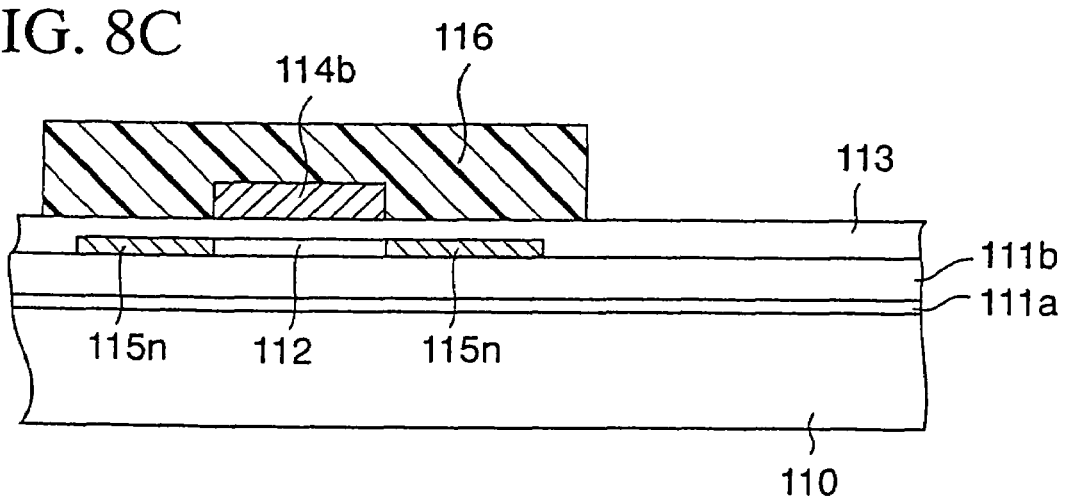

Next, as shown in FIGS. 8A to 8C, a resist pattern 116 covering an n-type TFT formation region is formed by use of photoresist, B (boron) is injected into the polysilicon film 112 of the p-type TFT formation region under conditions of an acceleration voltage of 15 kV and a dose amount of $2\times10^{15}$ cm$^{-2}$, and thus the p-type impurity region 115p serving as the source and the drain of the p-type TFT is formed. Although P (phosphorus) is injected into these regions in the former step, the n-type impurity region 115n is changed to the p-type impurity region 115p by injecting a larger amount of B (boron) than P (phosphorus).

Next, after the resist pattern 116 is removed, excimer laser is irradiated onto the entire upper surface of the TFT substrate 110, and thus the injected impurities (P and B) are electrically activated.

Figure 9A:
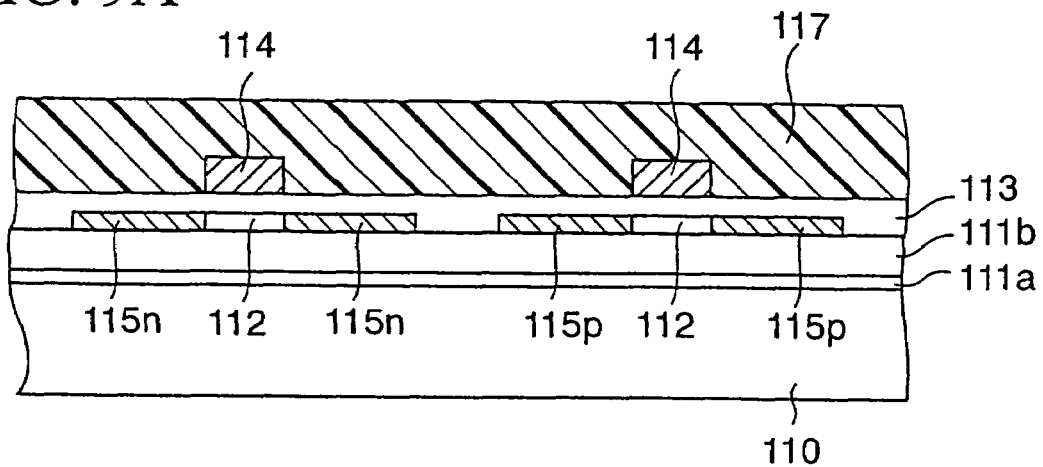
FIG. 9 is a section view (5) showing a method of manufacturing the thin film transistor device of the first embodiment.
Figure 9B:
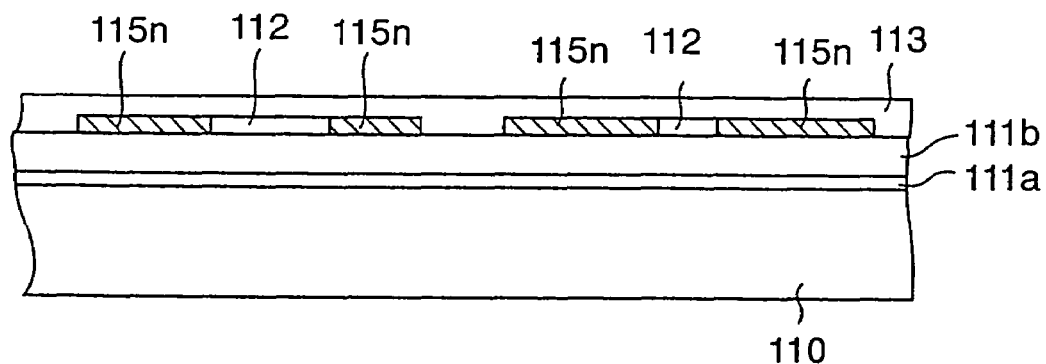
Figure 9C:
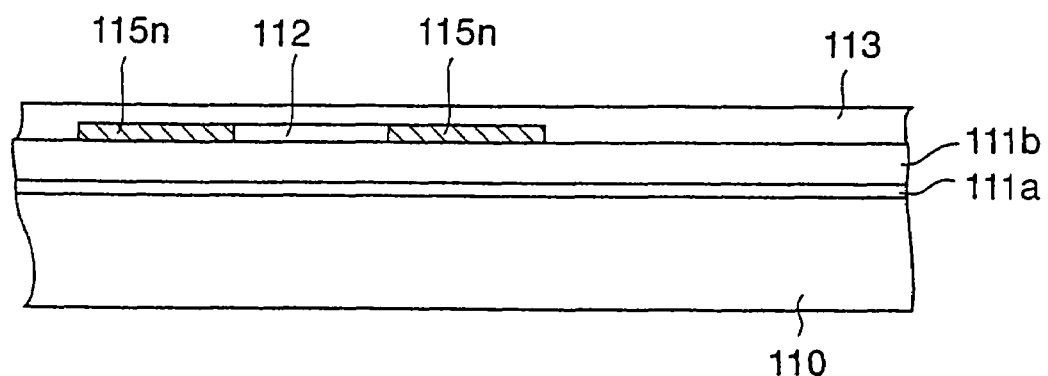

Subsequently, as shown in FIGS. 9A to 9C, a resist pattern 117 covering the formation region of the low-voltage driven TFT is formed by use of photoresist, and the metal pattern 114b is removed by wet-etching. Thereafter, the resist pattern 117 is removed.

Figure 10A:
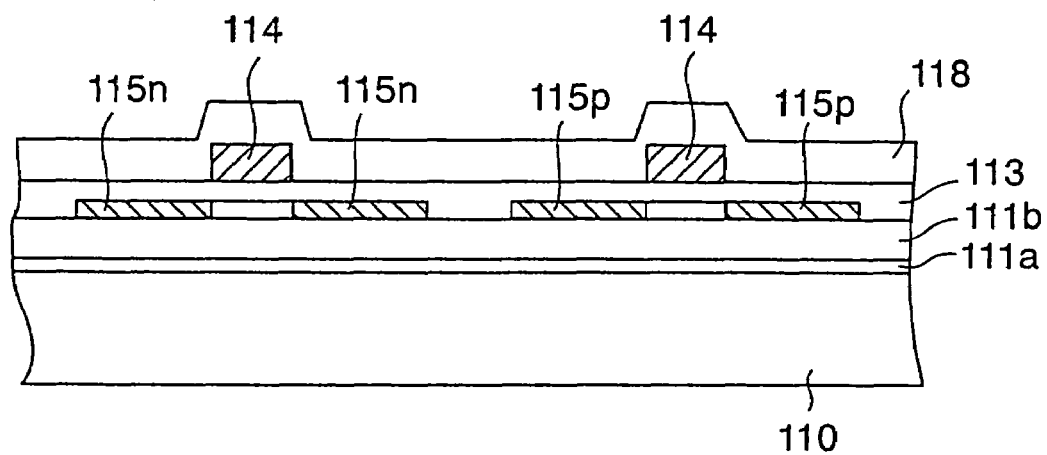
FIG. 10 is a section view (6) showing a method of manufacturing the thin film transistor device of the first embodiment.
Figure 10B:
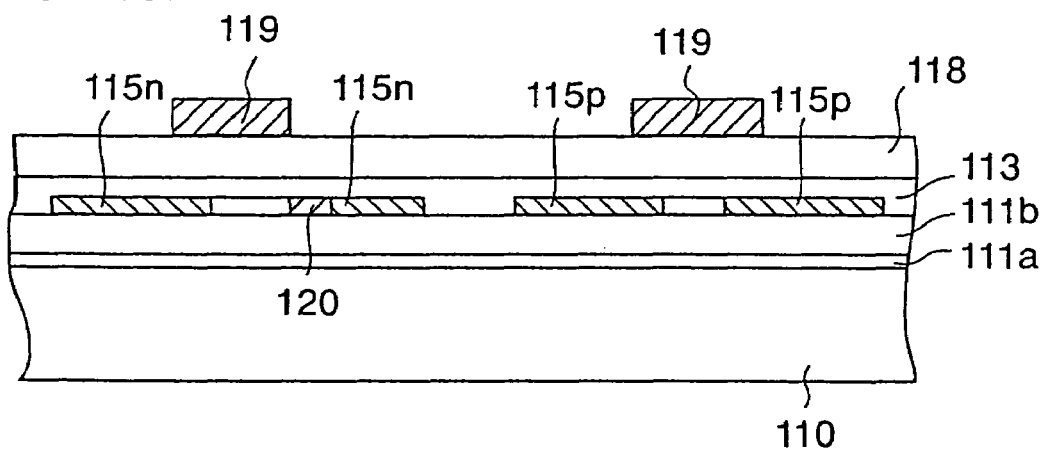
Figure 10C:
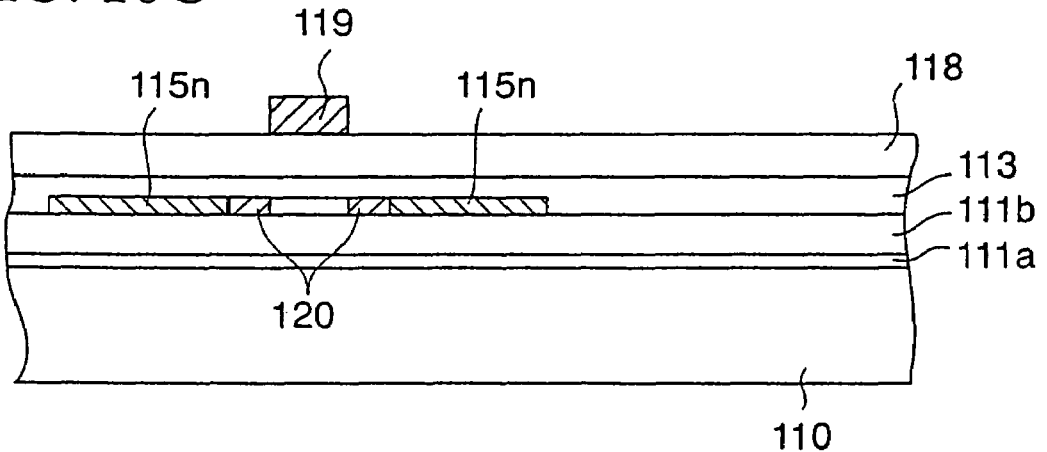

Next, as shown in FIGS. 10A to 10C, the silicon oxide film 118 is formed to a thickness of 90 nm on the silicon oxide film 113 and the gate electrode 114 by use of a plasma CVD method. Then, an Al—Nd film which has a thickness of 300 nm and contains Nd by 2 at. % is formed on the silicon oxide film 118 by use of a sputtering method. Thereafter, a resist pattern having a predetermined shape is formed on the Al—Nd film by use of photoresist. Then, the Al—Nd film is dry-etched by using this resist pattern as a mask, and thus the gate electrodes 119 of the high-voltage driven TFT and the pixel TFT are formed.

At this time, in the n-type high-voltage driven TFT formation region, the edge portion of the gate electrode 119 and the tip portion of the source-side impurity region 115n closer to the channel region vertically overlap when viewed from above, so that a space used for the LDD region 120 is created between the gate electrode 119 and the drain-side impurity region 115. Furthermore, the p-type high-voltage driven TFT formation region is designed such that edge portions of the gate electrode 119 and the tip portions of the source and drain-side impurity regions 115p closer to the channel region vertically overlap when viewed from above (see FIG. 10B).

Furthermore, the pixel TFT formation region is designed such that spaces used for the LDD regions 120 are created between the edge portions of the gate electrode 119 and the source and drain-side impurity regions 115n when viewed from above (see FIG. 10C).

Simultaneously with the formation of the gate electrode 119, the gate bus line 109 and the storage capacitor bus line (an electrode of the storage capacitor 107) are formed in the display section 104.

Next, after the resist pattern is removed, P (phosphorus) is ion-implanted all over the surface of the substrate under conditions of an acceleration voltage of 70 kV and a dose amount of $2\times10^{13}$ cm$^{-2}$, and thus the LDD region 120 is formed adjacent to the drain-side impurity region 115n of the n-type high-voltage driven TFT, and, at the same time, the LDD regions 120 are formed adjacent to the source and drain-side impurity regions 115n of the pixel TFT. At this time, P (phosphorus) is injected also into the impurity regions 115p of the p-type TFT. Since the dose amount of P (phosphorus) is smaller than that of B (boron) formerly injected, the conductivity type of the impurity regions 115p does not change.

Thereafter, annealing is performed at temperature of 400° C., and P (phosphorus) that has been injected is electrically activated.

Figure 11A:
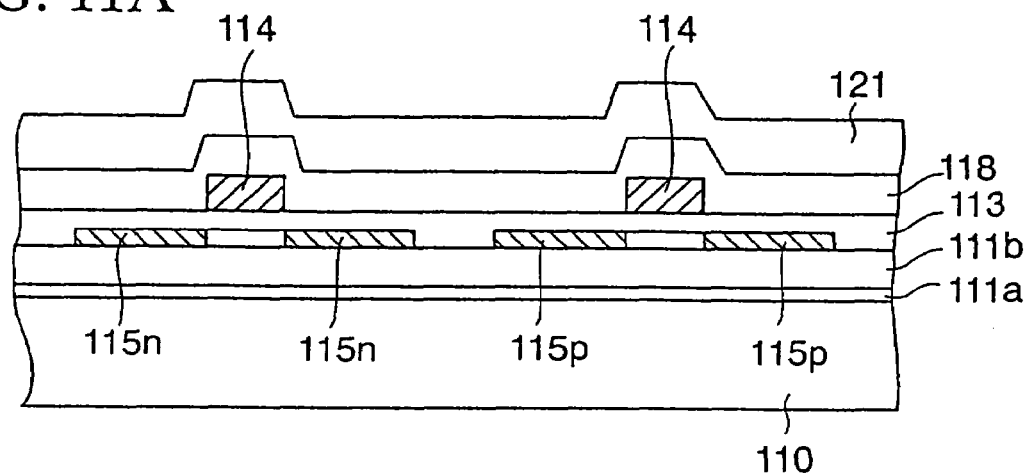
FIG. 11 is a section view (7) showing a method of manufacturing the thin film transistor device of the first embodiment.
Figure 11B:
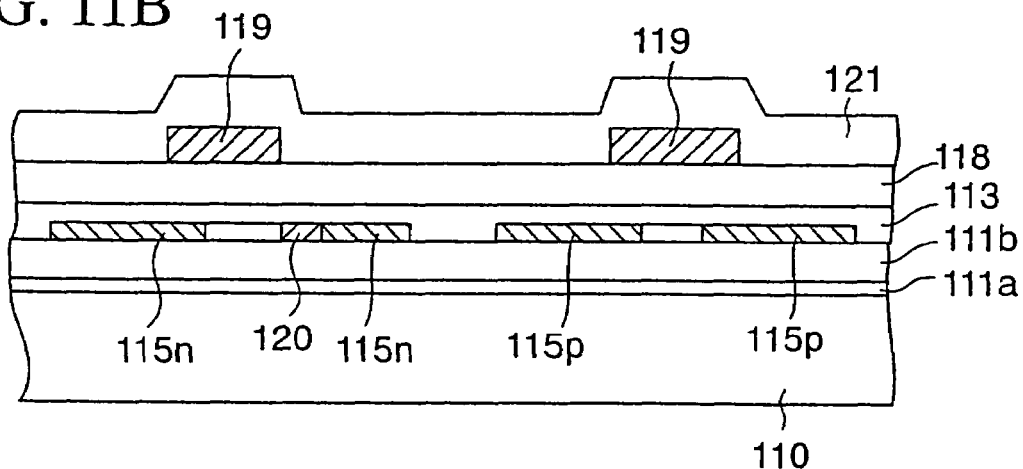
Figure 11C:
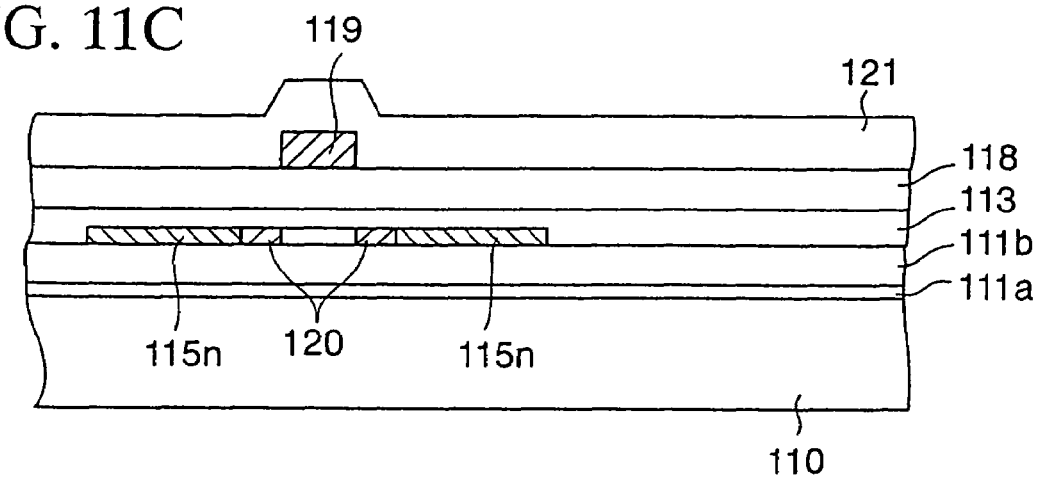

Next, as shown in FIGS. 11A to 11C, the silicon nitride film 121 is formed to a thickness of 350 nm on the silicon oxide film 118 and the gate electrode 119 by use of a plasma CVD method. Thereafter, annealing is performed at temperature of 400° C., and P (phosphorus) that has been injected into the LDD regions 120 is electrically activated. At the same time, defects existing in an interface between the channel region and the gate oxide film and the like are hydrogenated by hydrogen in the silicon nitride film 121, thus improving the TFT characteristics.

Next, a resist film having opening portions for forming contact hole is formed on the silicon nitride film 121 by use of photoresist. Then, the silicon nitride film 121 and the silicon oxide films 118 and 113 are dry-etched by using the resist film as a mask, thus forming contact holes communicating with the impurity regions 115n and 115p of the TFTs.

Figure 12A:
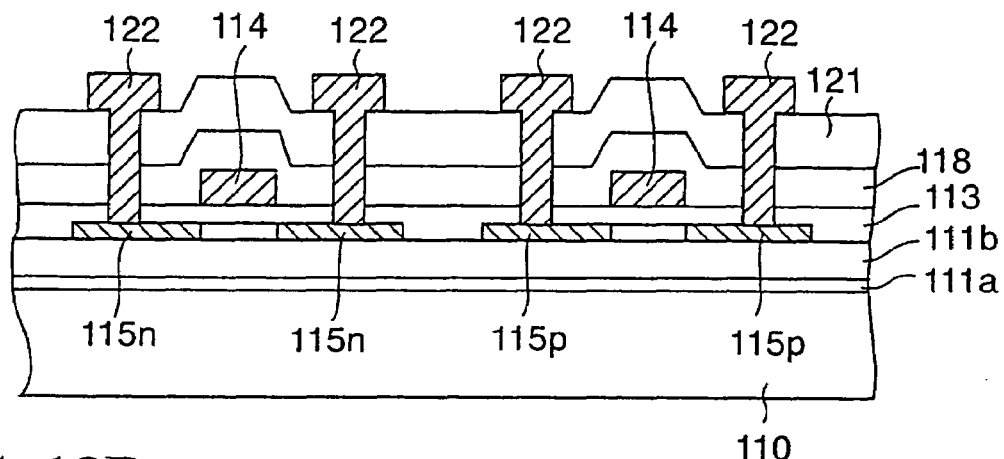
FIG. 12 is a section view (8) showing a method of manufacturing the thin film transistor device of the first embodiment.
Figure 12B:
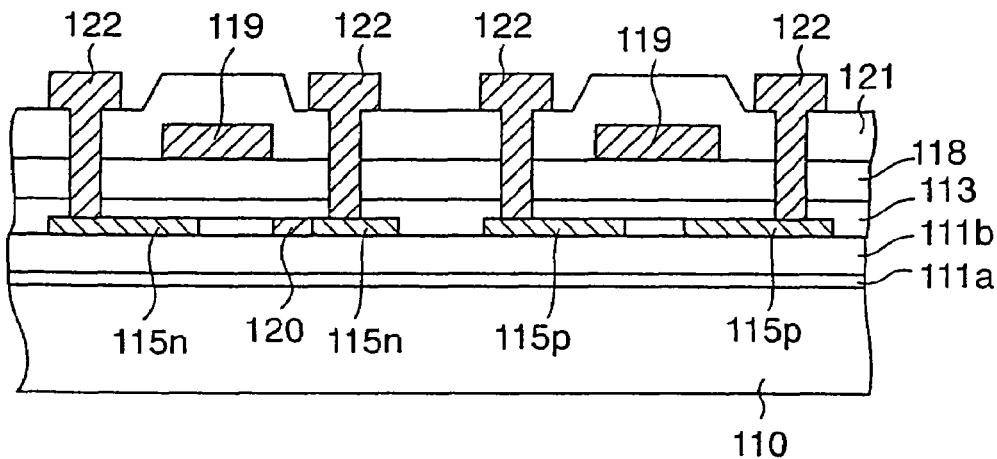
Figure 12C:
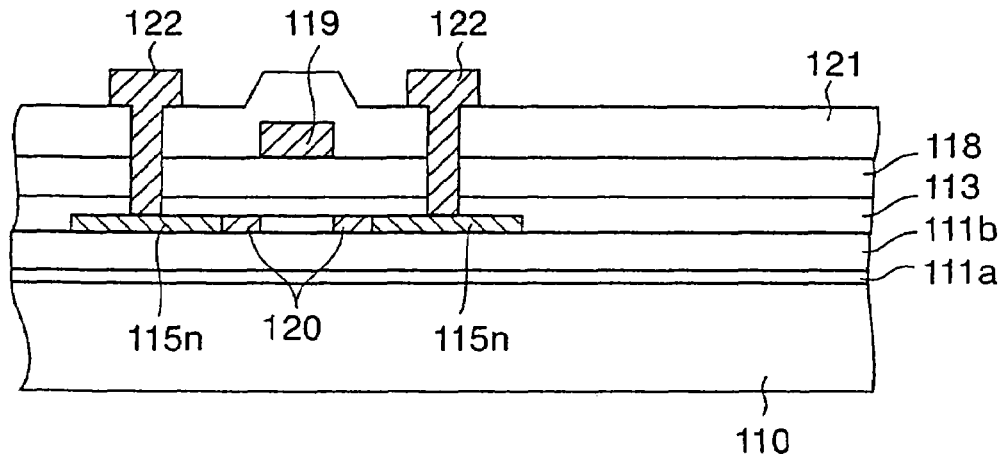

Subsequently, a 100 nm thick Ti, a 200 nm thick Al and a 50 nm thick Ti are sequentially deposited on the entire surface of the substrate 110 by use of a sputtering method, and the contact holes are buried by these metals. At the same time, a metal film is formed on the silicon nitride film 121. Thereafter, a mask pattern is formed by a photolithography technique, and the electrodes (the source electrode and the drain electrode) 122 electrically connected to the source and the drain of the TFT are formed by dry-etching the metal film, as shown in FIGS. 12A to 12C.

Note that in the display section 104, the data bus line 108 is formed simultaneously with the formation of the electrodes 122. In addition, in the formation region of the control circuit 101, the data bus driver 102 and the gate driver 103, a predetermined wiring pattern is formed simultaneously with the formation of the electrodes 122.

Figure 13A:
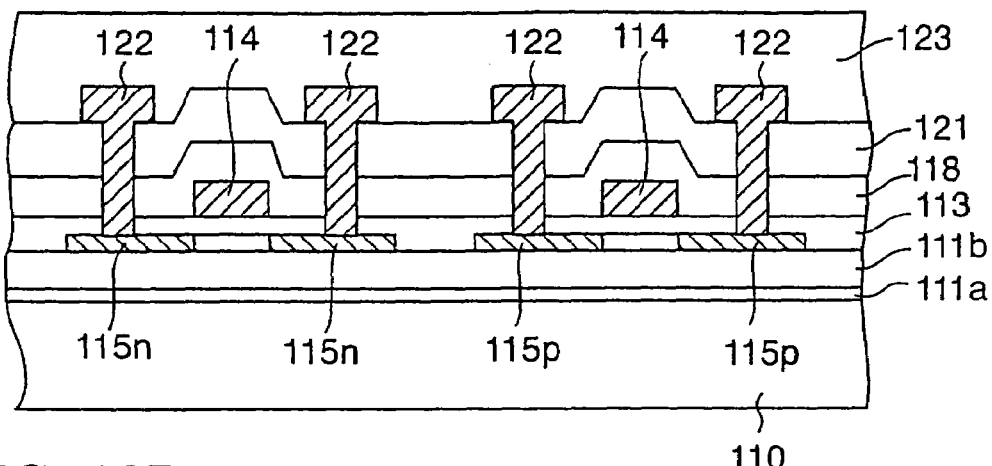
FIG. 13 is a section view (9) showing a method of manufacturing the thin film transistor device of the first embodiment.
Figure 13B:
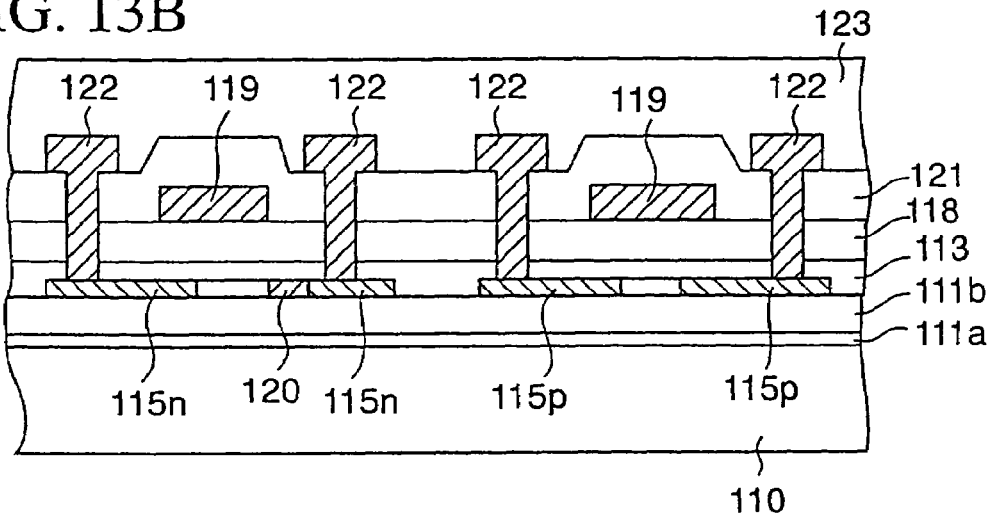
Figure 13C:
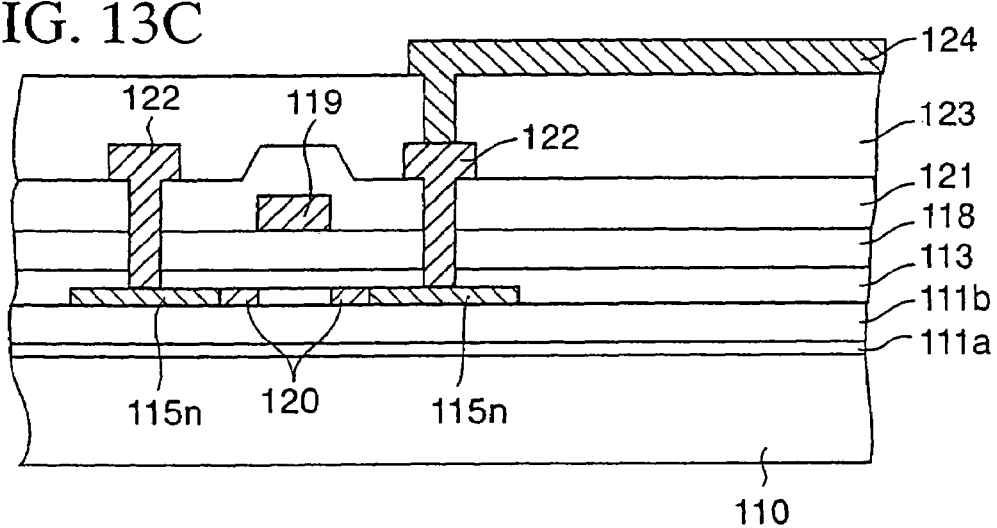

Next, as shown in FIGS. 13A to 13C, photosensitive resin is coated, thus forming a resin film 123 having a thickness of 3.0 μm. Contact holes communicating with the electrode 122 are formed in predetermined regions of the resin film 123. Thereafter, an ITO (indium-tin oxide) film having a thickness of 70 nm is formed on the entire surface of the resultant structure above the substrate 110 by use of a sputtering method, and then the ITO film is patterned by an ordinary photolithography step. Thus, a pixel electrode 124 electrically connected to the source-side impurity region 115n of the pixel TFT is formed. Then, an orientation film (not shown) deciding an initial state of orientation direction of liquid crystal molecules, at which no voltage is applied, is formed on the entire surface of the resultant structure above the glass substrate 110.

Thus, the TFT substrate of the liquid crystal display apparatus is completed.

An opposite substrate of the liquid crystal display apparatus is formed by a known method. Specifically, a black matrix for optically shielding regions between the pixel elements is formed on the glass substrate by, for example, Cr (chromium). Red, green and blue-color filters are formed on the glass substrate so that any one of the red, green and blue-color filters is arranged for each pixel element. Thereafter, a transparent electrode formed of ITO on the entire upper surface of the glass substrate, and an orientation film is formed on the transparent electrode.

The TFT substrate and the opposite substrate, which are manufactured in the above described manner, are bonded to each other, a liquid crystal is sealed between the TFT substrate and the opposite substrate, thus completing a liquid crystal panel. Polarization plates are disposed on both planes of this liquid crystal panel, and a backlight is arranged on the rear plane side thereof. Thus, a liquid crystal display apparatus is completed.

According to this embodiment, it is possible to manufacture the low-voltage driven TFT having the thin gate insulating film, which is capable of performing a high speed operation at a low voltage, and the high-voltage driven TFT and the pixel TFT, each having the thick gate insulating film and showing less characteristic deterioration due to hot electrons, in the same processes. Thus, performance of the liquid crystal display apparatus united with a driving circuit is enhanced, and manufacturing cost is reduced. Furthermore, since the impurity regions (source/drain) 115n and 115p of the low-voltage driven TFT are formed in self-alignment with the gate electrode 114, microfabrication of the low-voltage driven TFT and a high speed operation thereof can be achieved.

Note that a structure may be adopted, in which a color of the resin film 123 is selected to any one of red, green and blue colors for each pixel element and a color filter is not provided on the opposite substrate side in the foregoing embodiment. Furthermore, circuits (a correction circuit, an adder circuit, a subtraction circuit, a memory and the like), which perform an image correction and storing, may be formed on the glass substrate 110.

In addition, in the foregoing embodiment, descriptions for the case where the LDD regions 120 are provided in the drain-side impurity region of the n-type high-voltage driven TFT and in the source and drain-side impurity regions of the pixel TFT were made. However, these regions may be used as an offset region without introducing the impurities into these regions.

Second Embodiment

Figure 1:
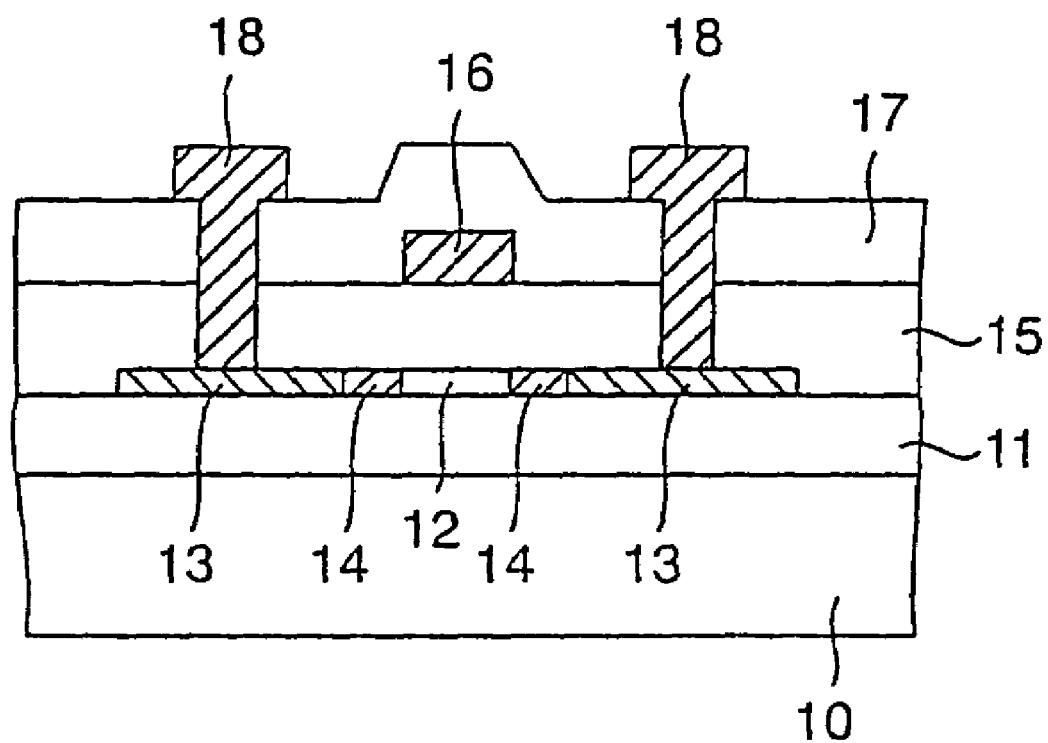
FIG. 1 is a section view showing an example of a TFT (n-type) used in a conventional liquid crystal display apparatus united with peripheral circuits.

Next, a second embodiment of the present invention will be described. This embodiment shows an example in which the present invention is applied to a reflection-type liquid crystal display apparatus. Since the reflection-type liquid crystal display apparatus of this embodiment has the same structure as that of the liquid crystal display apparatus described in the first embodiment principally except that the structure of the liquid crystal cell is different between both apparatuses, descriptions are made with reference to FIG. 1 also in the second embodiment.

Figure 14A:
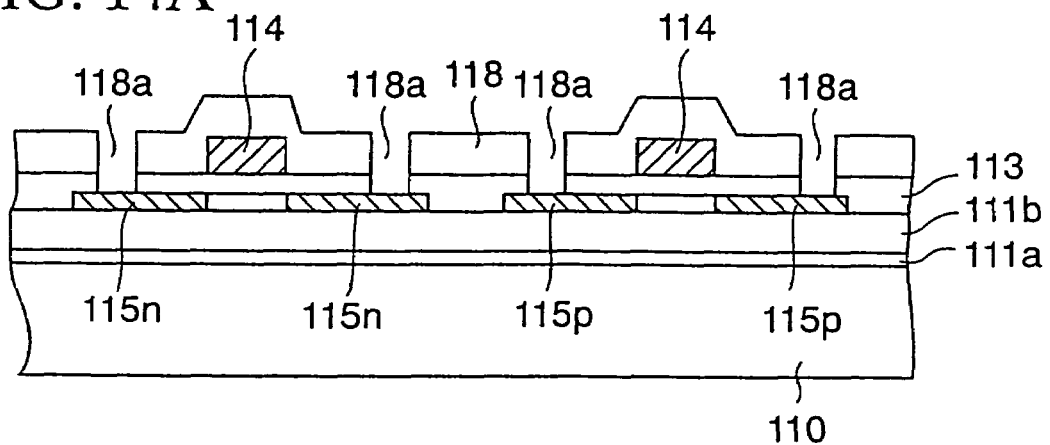
FIG. 14 is a section view (1) showing a method of manufacturing a liquid crystal display apparatus of a second embodiment of the present invention.
Figure 14B:
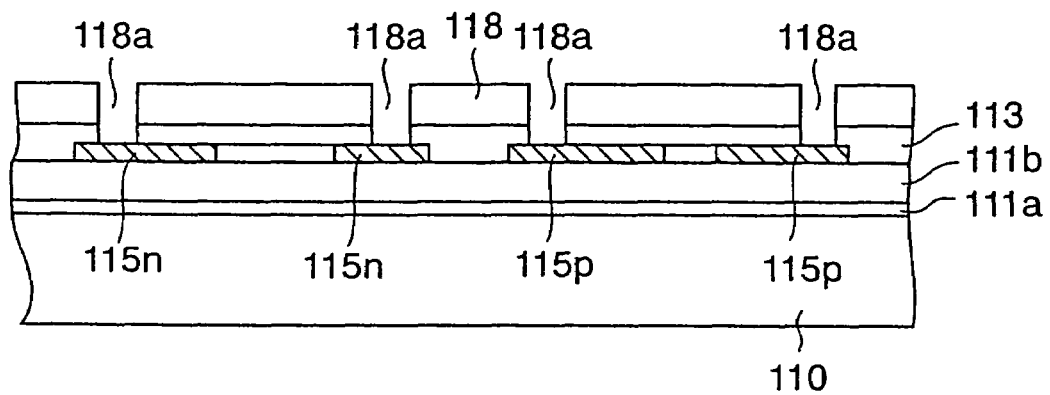
Figure 14C:
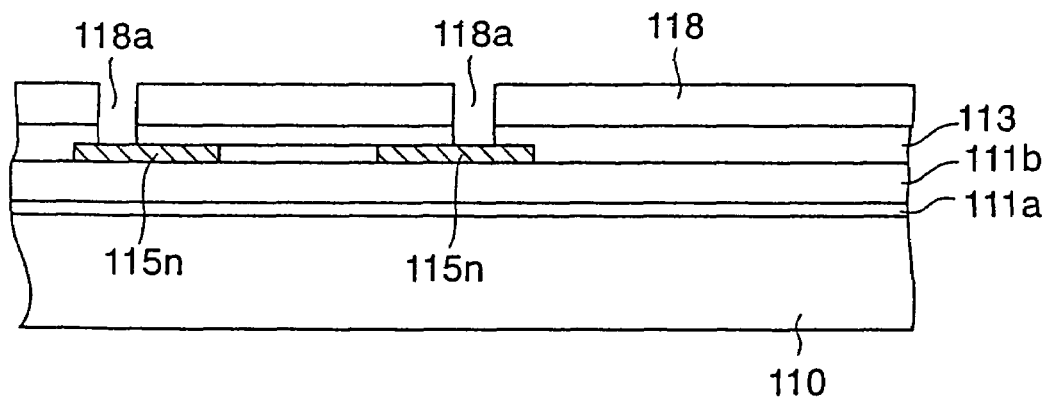
Figure 15A:
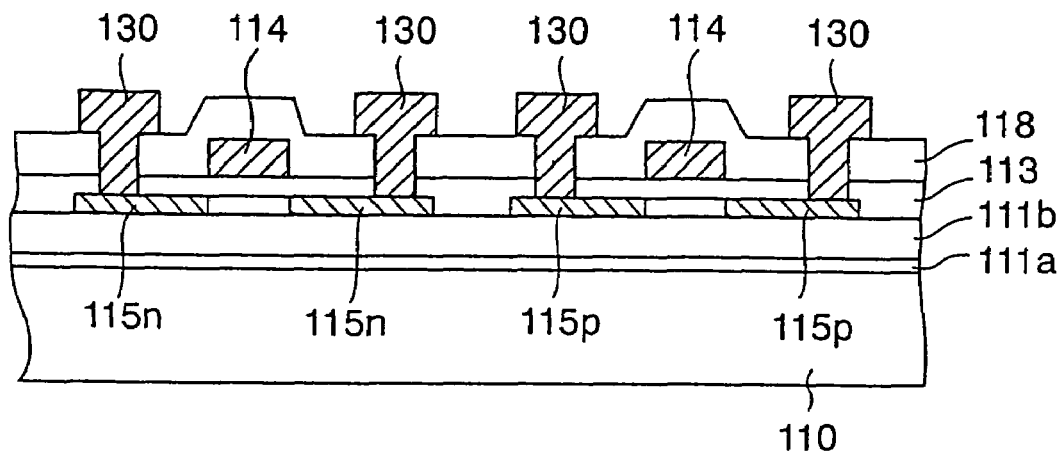
FIG. 15 is a section view (2) showing a method of manufacturing the liquid crystal display apparatus of the second embodiment of the present invention.
Figure 15B:
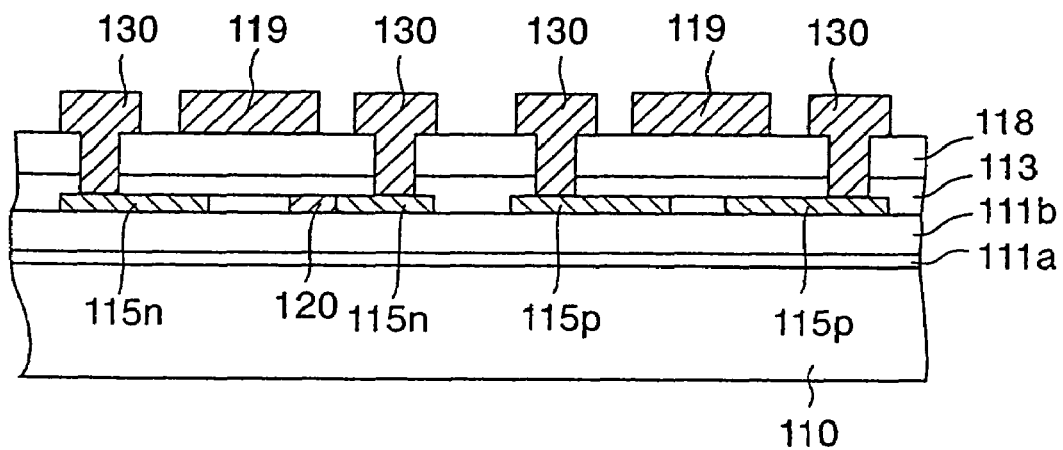
Figure 15C:
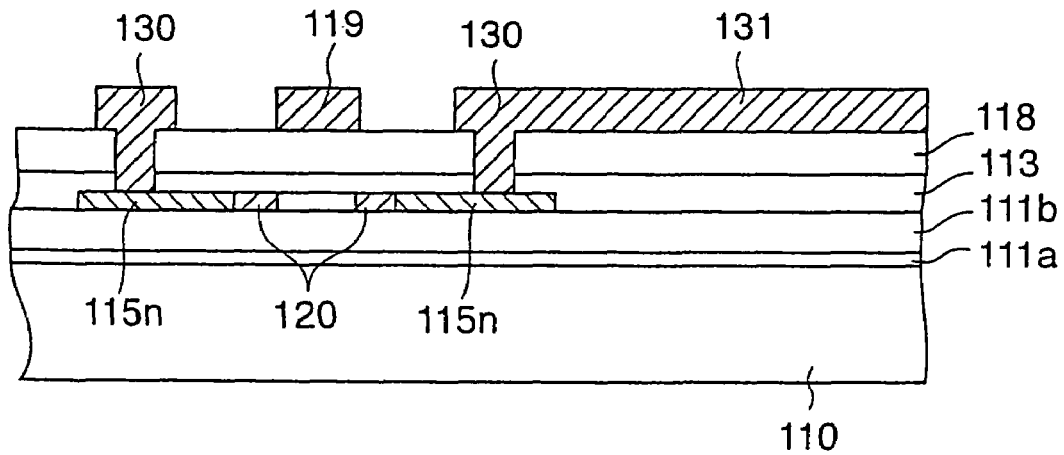
Figure 16A:
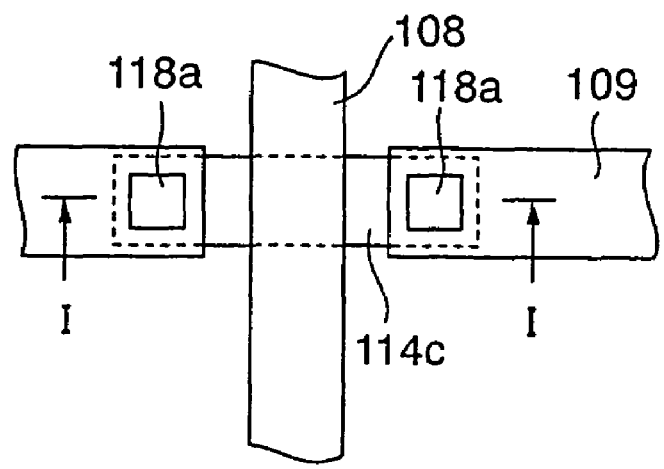
FIG. 16A is a plan view showing an intersection portion of a data bus line and a gate bus line of the liquid crystal display device of the second embodiment.
Figure 16B:
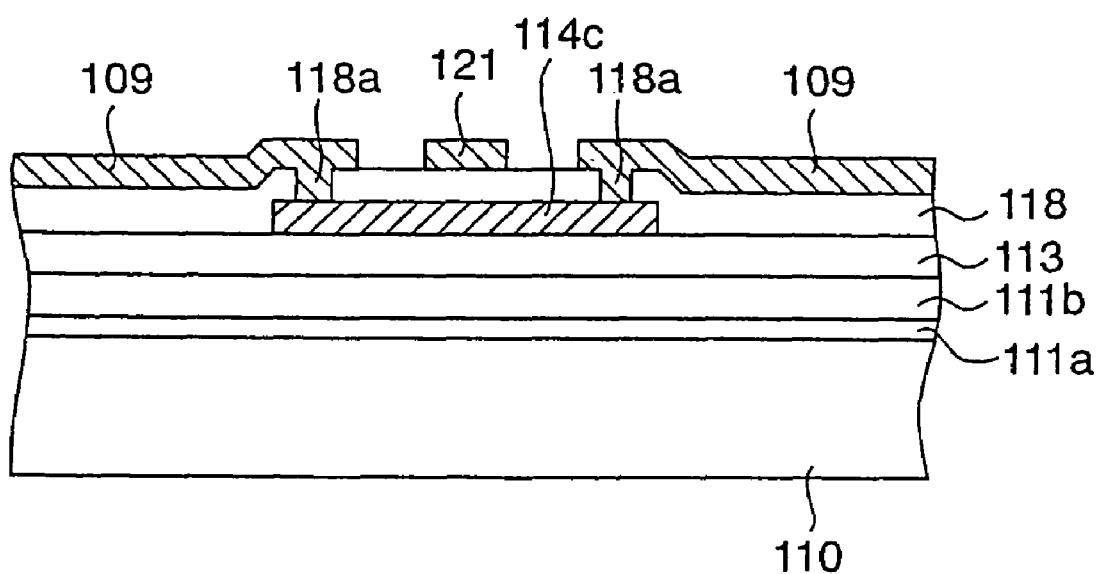
FIG. 16B is a section view taken along the line I-I of FIG. 16A.

FIGS. 14A to 14C and FIGS. 15A to 15C are section views showing a method of manufacturing the liquid crystal display apparatus of this embodiment. FIG. 16A is a plan view showing an intersection portion of a data bus line 108 and a gate bus line 109 of the liquid crystal display apparatus of this embodiment, and FIG. 16B is a section view taken along the line I-I of FIG. 16A. Moreover, FIGS. 14A and 15A are section views of a low-voltage driven TFT formation portion, FIGS. 14B and 15B are section views of a high-voltage driven TFT formation portion, and FIGS. 14C and 15C are section views of a pixel TFT formation portion.

In this embodiment, a gate electrode 114 and impurity regions 115n and 115p of the low-voltage driven TFT are formed principally in the same manners as the first embodiment until the steps shown in FIG. 9A.

Note that as shown in the plan view of FIG. 16A and in the section view of FIG. 16B, a connection wiring 114c is previously formed on a silicon oxide film 113 at the portion where the gate bus line 109 and the data bus line 108 of the display section 104 intersect with each other simultaneously with the formation of the gate electrode 114 of the low-voltage driven TFT. In this case, thicknesses of the gate electrode 114 and the connection wiring 114c should be made as thin as about 150 nm. Furthermore, when the mask pattern 114b is removed in the steps of FIGS. 8A to 9C, also the connection wiring 114c is previously covered with the resist pattern 117.

After finishing the steps shown in FIGS. 9A to 9C, resist pattern 117 is removed. A silicon oxide film 118 having a thickness of 90 nm is formed on the entire surface of the resultant structure above the glass substrate 110 by use of a plasma CVD method, as shown in FIGS. 14A to 14C. Thereafter, a photoresist film (not shown) is formed on this silicon oxide film 118, and a selective exposure treatment and a developing treatment are performed, thus forming opening portions for forming contact hole. Then, the silicon oxide films 118 and 113 are dry-etched via these opening portions, and thus contact holes 118a which reach the impurity regions 115n and 115p and the connection wiring 114c from the upper surface of the silicon oxide film 118 are formed. Thereafter, the resist film is removed.

Next, Ti and Al—Nd containing Nd by 2 at. % are respectively formed to thicknesses of 100 nm and 200 nm on the entire surface of the resultant structure above the substrate 110 by use of a sputtering method, thus burying the contact holes with these metals and forming a two-layered structure metal film on the silicon oxide film 118.

Subsequently, a photoresist film is formed on the metal film, and a selection exposure treatment and a developing treatment are performed, thus forming a resist pattern (not shown) having a predetermined shape. Thereafter, the metal film is dry-etched using this resist pattern as a mask, thus forming electrodes (a source electrode and a drain electrode) 130 as shown in FIGS. 15A to 15C. At this time, a predetermined wiring pattern is formed in each formation region of the control circuit 101, the data driver 102 and the gate driver 103. Moreover, in the display section 104, the data bus line 108, the gate bus line 109 and the reflection electrode 131 are formed. As shown in FIG. 16A, though the gate bus line 109 is cut off into two pieces at the intersection portion with the data bus line 108, the two pieces of the gate bus lines 109 are electrically connected via the metal in the contact hole 118a and the connection wiring 114c.

Next, after the resist pattern is removed, P (phosphorus) is ion-implanted into the entire surface of the resultant structure above the substrate 110 under conditions of an acceleration voltage of 70 kV and a dose amount of $2\times10^{13}$ cm$^{-2}$, thus forming the LDD regions 120 of the n-type high-voltage driven TFT and the pixel TFT. In the n-type high-voltage driven TFT, the LDD region 120 is formed only in the drain-side impurity region 115n, and, in the pixel TFT, the LDD region 120 is respectively formed in each of the source and drain-side impurity regions 115n. Although P (phosphorus) is injected also into the impurity regions 115p of the p-type TFT in this step, the dose amount of P (phosphorus) is less than that of B (boron). Accordingly, the conductivity type of the impurity regions 115p does not change.

Thereafter, annealing is performed at temperature of 400° C., and the injected P (phosphorus) is electrically activated. By performing this annealing step at a hydrogen atmosphere, defects existing in an interface between the channel region and the gate insulating film and in the like can be hydrogenated simultaneously.

In the above described manner, the reflection-type liquid crystal display apparatus can be fabricated.

The liquid crystal display apparatus of the first embodiment is provided with the three wiring layers including the first wiring layer in which the gate electrode 114 of the low-voltage driven TFT is formed, the second wiring layer in which the gate electrodes 119 of the high-voltage driven TFT and pixel TFT are formed and the and the third wiring layer in which the electrode 122 is formed. On the other hand, in this embodiment, the gate electrode 114 of the low-voltage driven TFT and the gate electrodes 119 and the electrodes 130 of the high-voltage driven TFT and the pixel TFT are formed by the two wiring layers. Accordingly, the second embodiment has the advantage that the number of the manufacturing steps is smaller than that of the first embodiment.

As shown in FIGS. 15A to 15C, in the case of the reflection-type liquid crystal display apparatus having the low-voltage driven TFT, the high-voltage driven TFT and the pixel TFT, this liquid crystal display apparatus can be manufactured with 6 sheet of masks (photolithography steps performed six times).

Examples of the Modification of the First and Second Embodiments

Figure 17:
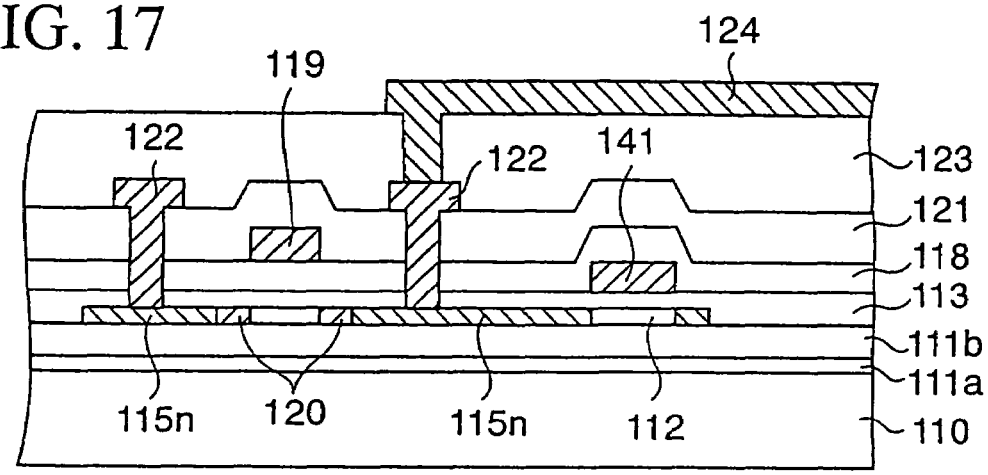
FIG. 17 is a drawing showing a modification (1) of the first and second embodiments.
Figure 18:
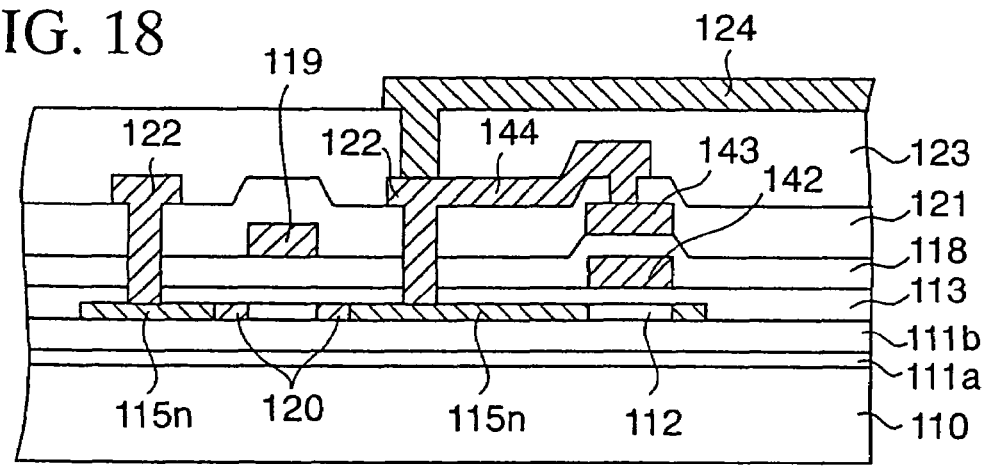
FIG. 18 is a drawing showing a modification (2) of the first and second embodiments.

In the first and second embodiments, the storage capacitor 107 is constituted by the storage capacitor bus line, the pixel electrode and the silicon oxide film between them. However, as shown in FIG. 17, the polysilicon film 112 of the pixel TFT is formed so as to extend in the vicinity of the central portion of the pixel TFT, and the storage capacitor may be constituted by the polysilcon film 112, the silicon oxide film 113 and the storage capacitor bus line 141, which are formed on the polysilicon film 112. To secure a large capacitor with a minute area, the capacitor electrode 143 is formed on the storage capacitor bus line 142 so as to sandwich the silicon oxide film 118 therebetween, and as shown in FIG. 18, this capacitor electrode 143 may be connected to the source electrode 122 of the pixel TFT via the wiring 144 on the silicon nitride film 121.

Figure 19:
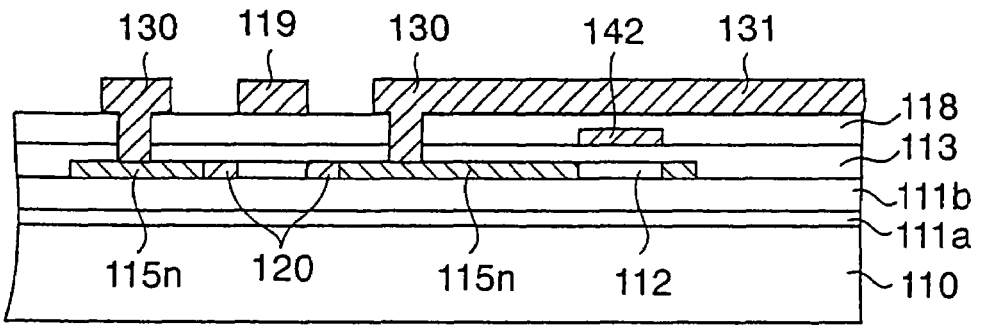
FIG. 19 is a drawing showing a modification of the second embodiment.

In addition, in the case of the liquid crystal display apparatus of the second embodiment, as shown in FIG. 19, the polysilocon film 112 of the pixel TFT is formed so as to extend to the vicinity of the central portion of the pixel TFT and the storage capacitor may be constituted by the polysilicon film 112, the silicon oxide film 113 and the storage capacitor bus line 142, which are formed on the polysilicon film 112.

Third Embodiment

A third embodiment of the present invention will be described below.

FIG. 20A is a section view showing a structure of a low-voltage driven TFT of a thin film transistor device (liquid crystal display apparatus) of the third embodiment of the present invention, and FIG. 20B is a section view showing a structure of a high-voltage driven TFT thereof. Note that a pixel TFT adopts the structure identical to that of the high-voltage driven TFT in the following embodiment.

An underlayer insulating film (buffer layer) 202 is formed on a glass substrate 201, and a polysilicon film 203 with a predetermined pattern, which serves as an operational layer of the TFT, is formed on the underlayer insulating film 202. A pair of high concentration impurity regions 203a serving as source/drain are formed in the polysilicon film 203 so as to sandwich a channel region therebetween. Furthermore, in the high-voltage driven TFT formation region, LDD regions (low concentration impurity region) 203b are respectively formed in the tip portions of the high concentration impurity regions 203a closer to a channel region.

In the high-voltage driven TFT formation region, a silicon oxide film (SiO$_2$) 204 is formed to a thickness of about 100 nm on the channel region and the LDD regions 203b, which are formed in the polysilicon film 203. Furthermore, a silicon oxide film 205 is formed to a thickness of about 30 nm on the underlayer insulating film 202, the polysilicon film 203 and the silicon oxide film 204. A gate electrode 206a of the low-voltage driven TFT and a gate electrode 206b of the high-voltage driven TFT are respectively formed on the silicon oxide film 205.

A silicon oxide film 208 is formed as an interlayer insulating film on the silicon oxide film 205 and the gate electrodes 206a and 206b. Contact holes communicating with the impurity regions 203a are formed in the silicon oxide film 208 and 205, and electrodes (a source electrode and a drain electrode) 209, which are electrically connected to the respective impurity regions 203a via the contact holes, are formed on the silicon oxide film 208.

As shown in FIGS. 20A and 20B, this embodiment has features in that the polysilicon film 203 is entirely covered with either the silicon oxide film 205 or the silicon oxide film 204, a gate insulating film is composed of the silicon oxide film 205 alone in the low-voltage driven TFT, a gate insulating film is composed of the two layers including the silicon oxide films 204 and 205 in the high-voltage driven TFT, no LDD region is provided in the low-voltage driven TFT, and the LDD regions 203b are provided in the high-voltage driven TFT.

Specifically, since the gate electrode 206a and the high concentration impurity region 203a are surely separated from each other by the silicon oxide film 205, occurrence of leak current is prevented. Furthermore, in the low-voltage driven TFT, a gate insulating film is constituted by the silicon oxide film 205 alone, and in the high-voltage driven TFT, a gate insulating film is composed of a two-layered structure including the silicon oxide films 204 and 205. In the case where two kinds of gate insulating films having different thicknesses are formed, it is conceived that a thick gate insulating film is formed, and a thin gate insulating film is formed by performing etching-back for a part of this thick gate insulating film. However, this method has a drawback that it is difficult to control an etch-back amount. A thickness control is made easier in such a manner that the thin gate insulating film is constituted by the one silicon oxide film 205 alone, and the thick insulating film are constituted by the laminated structure body including the two silicon oxide films 204 and 205 like this embodiment.

In this embodiment, since the low-voltage driven TFT has the thin gate insulating film and no LDD region, the low-voltage driven TFT can be operated at a high speed with a low voltage. Moreover, since the high-voltage driven TFT has the thick gate insulating film and the LDD regions 203b, the high-voltage driven TFT shows a high withstand voltage, and can avoid characteristic deterioration due to hot carriers even when this TFT is driven at a high voltage.

A method of manufacturing the liquid crystal display apparatus of this embodiment will be described with reference to FIGS. 21A to 25B below. In these FIGS. 21A to 25B, FIGS. 21A, 22A, 23A, 24A, 25A show section views in a low-voltage driven TFT formation region, and FIGS. 21B, 22B, 23B, 24B, 25B show section views in a high-voltage driven TFT formation region.

First, as shown in FIGS. 21A and 21B, as the underlayer insulating film, the silicon nitride film 202a having a thickness of about 40 nm and the silicon oxide film 202b having a thickness of about 20 nm are sequentially formed on the glass substrate 201.

Next, an amorphous silicon film having a thickness of 50 nm is formed on the silicon oxide film 202b by use of a CVD method. Thereafter, the amorphous silicon film is converted to a polysilicon film by radiating an excimer laser onto the entire surface of the amorphous silicon film, and this polysilicon film is patterned by use of a photolithography technique. Using the above described process, the polysilicon film 203 serving as the operational layer of the TFT is formed on the underlayer insulating film (the silicon oxide film 202b) as shown in FIGS. 21A and 21B.

Figure 22A:
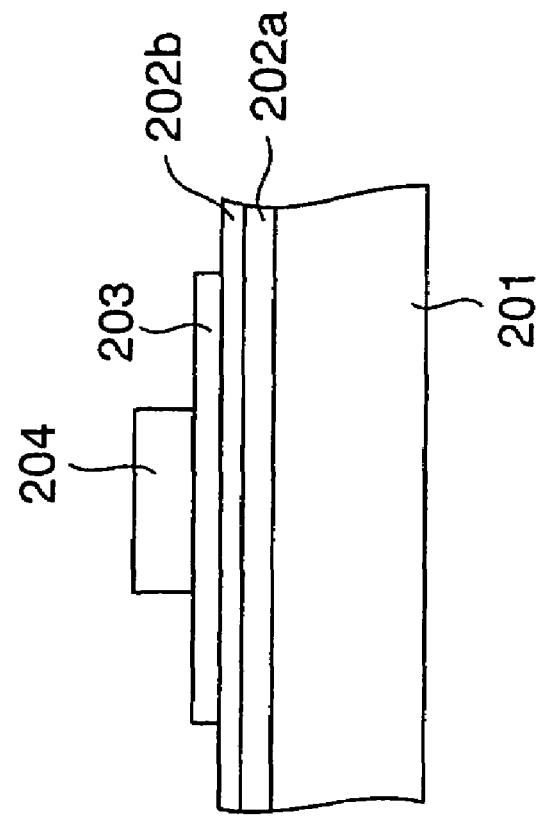
FIG. 22 is a section view (2) showing a method of manufacturing the thin film transistor device of the third embodiment.
Figure 22B:
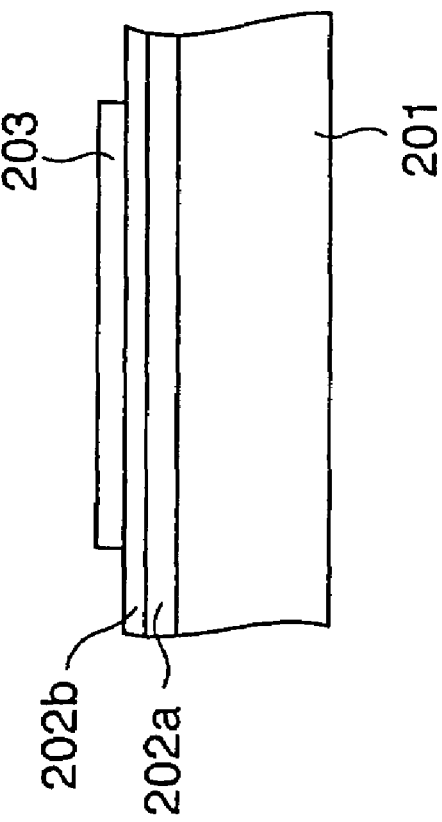

Subsequently, a silicon oxide film is deposited to a thickness of about 100 nm on the entire surface of the resultant structure above the substrate 201 by use a CVD method, and thus a silicon oxide film is formed. Thereafter, this silicon oxide film is patterned by use of a photolithography technique. Thus, as shown in FIGS. 22A and 22B, the silicon oxide film 204 is formed on the region which is used as a channel region of the polysilocon film 203 in the high-voltage driven TFT formation region.

Usually, patterning of the silicon oxide film is performed by dry-etching using $CHF_3$ gas. At this time, though also the silicon oxide film 202b that is the underlayer insulating film is etched, the substrate 201 is protected by the silicon nitride film 202a. Moreover, when this dry-etching is performed, a contaminant layer is produced on the surface of the polysilicon layer 203 by reaction products and the like by resist and $CHF_3$ gas. To remove or oxidize this contaminant layer, the contaminant layer undergoes a plasma treatment at a gas atmosphere containing oxygen. Thereafter, the polysilicon film 203 is treated with solution containing hydrofluoric acid, thus removing an oxide layer on the surface of the polysilicon film 203.

Figure 23A:
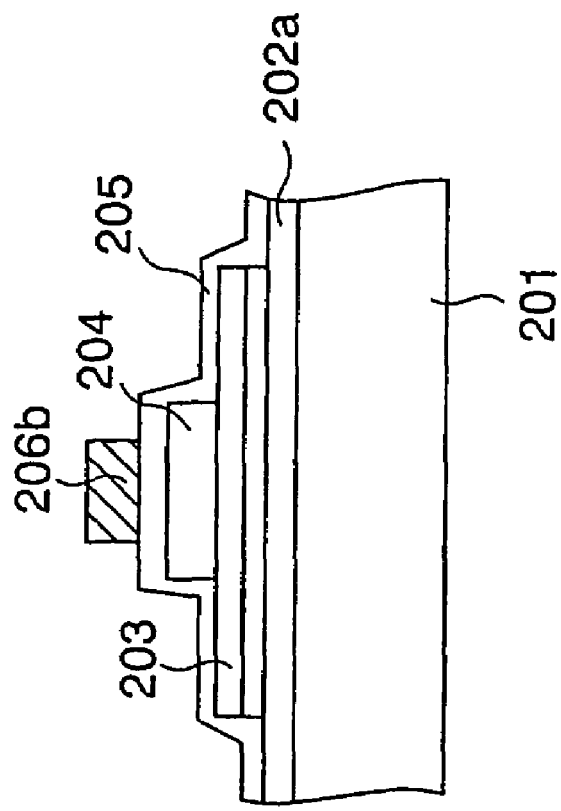
FIG. 23 is a section view (3) showing a method of manufacturing the thin film transistor device of the third embodiment.
Figure 23B:
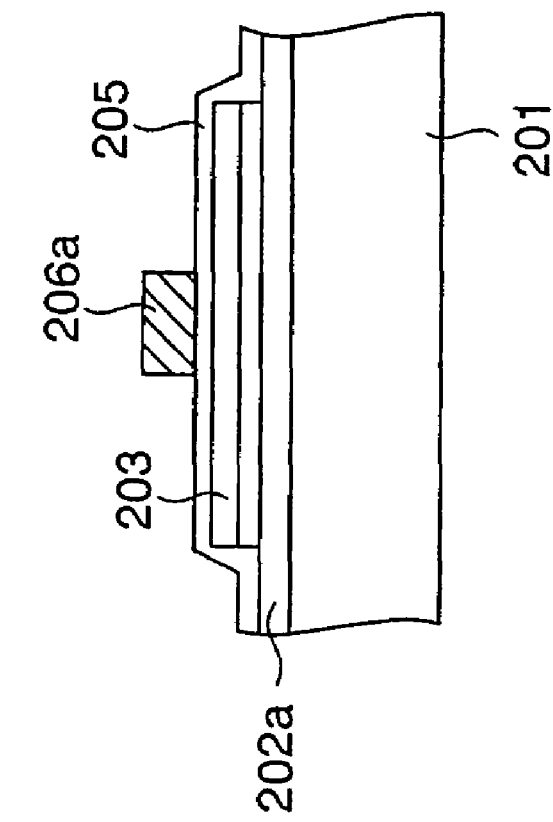

Next, as shown in FIGS. 23A and 23B, the silicon oxide film 205 is formed to a thickness of about 30 nm on the entire surface of the resultant structure above the substrate 201 by use of a CVD method, and the silicon nitride film 202a, the polysilicon film 203 and the silicon oxide film 204 are covered with this silicon oxide film 205. Thereafter, a metal film formed of Cr (chromium) is formed to a thickness of about 400 nm on the silicon oxide film 205 by use of a sputtering method, and then the metal film is patterned, thus forming the gate electrodes 206a and 206b. In this case, as shown in FIG. 23B, in the high-voltage driven TFT formation region, a mask for patterning the metal film must be positioned so that a width of the gate electrode 206b is smaller than that of the silicon oxide film 204, and a gap corresponding to the LDD region is produced between the edge of the silicon oxide film 204 and the edge of the gate electrode 206b when viewed from above. Note that a material of the gate electrodes 206a and 206b is not limited to Cr, but other conductive materials may be employed.

Figure 24A:
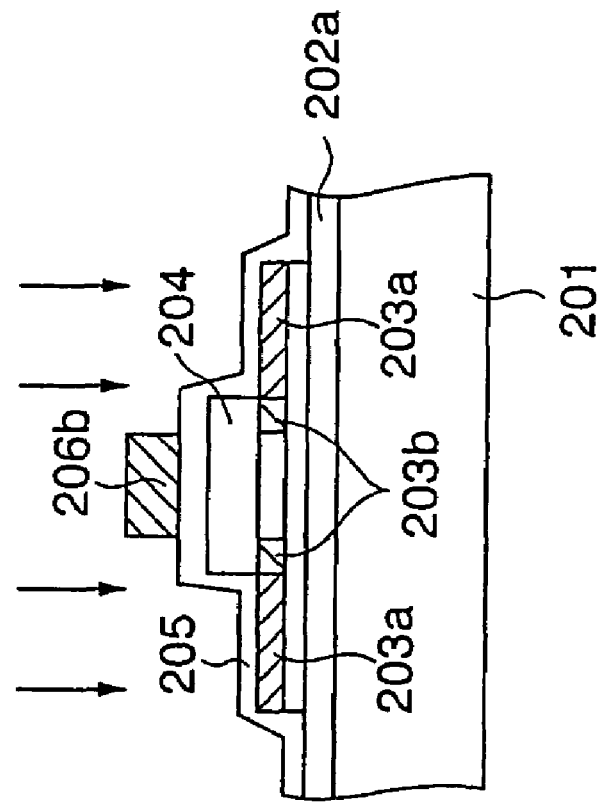
FIG. 24 is a section view (4) showing a method of manufacturing the thin film transistor device of the third embodiment.
Figure 24B:
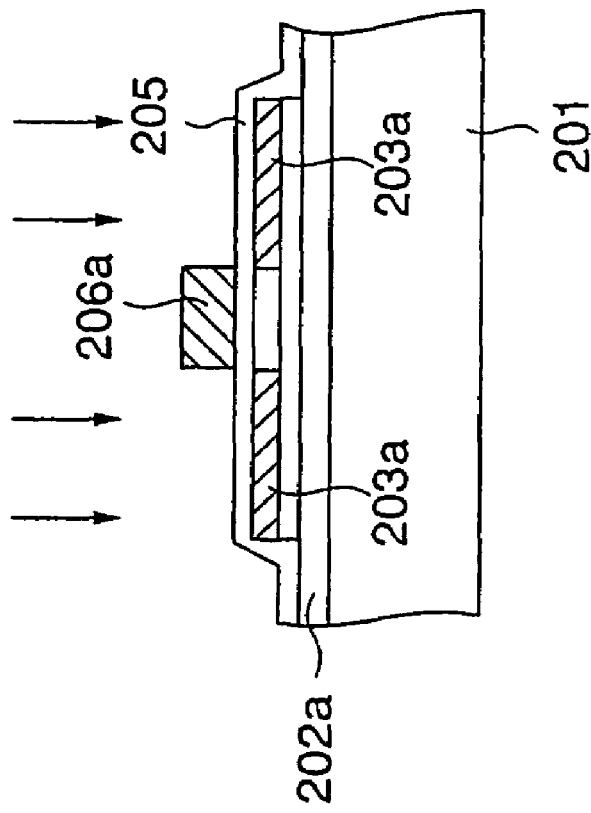

Next, as shown in FIGS. 24A and 24B, using gate electrodes 206a, 206b and silicon oxide film 204 as a mask, P (phosphorus) is ion-implanted to the polysilicon film 203 of the low-voltage driven TFT formation region and the high-voltage driven TFT formation region under conditions of, for example, an acceleration energy of 30 keV and a dose amount of $1 \times 10^{15}$ $cm^{-2}$, and thus the high concentration impurity regions 203a serving as source/drain are formed. Thereafter, P(phosphorus) is subsequently ion-implanted into the polysilicon film 203 of the high-voltage driven TFT formation region under conditions of, for example, an acceleration energy of 90 keV and a dose amount of $1 \times 10^{14}$ $cm^{-2}$, and thus the LDD regions (low concentration impurity region) 203b are formed.

Although descriptions are omitted, peripheral circuits such as a driver adopt CMOS structure usually. Accordingly, when the source/drain of the n-type TFT is formed, the p-type TFT formation region is covered with a mask such as photoresist, followed by ion-implanting impurities such as phosphorus into the polysilicon film 203 as described above. Furthermore, when the source/drain of the p-type TFT is formed, the n-type TFT formation region is covered with a mask, followed by ion-implanting impurities such as B (boron) into the polysilicon film of the p-type TFT formation region.

Next, as shown in FIGS. 25A and 25B, the silicon oxide film 208 as an interlayer insulating film is formed to a thickness of about 300 nm on the entire surface of the resultant structure above the substrate 201 by use of a CVD method. Thereafter, contact holes communicating with the high concentration impurity regions 203a are formed in the silicon oxide film 208 and 205 by use of a photolithography technique. Subsequently, a metal such as molybdenum (Mo) is deposited on the entire surface of the resultant structure above the substrate 201, thus forming a metal film having a thickness of about 300 nm on the silicon oxide film 208. Then, this metal film is patterned, and the electrodes 209, which are electrically connected to the respective high concentration impurity regions 203a via the contact holes, are formed. In the above described manner, the low-voltage driven TFT and the high-voltage driven TFT are completed.

In the above described method, both the gate insulating film and the interlayer insulating film are formed by the silicon oxide film. However, the gate insulating film and the interlayer insulating film may be formed by other insulating materials. Moreover, the material of the substrate 201 is not limited to glass, but plate materials formed by plastic or other transparent materials can be employed.

Effects and advantages of the present invention will be described below.

Figure 2A:
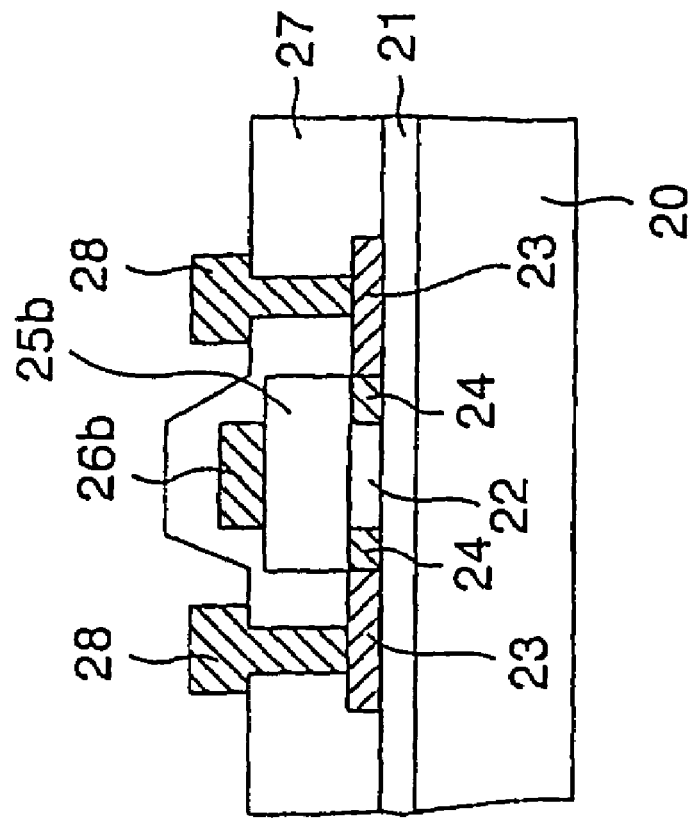
FIG. 2A is a section view showing a structure of a low-voltage driven TFT of a conventional thin film transistor device.

In the low-voltage driven TFT of the prior art shown in FIG. 2A, a high speed operation at a low voltage is made possible by forming the gate insulating film to be as thin as, for example, about 30 nm. In this case, as shown in FIG. 2A, if a width of the gate insulting film and a width of the gate electrode are equal to each other, a leak current is apt to occur by a small amount of impurities and contaminant ions which unavoidably remain on side portions of the gate insulating film during the steps such as patterning. Furthermore, when the gate insulating film of the high-voltage driven TFT is formed after the gate electrode of the low-voltage driven TFT is formed, a treatment is performed by use of a solution containing hydrofluoric acid which is usually used to purify an interface between the semiconductor film and a gate insulating film. However, when the gate insulating film that has been already formed is a silicon oxide film, a side of the gate insulating film is eroded by the hydrofluoric acid, the leak current is more apt to occur, and an offset structure between the channel and the source/drain is produced. In the high-voltage driven TFT, as shown in FIG. 2B, a side portion of the gate insulating film and the gate electrode is apart from each other by an amount equivalent to the LDD layer, for example, 1 μm, and a possibility of occurrence of a leak current is low because a thickness of the gate insulating film is thick.

In this embodiment, since the gate insulating film (the silicon oxide film 205) is formed also on the high concentration impurity region that is the source/drain of the TFT, it is possible to securely separate the gate electrode 206a and the high concentration impurity region 203a by this gate insulating film.

Figure 2B:
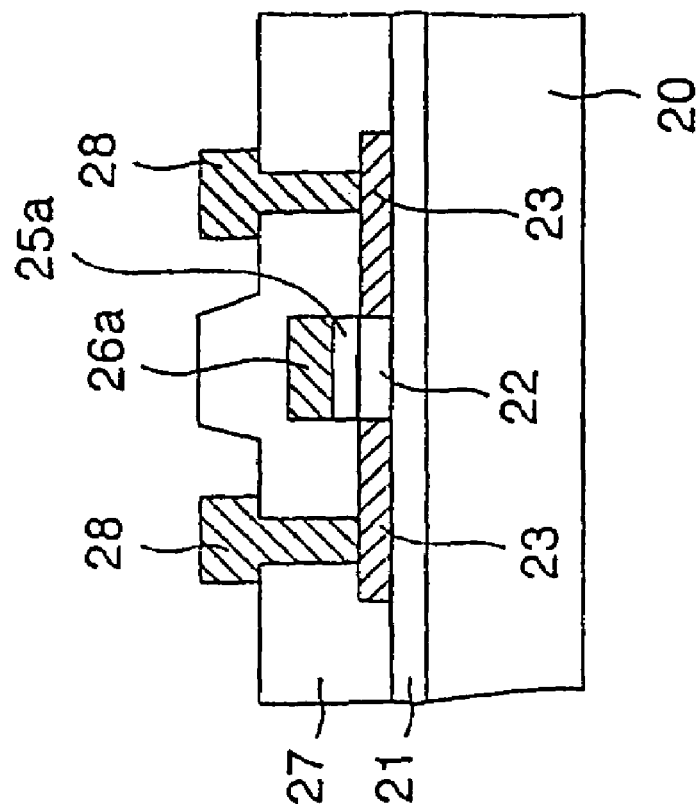
FIG. 2B is a section view showing a structure of a high-voltage driven TFT of the conventional thin film transistor device.

In this embodiment, since the LDD region is formed by ion-implanting impurities into the polysilicon film via the silicon oxide film 204 which is formed to be thick, it is possible to simplify masking steps compared to the thin film transistor device shown in FIGS. 2A and 2B.

The third embodiment is effective when both of the insulating films 204 and 205 constituting the gate insulating film are formed by the silicon oxide film (SiO$_2$) since there is no etching rate difference between these two insulating films.

It is conceived that one insulating film is formed by silicon oxide (SiO$_2$) and the other insulating film is formed by silicon nitride (SiN). For example, after the polysilcon film 203 is formed, the silicon nitride film having a thickness of 100 nm is formed only on the polysilicon film in the high-voltage driven TFT formation region. Thereafter, the silicon oxide film is formed to a thickness of 30 nm on the entire surface of the resultant structure above the substrate 201. Also by the above described manner, the thin gate insulating film formed of the silicon oxide film alone can be formed in the low-voltage driven TFT formation region and the thick gate insulating film having the two-layered structure composed of the silicon nitride film and the silicon oxide film can be formed in the high-voltage driven TFT formation region.

However, since the silicon oxide film and the insulating film other than the silicon oxide film create an interface level and reliability of the TFT may be decreased, any of the two insulating films constituting the gate insulating film should be a silicon oxide film as described in the third embodiment.

Moreover, a thin gate insulating film and a thick gate insulating film may be formed by etching-back. Specifically, as shown in FIGS. 21A and 21B, after the polysilicon film 203 is formed, the insulating film is formed to a thickness of 130 nm on the entire surface of the resultant structure above the substrate 201, and the resist pattern is formed on the insulating film. Then, by etching back the insulating film by a thickness of 100 nm, the gate insulating film 210 which has a thin portion in the low-voltage driven TFT formation region and a thick portion in the high-voltage driven TFT formation region is formed, as shown in FIGS. 26A and 26B.

In this embodiment, when the oxide layer in the surface of the polysilicon film 203 is removed by the solution containing hydrofluoric acid in the steps shown in FIGS. 22A and 22B, the upper and side portions of the silicon oxide film 204 is etched. Accordingly, the silicon oxide film 204 should be formed so as to have a size a little larger than that previously desired. Note that since the high concentration impurity region serving as the source/drain is formed after the surface of the polysilicon film 203 is treated by the solution containing hydrofluoric acid, the offset region is never formed between the channel region and the source/drain even if the silicon oxide film 204 is etched in this step.

Furthermore, in this embodiment, the two-layered structure composed of the silicon nitride film 202a and the silicon oxide film 202b is adopted as the underlayer insulating film. When the silicon oxide film 204 is formed as described above, the silicon oxide film 202b constituting the underlayer insulating film is etched. However, since the thickness of the silicon oxide film 202b is as thin as about 20 nm, a surface coverage of the silicon oxide film (gate insulating film) 205 is never damaged by the edge portion of the polysilicon film 203.

Fourth Embodiment

Figure 27A:
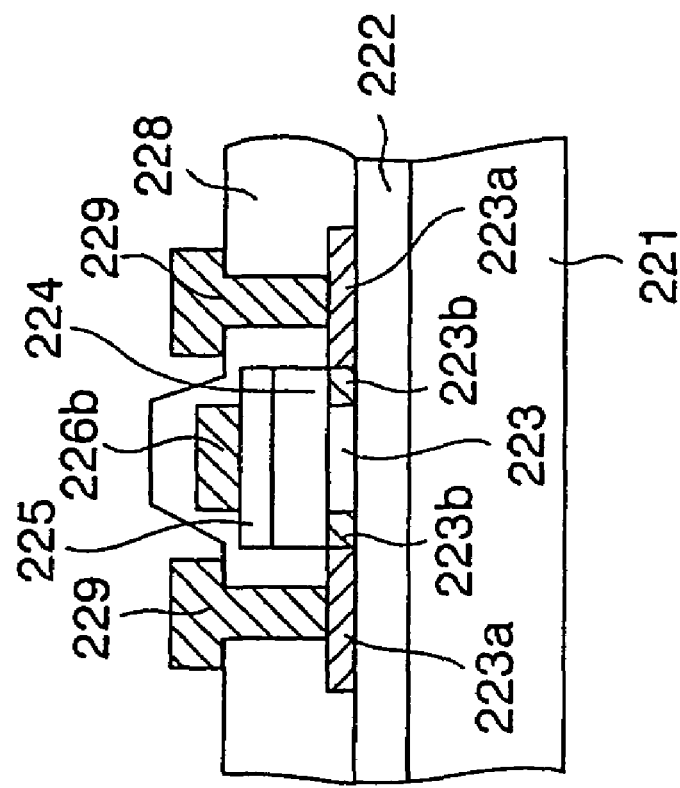
FIG. 27A is a section view showing a structure of a low-voltage driven TFT of a thin film transistor device (liquid crystal display apparatus) of a fourth embodiment of the present invention.
Figure 27B:
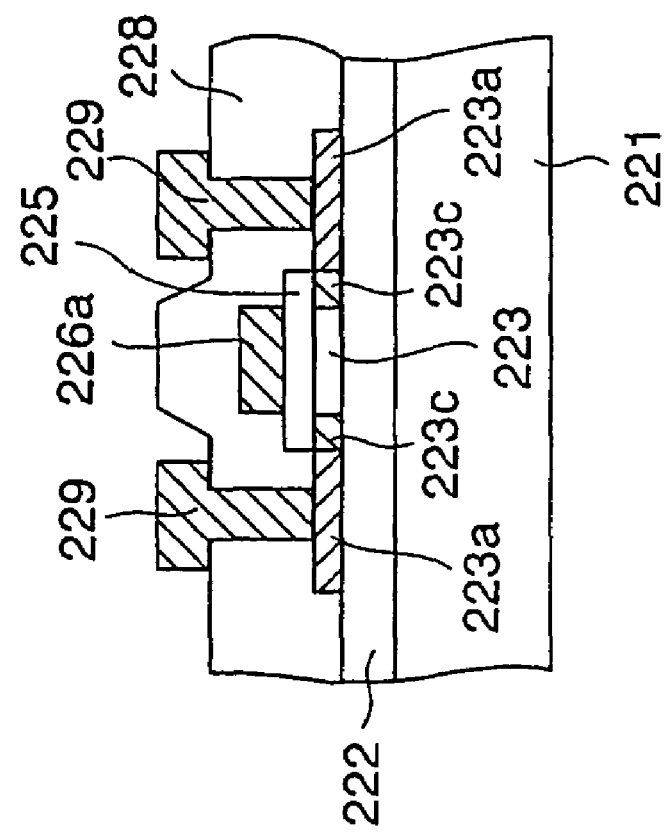
FIG. 27B is a section view showing a structure of a high-voltage driven TFT thereof.

FIG. 27A is a section view showing a structure of a low-voltage driven TFT of a thin film transistor device (liquid crystal display apparatus) of a fourth embodiment of the present invention, and FIG. 27B is a section view showing a structure of a high-voltage driven TFT thereof Also in this embodiment, a pixel TFT adopts the same structure as that of the high-voltage driven TFT.

First, the structure of the low-voltage driven TFT will be described. As shown in FIG. 27A, an underlayer insulating film (buffer layer) 222 is formed on a glass substrate 221, and a polysilicon film 223 is selectively formed on the underlayer insulating film 222. In this polysilicon film 223, there are a pair of high concentration impurity regions 223a serving as source/drain, and a pair of pseudo LDD regions 223c disposed at tip portions of the high concentration impurity regions 223a closer to a channel region are provided. Impurities are injected to the pseudo LDD regions 223c at approximately the same concentration as that of the high concentration impurity regions 223a unlike the LDD regions 223b of the later-described high-voltage driven TFT.

A silicon oxide film 225 having a thickness of 30 nm is formed as a gate insulating film on the channel region and the pseudo LDD regions 223c of the polysilicon film 223. Moreover, a gate electrode 226a is formed on the silicon oxide film 225. When viewed from above, edges of the pseudo LDD regions 223c closer to the channel region are located at approximately the same positions as edges of the gate electrode 226a.

A silicon nitride film 228 is formed as an interlayer insulating film on the underlayer insulating film 222, the polysilicon film 223, the silicon oxide film 225 and the gate electrode 226a. Electrodes (a source electrode and a drain electrode) 229 are formed on the silicon nitride film 228, and these electrode 229 are electrically connected to the respective high concentration impurity regions 223a via contact holes formed in the silicon nitride film 228.

Next, a constitution of the high-voltage driven TFT will be described. As shown in FIG. 27B, an underlayer insulating film 222 is formed on a glass substrate 221, and a polysilicon film 223 is selectively formed on the underlayer insulating film 222. In the polysilicon film 223, there are a pair of high concentration impurity regions 223a serving as source/drain and a pair of LDD regions (low concentration impurity regions) 223b disposed at tip portions of the high concentration impurity regions 223a closer to a channel region.

A silicon oxide film 224 having a thickness of 100 nm and a silicon oxide film 225 having a thickness of 30 nm are laminated on the channel region and the LDD regions 223b of the polysilicon film 223. A gate insulating film of the high-voltage driven TFT is constituted by these silicon oxide films 224 and 225. A gate electrode 226b is formed on the silicon oxide film 225. When viewed from above, edges of the LDD regions 223b closer to the channel region is located at approximately the same positions as edges of the gate electrode 226b.

A silicon nitride film 228 as an interlayer insulating film is formed on the underlayer insulating film 222, the polysilicon film 223, the silicon oxide film 225 and the gate electrode 226b. Electrodes (a source electrode and a drain electrode) 229 are formed on the silicon nitride film 228, and these electrodes 229 are electrically connected to the respective high concentration impurity regions 223a via contact holes formed in the silicon nitride film 228.

A method of manufacturing the liquid crystal display apparatus of this embodiment will be described below with reference to FIGS. 28A to 32B. In FIGS. 28A to 32B, FIGS. 28A and 32A show section views in a low-voltage driven TFT formation region, and FIGS. 28B and 32B show section views in a high-voltage driven TFT formation region.

Figure 28A:
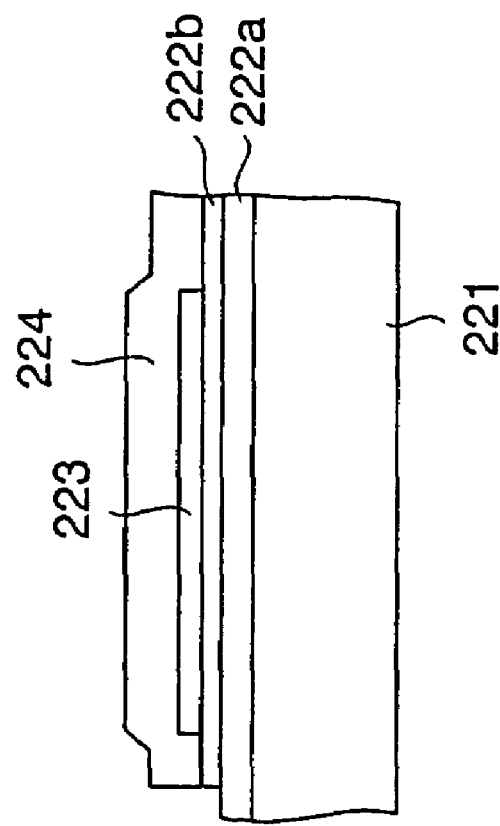
FIG. 28 is a section view (1) showing a method of manufacturing the thin film transistor device of the fourth embodiment.
Figure 28B:
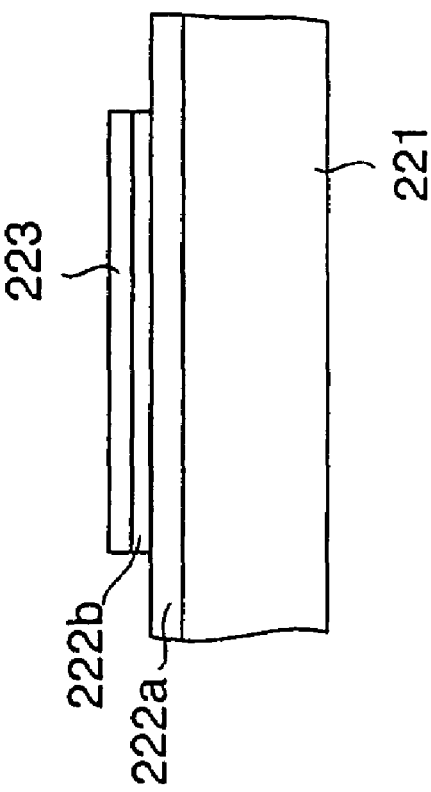

First, as shown in FIGS. 28A and 28B, a silicon nitride film 222a having a thickness of 40 nm and a silicon oxide film 222b having a thickness of about 20 nm, which serve as an underlayer insulating film, are sequentially formed on a glass substrate 221.

Next, an amorphous silicon film is formed to a thickness of about 50 nm on the underlayer insulating film by use of a CVD method. Then, excimer laser is irradiated onto the amorphous silicon film to be converted to a polysilicon film. Subsequently, the polysilicon film is patterned by use of a photolithography technique. In such a manner, the polysilicon film 223 is formed on the underlayer insulating film (the silicon oxide film 222b) in predetermined regions.

Next, a silicon oxide film (SiO2) having a thickness of about 100 nm is formed on the entire surface of the resultant structure above the substrate 221 by use of a CVD method. Then, this oxide film is patterned by use of a photolithography technique. Thus, as shown in FIG. 28B, a silicon oxide film 224 covering the polysilicon film 223 in the high-voltage driven TFT formation region is formed.

In the formation step of the silicon oxide film 224, also the silicon oxide film 222b of the underlayer insulating film is inevitably etched, and the silicon nitride film 222a is exposed. Patterning of this silicon oxide film 224 is performed by dry-etching using $CHF_3$ gas. Thereafter, a plasma treatment is performed at a gas atmosphere containing oxygen, and a contaminant layer such as reaction products due to resist and $CHF_3$ gas during the etching, which is formed on the surface of the polysilicon film 223, is removed or oxidized. Moreover, the polysilicon film 223 is treated by a solution containing hydrofluoric acid, whereby an oxide layer on the surface of the polysilicon film 223 is removed.

Next, as shown in FIGS. 29A and 29B, the silicon oxide film 225 is formed to a thickness of about 30 nm on the entire surface of the resultant structure above the substrate 221, and the metal film 226 formed of a metal such as Cr is formed to a thickness of about 400 nm on the silicon oxide film 225. Then, resist patterns 227a and 227b for forming the gate electrodes are formed on the metal film 226 by use of photoresist.

Next, as shown in FIGS. 30A and 30B, the metal film 226 is etched, thus forming the gate electrodes 226a and 226b. At this time, side-etching is performed so that widths of the gate electrodes 226a and 226b are narrower than those of the resist patterns 227a and 227b by about 2 μm by adjusting an etching time. Subsequently, the silicon oxide films 225 and 224 undergo anisotropic etching in plasma, and the silicon oxide films 225 and 224 are partially removed while leaving the parts thereof only below the resist patterns 227a and 227b. Thereafter, the resist patterns 227a and 227b are removed. By the above described manner, the gate insulating films (the insulating films 224 and 225) and the gate electrodes 226a and 226b having widths narrower than those of the gate insulating films can be formed.

Figure 31A:
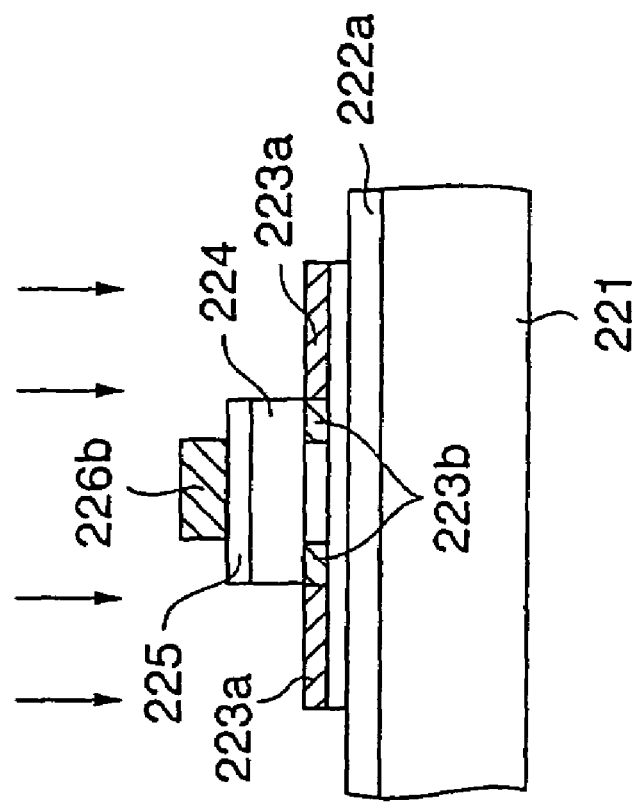
FIG. 31 is a section view (4) showing a method of manufacturing the thin film transistor device of the fourth embodiment.
Figure 31B:
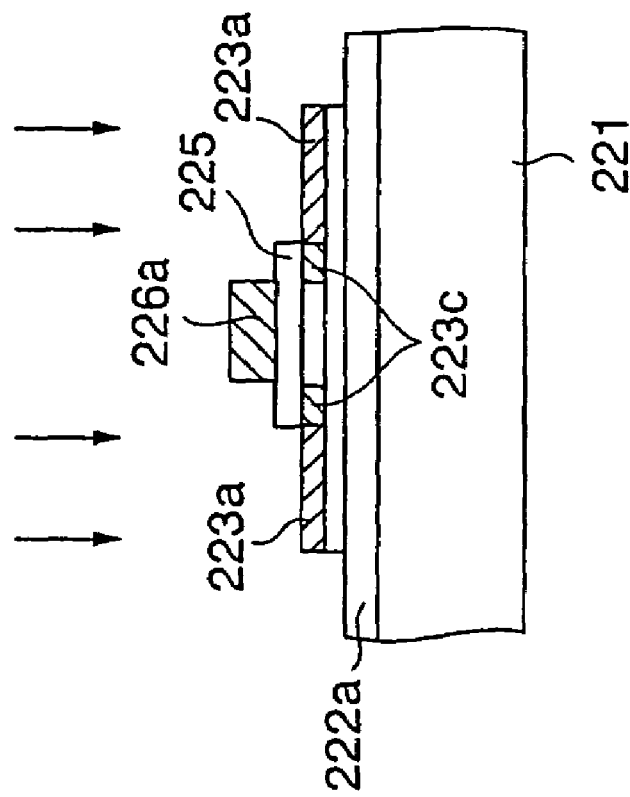

Next, as shown in FIGS. 31A and 31B, P (phosphorus) is ion-implanted into the polysilicon film 223 using the gate electrodes 226a and 226b and the gate insulating films 224 and 225 as a mask under conditions of acceleration energy of 10 keV and a dose amount of $1\times10^{15}$ cm$^{-2}$, and thus the high concentration impurity regions 223a serving as source/drain of the low and high-voltage driven TFTs are formed.

Subsequently, P (phosphorus) is ion-implanted into the polysilcon film 223 in the low-voltage driven TFT formation region via the silicon oxide film 225 under conditions of acceleration energy of 30 keV and a dose amount of $1\times10^{15}$ cm$^{-2}$, thus forming the pseudo LDD regions 223c.

Furthermore, P (phosphorus) is ion-implanted into the polysilicon film 223 in the high-voltage driven TFT formation region via the silicon oxide films 225 and 224 under conditions of acceleration energy of 90 keV and a dose amount of $1\times10^{14}$ cm$^{-2}$, thus forming the LDD regions (low concentration impurity regions) 223b. In the above described manner, the acceleration energy for injecting the impurities is adjusted depending on the presence or absence of the gate insulating film and the thickness of the gate insulating film in this embodiment, and the high concentration impurity regions 223a, the pseudo LDD regions 223c of the low-voltage driven TFT and the LDD regions 223b of the high-voltage driven TFT are formed.

Figure 32A:
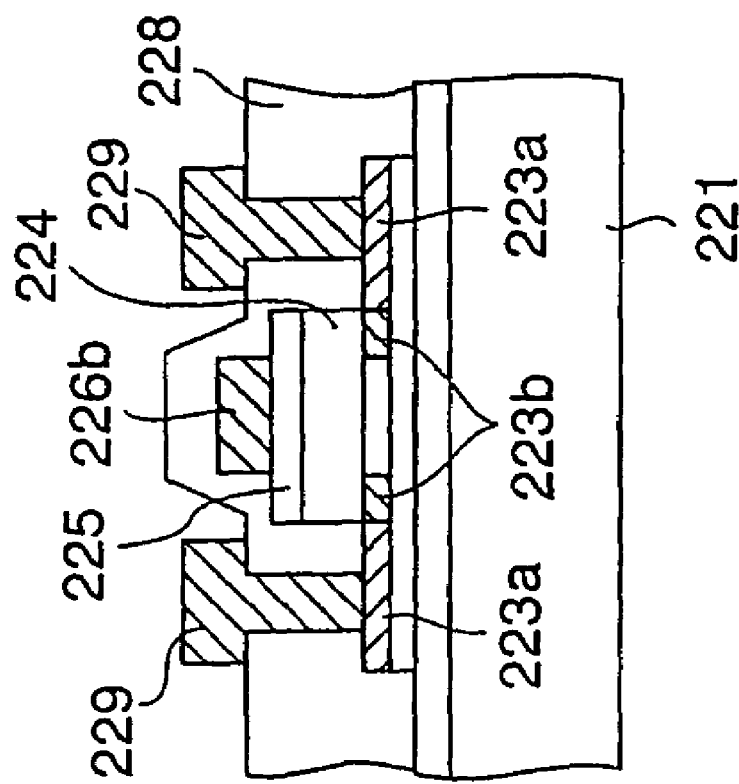
FIG. 32 is a section view (5) showing a method of manufacturing the thin film transistor device of the fourth embodiment.
Figure 32B:
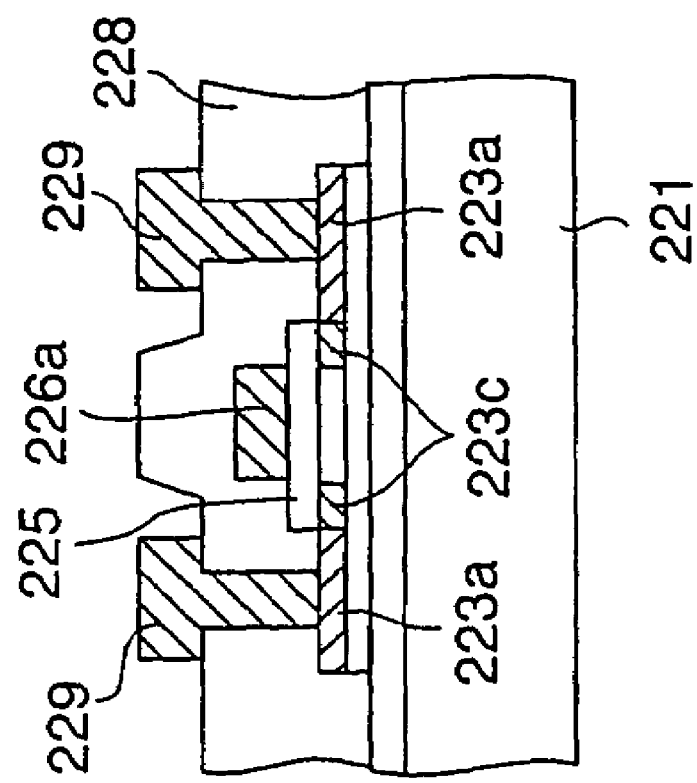

Subsequently, as shown in FIGS. 32A and 32B, the silicon nitride film 228 having a thickness of 300 nm is formed as the interlayer insulating film on the entire surface of the resultant structure above the substrate 221. Then, contact holes communicating with the respective high concentration impurity regions 223a are formed in the silicon nitride film 228. Thereafter, a metal such as Mo is deposited on the entire surface of the resultant structure above the substrate 221, thus forming a metal film having a thickness of 300 nm. By patterning this metal film, the electrodes 229 electrically connected to the respective high concentration impurity regions 223a via the contact holes are formed.

Thus, the liquid crystal display apparatus comprising the low-voltage driven TFT and the high-voltage driven TFT is completed. In the above described embodiments, the method of manufacturing the n-type TFT was described. When a p-type TFT is formed, an n-type TFT formation region is masked by resist, and impurities such as B(boron) may be injected into the polysilicon film 223.

Also in this embodiment, since the side portion of the gate electrode and the side portion of the gate insulating film are apart from each other, a leak current flowing between the gate electrode and the high concentration impurity region is reduced same as the third embodiment. Moreover, it is possible to manufacture by comparatively simple steps the low-voltage driven TFT which has a thin gate insulating film and can perform a high speed operation at a low voltage and the high-voltage driven TFT which has a thick gate insulating film.

In this embodiment, since the impurities are injected into the polysilicon film 223 under the three kinds of conditions, the number of the ion-implanting steps becomes larger than those of the third embodiment. However, since the gate electrodes 226a and 226b serving as a mask in forming the LDD regions and the pseudo LDD regions are formed by the side-etching, this embodiment has the following advantage. Specifically, the high accuracy mask alignment (steps shown in FIGS. 23A and 23B) required in the third embodiment is unnecessary, in which a distance between each of the edges of the insulating film 204 and each of the edges of the gate electrode 206b must be controlled to be about 0.1 to 3 μm.

In the foregoing third and fourth embodiments, the low-voltage driven TFT can perform a higher speed operation by setting the channel length of the low-voltage driven TFT to be shorter than that of the high-voltage driven TFT. Moreover, since the high-voltage driven TFT used for the liquid crystal display apparatus is not required so much to perform a high speed operation, the channel length thereof should be made a little longer in consideration for the hot carrier deterioration and the off-leak characteristic.

Fifth Embodiment

Figure 33A:
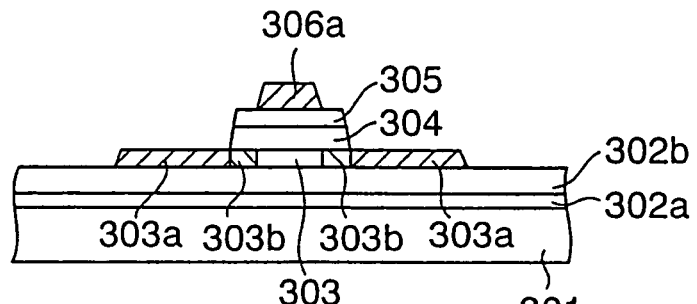
FIG. 33A is a section view showing a structure of a high-voltage driven TFT of a thin film transistor device of a fifth embodiment of the present invention, which is in a direction perpendicular to a gate electrode thereof.
Figure 33B:
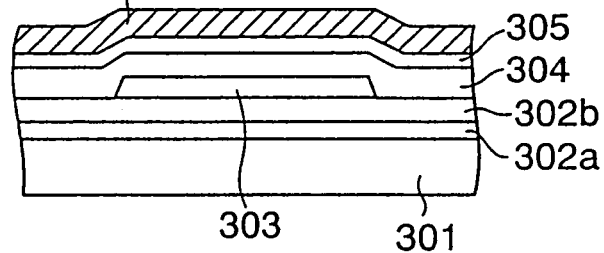
FIG. 33B is a section view showing the structure of the high-voltage driven TFT thereof, which is in a direction in parallel with the gate electrode thereof.
Figure 34A:
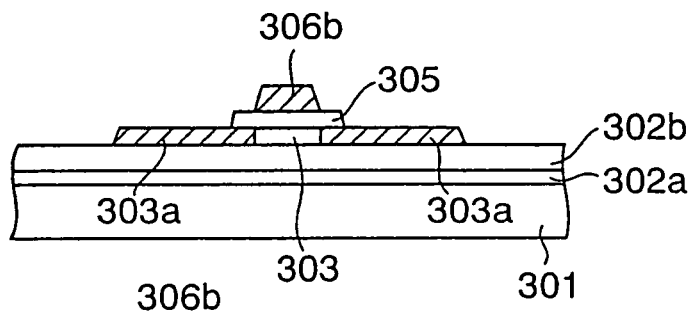
FIG. 34A is a section view showing a structure of a low-voltage driven TFT of the thin film transistor device of the fifth embodiment, which is in a direction perpendicular to a gate electrode thereof.
Figure 34B:
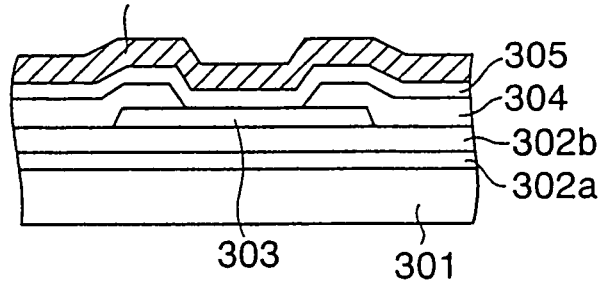
FIG. 34B is a section view showing the structure of the low-voltage driven TFT thereof, which is in a direction in parallel with the gate electrode thereof.

FIGS. 33A and 33B are section views showing a structure of a high-voltage driven TFT of a thin film transistor device of a fifth embodiment of the present invention, and FIGS. 34A and 34B are section views showing a structure of a low-voltage driven TFT thereof. FIG. 33A shows a section in a direction perpendicular to a gate electrode of the high-voltage driven TFT, and FIG. 33B shows a section in a direction in parallel with the gate electrode of the high-voltage driven TFT. FIG. 34A shows a section in a direction perpendicular to a gate electrode of the low-voltage driven TFT, and FIG. 34B shows a section in a direction in parallel with the gate electrode of the low-voltage driven TFT.

First, the structure of the high-voltage driven TFT will be described. As shown in FIGS. 33A and 33B, a silicon nitride film 302a and a silicon oxide film 302b are laminated as an underlayer insulating film on a substrate 301 formed of a transparent material such as glass.

A polysilicon film 303 is formed on a predetermined region of the silicon oxide film 302b. A pair of high concentration impurity regions 303a serving as source/drain of the TFT are formed in the polysilicon film 303 so as to sandwich a channel region. LDD regions (low concentration impurity region) 303b are formed between the high concentration impurity regions 303a and the channel region.

A silicon oxide film 304 having a thickness of 100 nm and a silicon oxide film 305 having a thickness of 30 nm are laminated on the channel region and the LDD regions 303b of the polysilicon film 303. A gate insulating film of the high-voltage driven TFT is constituted by these silicon oxide films 304 and 305.

A gate electrode 306a is formed on the silicon oxide film 305. A width of the gate electrode 306a is made smaller than that of the gate insulating film constituted by the silicon oxide films 304 and 305. Moreover, when viewed from above, edges of the LDD regions 303a closer to the channel regions are located at approximately the same positions as those of edges of the gate electrode 306a.

Next, a constitution of the low-voltage driven TFT will be described. As shown in FIGS. 34A and 34B, a silicon nitride film 302a and a silicon oxide film 302b are laminated as an underlayer insulating film on the substrate 301.

The polysilicon film 303 is selectively formed on the silicon oxide film 302b. A pair of high concentration impurity regions 303a serving as source/drain of the TFT are formed in the polysilicon film 303 so as to sandwich a channel region.

A silicon oxide film 305 having a thickness of 30 nm is formed on the channel region and tip portions of the high concentration impurity regions 303a of the polysilicon film 303 closer to the channel region. A gate insulating film of the low-voltage driven TFT is constituted by the silicon oxide film 305. Moreover, as shown in FIG. 34B, a silicon oxide film 304 having a thickness of 100 nm is formed on a part of the edge portions of the polysilicon film 303 which vertically intersects the gate electrode 306b.

A gate electrode 306b is formed on the silicon oxide film 305. A width of the gate electrode 306b is made smaller than that of the gate insulating film (the silicon oxide film 305). Moreover, when viewed from above, tip potions of the high concentration impurity regions 303a closer to the channel region vertically overlap edge portions of the gate electrode 306b.

Figure 35A:
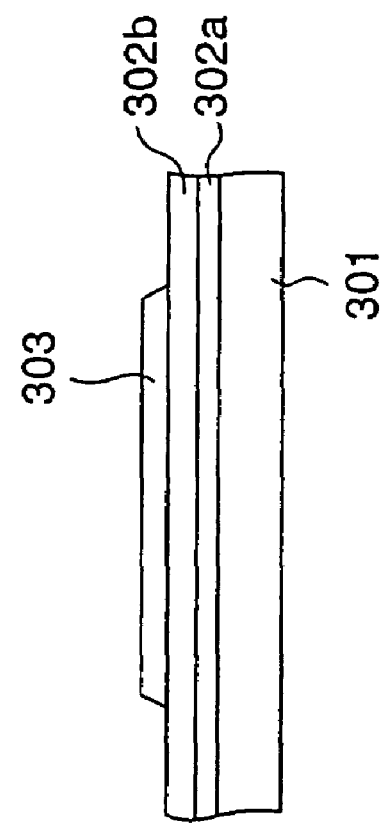
FIG. 35 is a section view (1) showing a method of manufacturing a thin film transistor device of the fifth embodiment.
Figure 35B:
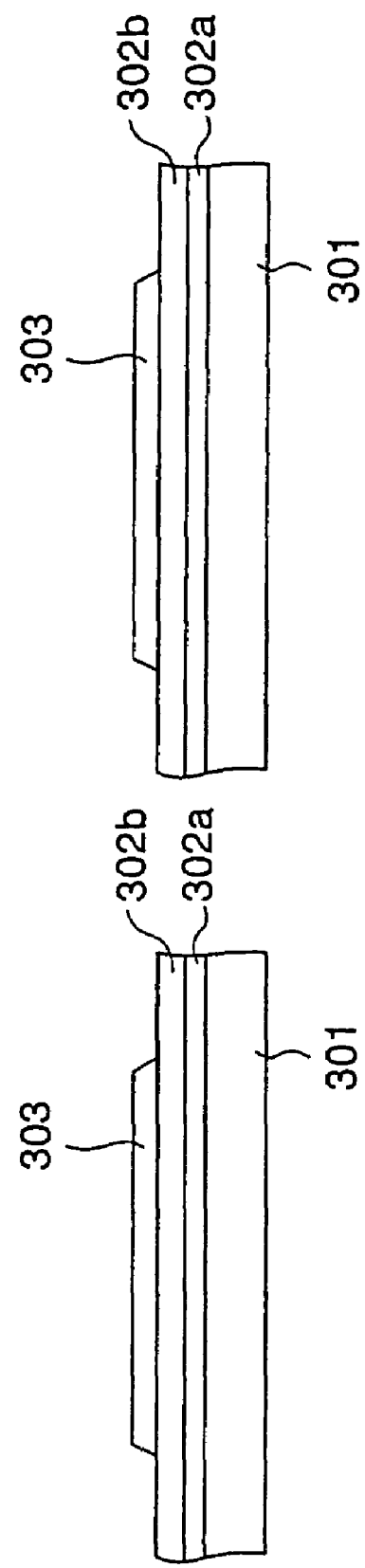

Hereinafter, a method of manufacturing the thin film transistor device (liquid crystal display apparatus) of this embodiment using the foregoing two kinds of TFTs will be described with reference to FIGS. 35A to 43B. In FIGS. 35A to 43B, FIGS. 35A, 36A, 37A, 38A, 39A, 40A, 41A, 42A and 43A show section views in the high-voltage driven TFT formation region, and FIGS. 35B, 36B, 37B, 38B, 39B, 40B, 41B, 42B and 43B show section views in the low-voltage driven TFT formation region. All of these drawings show sections in a direction perpendicular to the gate electrodes 306a and 306b First, as shown in FIGS. 35A and 35B, the silicon nitride film 302a having a thickness of about 50 nm and the silicon oxide film 302b having a thickness of about 200 nm as the underlayer insulating film are sequentially formed on the glass substrate 301 by use of a CVD method. Thereafter, an amorphous silicon film is formed to a thickness of about 50 nm on the silicon oxide film 302b by use of a plasma CVD method. Then, excimer laser is irradiated onto this amorphous silicon film, and the amorphous silicon film is converted to the polysilicon film. Thereafter, a resist film with a predetermined pattern is formed on the polysilicon film, and the polysilicon film is etched using this resist film as a mask. Then, the resist film is removed. In the above described manner, as shown in FIGS. 35A and 35B, the polysilicon film 303 is formed in predetermined regions on the silicon oxide film 302b.

Figure 44B:
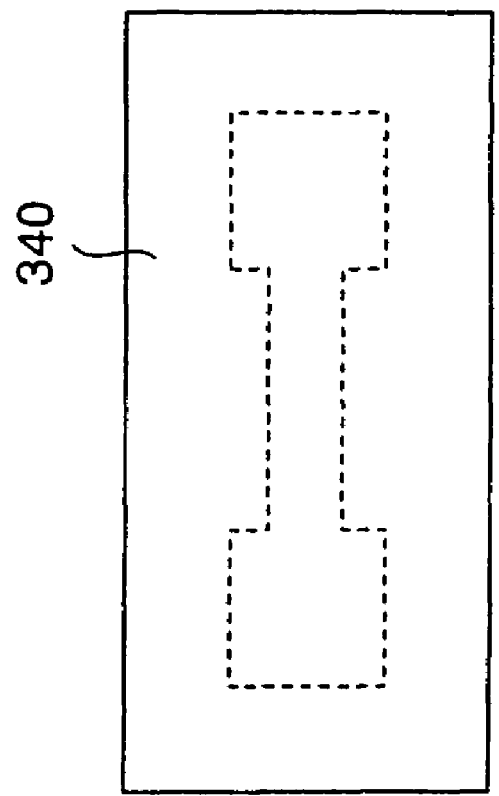
FIG. 44 is a drawing showing an example of a resist pattern used in the fifth embodiment.
Figure 44A:
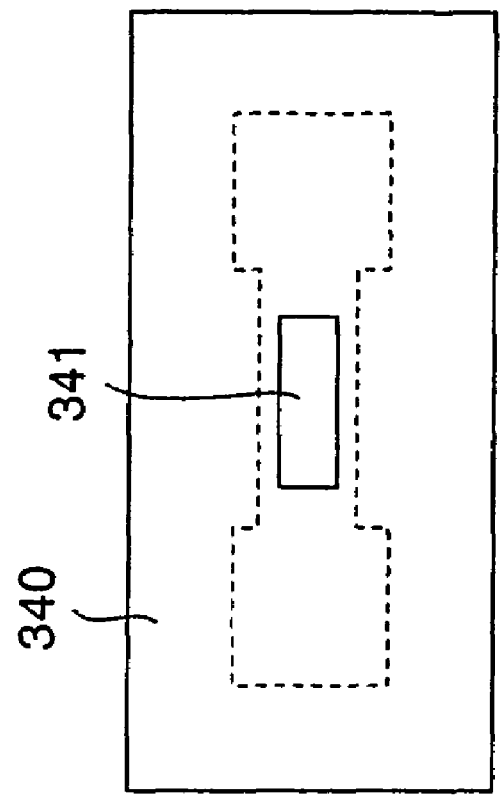

Next, the silicon oxide film 304 is formed to a thickness of about 100 nm on the entire surface of the resultant structure above the substrate 301. On the silicon oxide film 304, formed is a resist film 340 with a pattern shown in FIGS. 44A and 44B, for example, in which an opening portion 341 exposing a central portion of the low-voltage driven TFT is provided. Note that FIG. 44A shows the resist film 340 of the high-voltage driven TFT formation region, which has no opening portion, and FIG. 44B shows the resist film 340 of the low-voltage driven TFT, which has the opening portion. In addition, the broken lines in the drawings show the shape of the polysilicon film 303.

The silicon oxide film 304 is wet-etched using the resist film 340 as a mask, and thus the central portion of the polysilicon film 303 of the low-voltage driven TFT formation region is exposed, as shown in FIG. 36B. In this case, the silicon oxide film 304 is left on the edge portions of the polysilicon film 303. A diluted hydrofluoric acid solution, for example, can be used as etching liquid for the silicon oxide film 304. In the high-voltage driven TFT formation region, the entire of the polysilicon film 303 is left covered with the silicon oxide film 304, as shown in FIG. 36B.

Figure 37A:
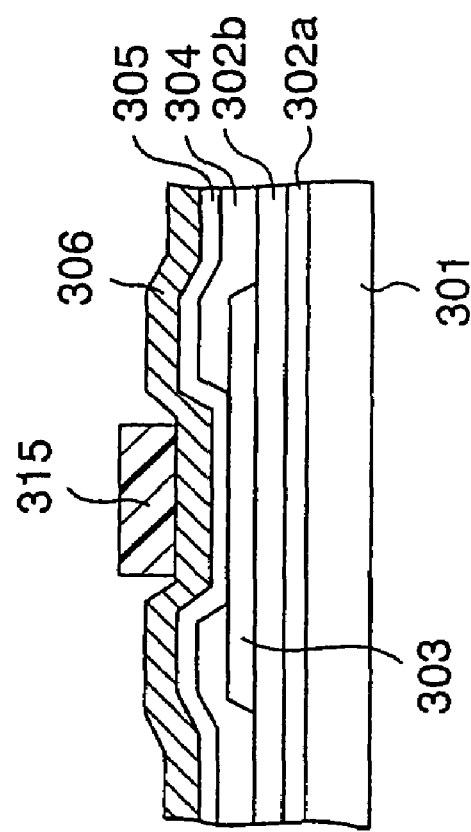
FIG. 37 is a section view (3) showing a method of manufacturing the thin film transistor device of the fifth embodiment.
Figure 37B:
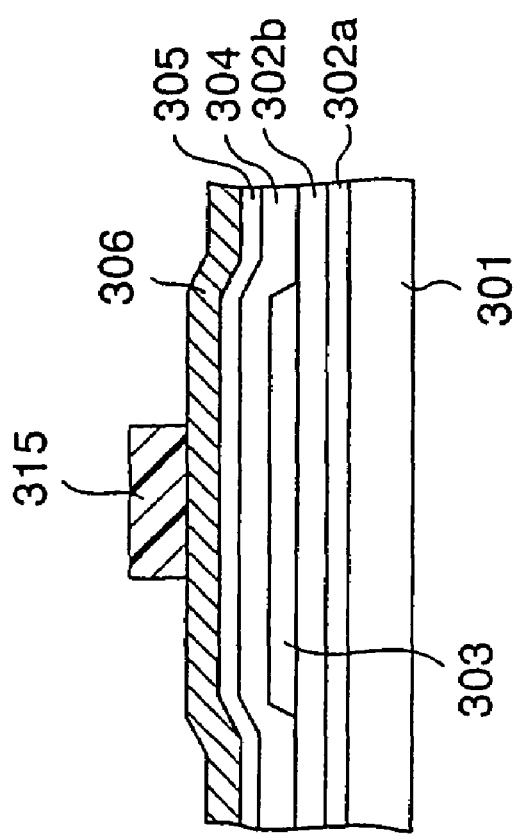

Next, as shown in FIGS. 37A and 37B, the silicon oxide film 305 is formed to a thickness of, for example, 30 nm on the entire surface of the resultant structure above the substrate 301 by use of a CVD method, and the Al—Nd film 306 is formed to a thickness of, for example, 300 nm by use of a sputtering method. Thereafter, a resist pattern 315 having a predetermined shape corresponding to the gate electrode is formed on the Al—Nd film 306.

Next, as shown in FIGS. 38A and 38B, the Al—Nd film 306 is etched using the resist pattern 315 as a mask, thus forming the gate electrodes 306a and 306b, a gate bus line (not shown), a storage capacitor bus line (not shown), and a lower layer wiring. At this time, a width of the Al—Nd film 306 is made smaller than that of the resist film 315 by side-etching the Al—Nd film 306. Moreover, widths of the silicon oxide films 304 and 305 are made approximately equal to that of the resist film 315 by dry-etching the silicon oxide films 304 and 305 using the resist film 315 as a mask in a direction perpendicular to the resist film 315. In the above described manner, a step difference between each of the gate electrodes 306a and 306b and the silicon oxide film 305 that is the gate insulating film is produced.

At this time, in the high-voltage driven TFT formation region, the silicon oxide films 304 and 305 are left below the gate electrode 306a (see FIG. 33B), and, in the low-voltage driven TFT formation region, the silicon oxide films 304 and 305 are left on the part of the edge portions of the polysilicon film 303 which vertically intersects the gate electrode 306b (see FIG. 34B).

Figure 39A:
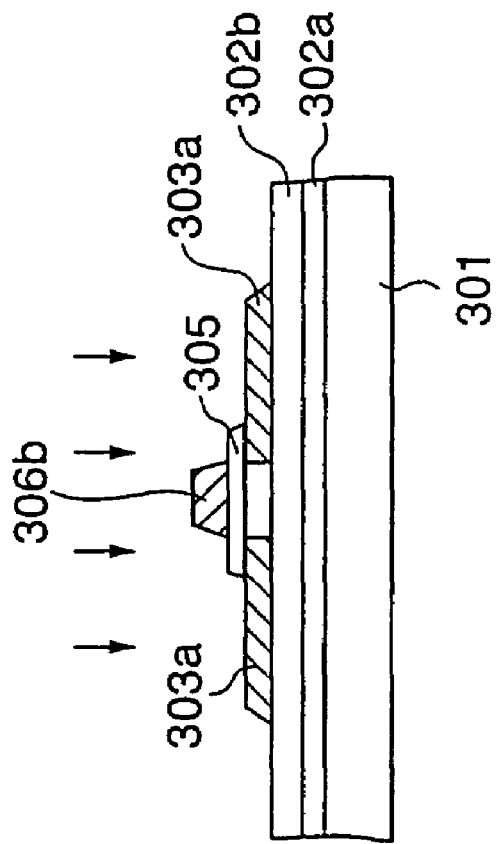
FIG. 39 is a section view (5) showing a method of manufacturing the thin film transistor device of the fifth embodiment.
Figure 39B:
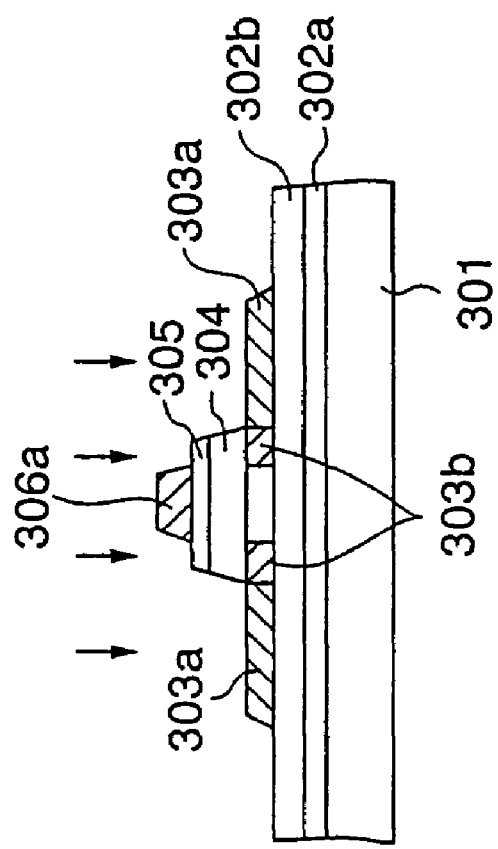

Next, as shown in FIGS. 39A and 39B, impurities are ion-implanted into the polysilicon film 303 via the silicon oxide film 305 in the low-voltage driven TFT formation region or the silicon oxide films 305 and 304 in the high-voltage driven TFT formation region. In the case of the n-type TFT, P(phosphorus) is ion-implanted, and in the case of the p-type TFT, B(boron) is ion-implanted.

At this time, by setting the ion-implant conditions properly, the high concentration impurity regions (source/drain) 303a, which have tip portions located at the positions approximately just below the edges of the gate electrode 306b, are formed in the polysilicon film 303 of the low-voltage driven TFT formation region, and the high concentration impurity regions (source/drain) 303a, which have tip portions located at the positions just below the edges of the gate insulating film, are formed in the polysilicon film 303 of the high-voltage driven TFT formation region. Moreover, the low concentration impurity regions (LDD layer) 303b are formed at the regions between the positions just below the respective edges of the gate electrode 306a and the position just below the respective edges of the gate insulating film 305.

Figure 40A:
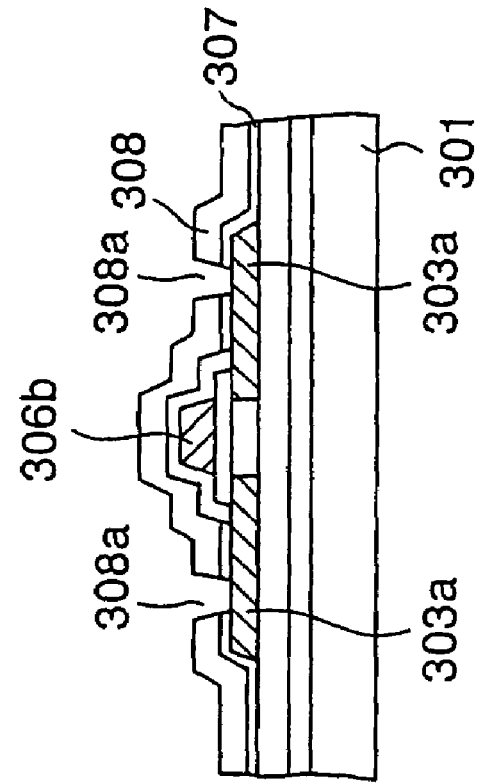
FIG. 40 is a section view (6) showing a method of manufacturing the thin film transistor device of the fifth embodiment.
Figure 40B:
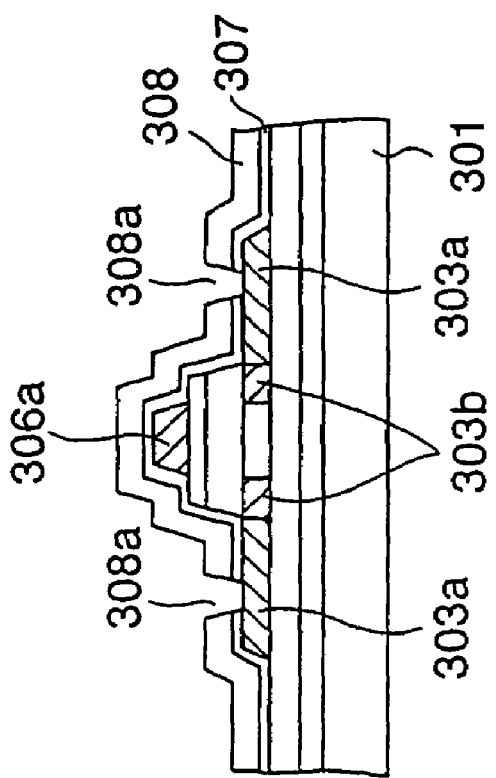

Next, as shown in FIGS. 40A and 40B, the laminated film composed of the silicon oxide film 307 and the silicon nitride film 308 as the interlayer insulating film is formed on the entire surface of the resultant structure above the substrate 301 by use of a plasma CVD method. Then, the contact holes 308a communicating with the respective high concentration impurity regions 303a are formed in this interlayer insulating film by use of a photolithography technique. Etching of the interlayer insulating film is performed by dry-etching using gas containing fluorine.

Figure 41A:
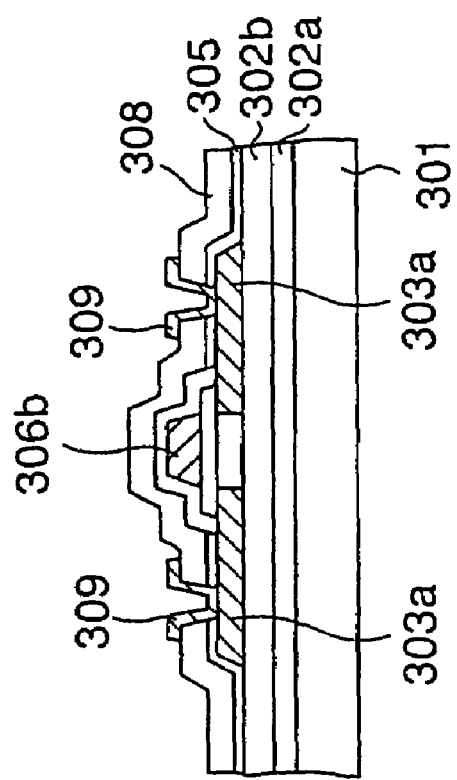
FIG. 41 is a section view (7) showing a method of manufacturing the thin film transistor device of the fifth embodiment.
Figure 41B:
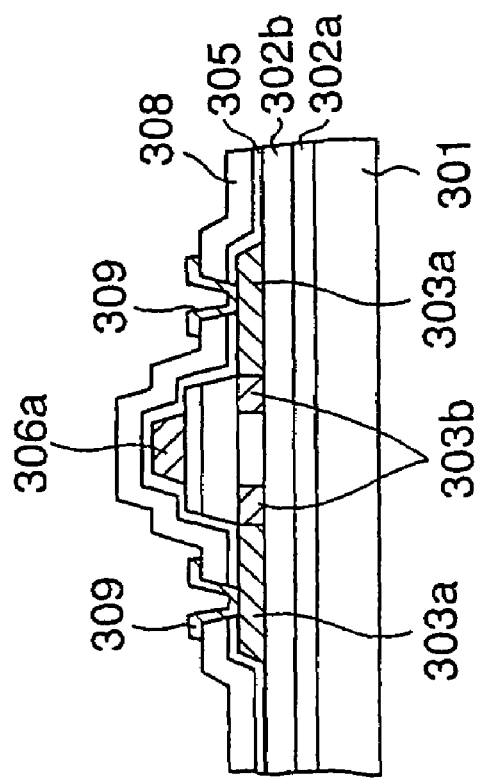

Next, Ti, Al and Ti are sequentially deposited to thicknesses of 100, 200 and 50 nm respectively on the entire surface of the resultant structure above the substrate 301 by use of a sputtering method, thus forming a conductive film having a three-layered structure. Then, using a photolithography technique, this conductive film is patterned, and the electrodes (the source electrode and the drain electrode) 309 electrically connected to the respective high concentration impurity regions 303a via the contact holes 308a, a data bus line (not shown) and an upper layer wiring (not shown) are formed, as shown in FIGS. 41A and 41B.

Next, as shown in FIGS. 42A and 42B, a silicon nitride film 310 as a second interlayer insulating film is formed to a thickness of, for example, 300 nm on the entire surface of the resultant structure above the substrate 301 by use of a plasma CVD method. Then, the silicon nitride film 310 is etched by use of a photolithography technique so that the source electrode 309 (the electrode on the right of FIG. 41A) of the high-voltage driven TFT is exposed. Etching of the silicon nitride film 310 is performed by dry-etching using gas containing fluorine.

Figure 43A:
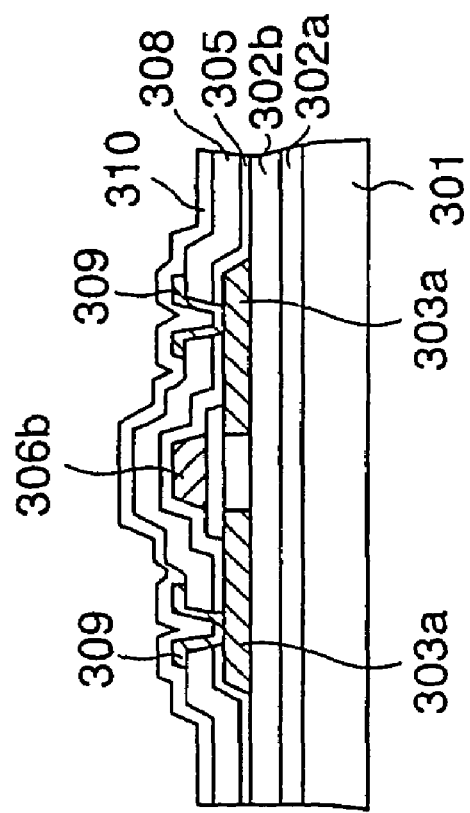
FIG. 43 is a section view (9) showing a method of manufacturing the thin film transistor device of the fifth embodiment.
Figure 43B:
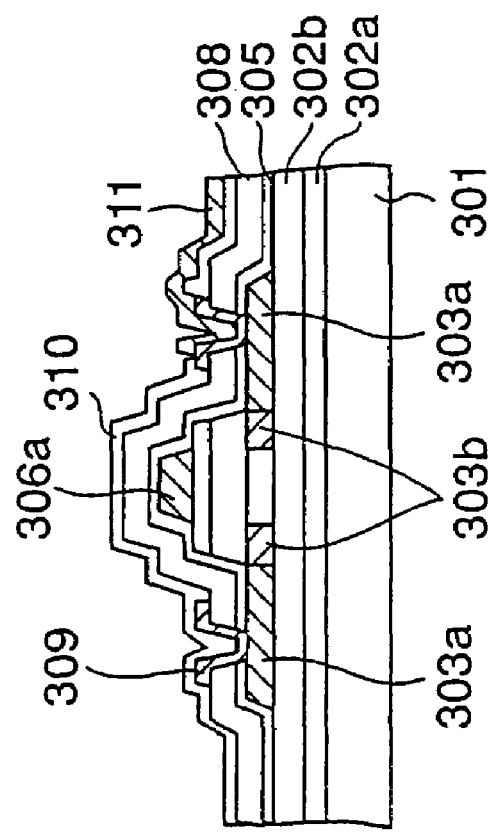

Subsequently, as shown in FIGS. 43A and 43B, an ITO film is grown to a thickness of, for example, 70 nm on the entire surface of the resultant structure above the substrate 301 by use of a sputtering method, and the ITO film is patterned by use of a photolithography technique, thus forming the pixel electrode 311. In the above described manner, the liquid crystal display apparatus is formed.

In this embodiment, the silicon oxide film 304 is etched by wet-etching, thus removing the silicon oxide film 304 on the polysilicon film of the low-voltage driven TFT formation region. With such a method, the polysilicon film 303 is less damaged compared to a method in which the silicon oxide film 304 is removed by plasma etching, and hence deterioration of characteristics of the TFT is avoided. Moreover, at this time, since the silicon oxide film 304 exists on the part of the edge portions of the polysilicon film 303 of the low-voltage driven TFT which vertically intersects the gate electrode 306b (see FIGS. 34A and 34B), it is avoided that when the insulating films 304 and 305 are etched, the part of the underlayer insulating film (silicon oxide film 302b) at the position where the edge of the polysilicon film 303 and the gate electrode 306b intersect with each other is etched, thus producing a scoop (concave portion). Accordingly, occurrence of leak current is avoided, and characteristics of the TFT are improved. Moreover, in this embodiment, since the LDD structure of the high-voltage driven TFT is formed in a self-alignment manner using the gate electrode 306a as a mask, variations of a length of the LDD structure can be reduced. Thus, variations of characteristics of the thin film transistor can be reduced.

Sixth Embodiment

FIGS. 45A to 47B show a method of manufacturing a thin film transistor device of a sixth embodiment of the present invention.

Figure 45A:
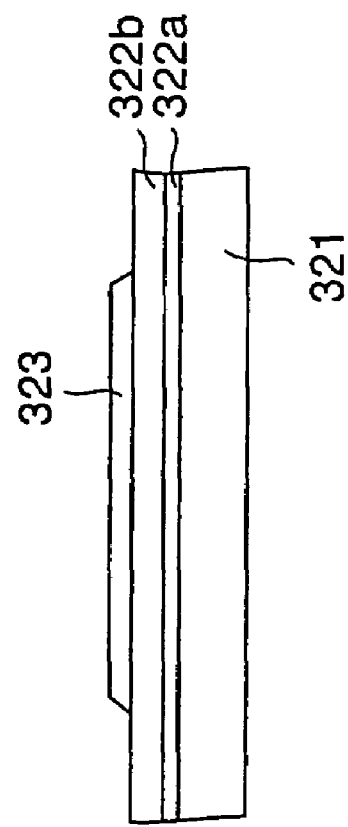
FIG. 45 is a section view (1) showing a method of manufacturing a thin film transistor device of a sixth embodiment of the present invention.
Figure 45B:
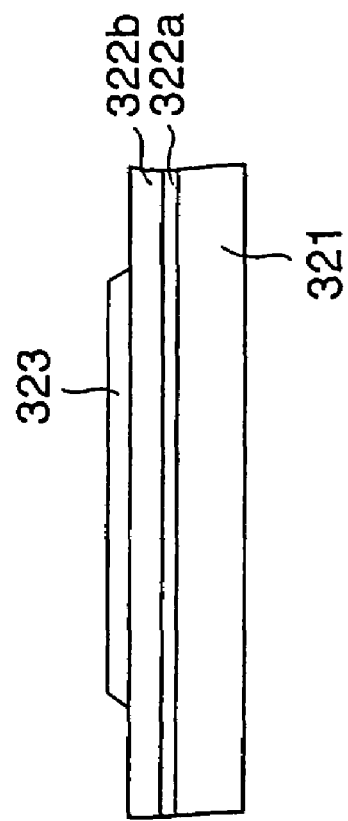

First, as shown in FIGS. 45A and 45B, a silicon nitride film 322a and a silicon oxide film 322b as an underlayer insulating film are formed on a glass substrate 321. Thereafter, a polysilicon film 323 is formed on a predetermined region of the silicon oxide film 322b by use of a plasma CVD method.

Figure 46A:
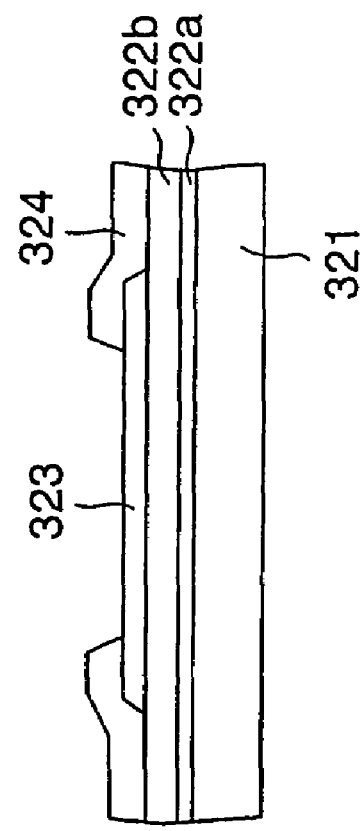
FIG. 46 is a section view (2) showing a method of manufacturing the thin film transistor device of the sixth embodiment of the present invention.
Figure 46B:
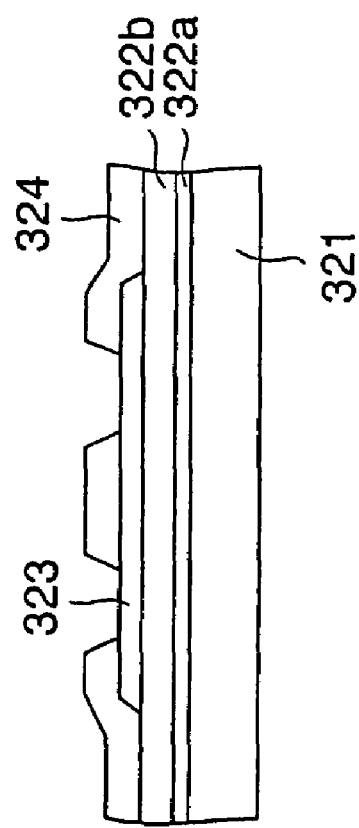
Figure 48A:
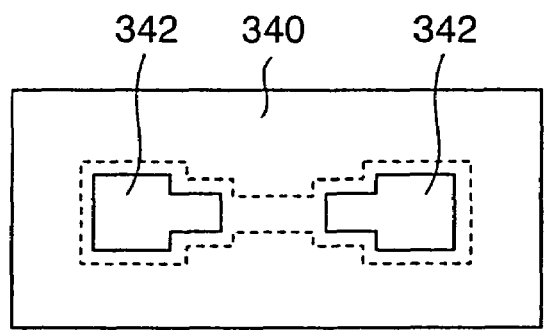
FIG. 48 is a drawing showing an example of a resist pattern used in the sixth embodiment.
Figure 48B:
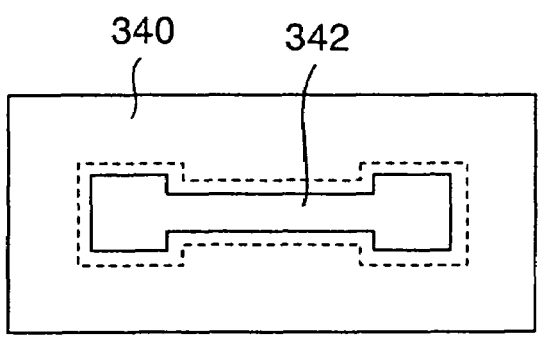

Next, as shown in FIGS. 46A and 46B, a silicon oxide film 324 is formed to a thickness of, for example, 100 nm on the entire surface of the resultant structure above the substrate 321. Then, the silicon oxide film 324 is selectively etched, and forms opening portions to which the polysilicon film 323 is exposed. In this case, as shown in FIGS. 48A and 48B, a mask 340 having opening portion 342 formed therein is used. In the high-voltage driven TFT formation region, silicon oxide film 324 is left on the edge portions of the polysilicon film 323, channel region and a low concentration impurity region is left. In the low-voltage driven TFT formation region, the silicon oxide film 324 is left on the edge portions of the polysilicon film 323. FIGS. 48A shows a shape of the opening portion 342 of the resist film 340 in the high-voltage driven TFT formation region, and FIG. 48B shows a shape of the opening portion 342 of the resist film 340 in the low-voltage driven TFT formation region. Moreover, in FIGS. 48A and 48B, broken lines show a shape of the polysilicon film 323.

Figure 47A:
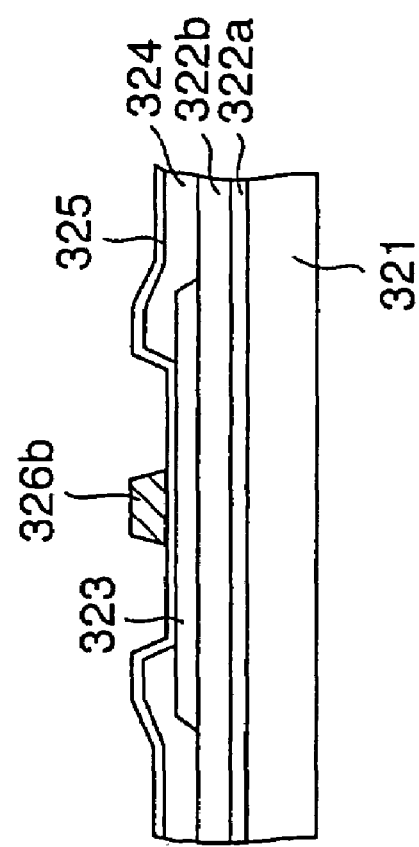
FIG. 47 is a section view (3) showing a method of manufacturing the thin film transistor device of the sixth embodiment of the present invention.
Figure 47B:
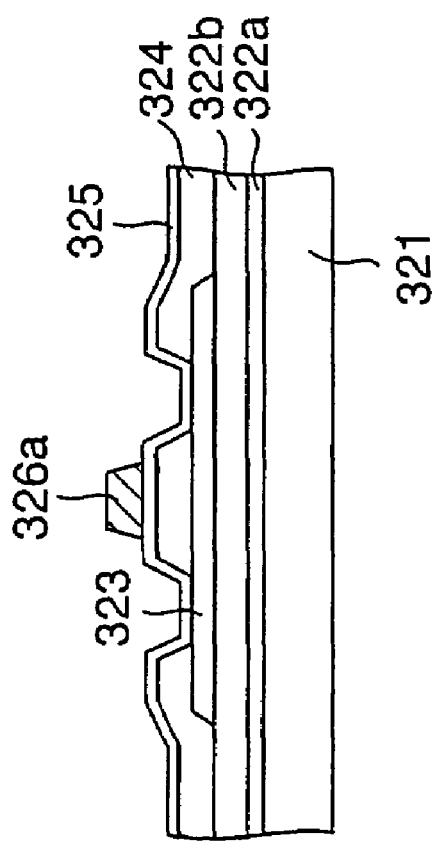

Next, as shown in FIGS. 47A and 47B, a silicon oxide film 325 is formed on the entire surface of the resultant structure above the substrate 321. Then, a metal film is formed on the silicon oxide film 325, and this metal film is patterned, thus forming gate electrodes 326a and 326b.

Thereafter, similarly to the fifth embodiment, impurities are introduced into the polysilicon film 323, thus forming high concentration impurity regions (source/drain) and LDD regions (low concentration impurity region). Thereafter, an insulating film and a pixel electrode are formed. In the above described manner, a liquid crystal display apparatus of this embodiment is manufactured.

In this embodiment, since a step difference can be formed between the gate insulating film and the gate electrode by use of the resist mask in etching the silicon oxide film 324, the LDD region of the high-voltage driven TFT can be formed without use of side-etching and increasing the number of masks.

Furthermore, also in this embodiment, since the thick silicon oxide film 324 is formed on the edge portions of the polysilicon film 323, occurrence of a scoop (formation of a concave portion) in the underlayer insulating film is prevented, and a leak current is suppressed.

Figure 49A:
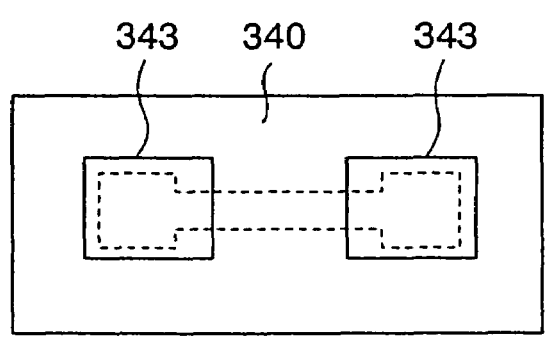
FIG. 49 is a drawing showing another example of the resist pattern used in the sixth embodiment.
Figure 49B:
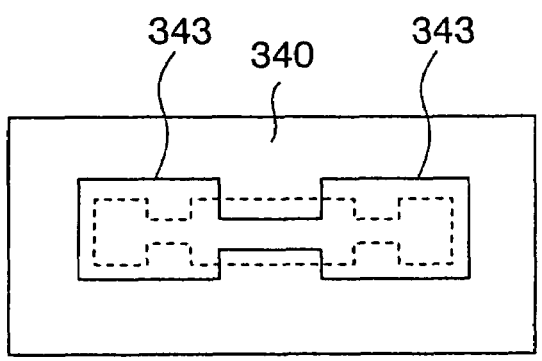

Furthermore, the silicon oxide film 324 is etched by using the resist film 340 as a mask, which has the opening portions 343 as shown in FIGS. 49A and 49B, and the polysilicon film 323 may be exposed. Since in this resist film 340, the silicon oxide film 324 is formed on the part of the edge portions of the polysilicon film 323, which intersects the gate electrode 326b, etching of the silicon oxide film 322b that is the underlayer insulating film is prevented, and deterioration of the gate withstand voltage is avoided. In addition, since the silicon oxide film 324 on the edge portions of the high concentration impurity region is removed, an area of the polysilicon film 323 can be reduced.

Seventh Embodiment

FIGS. 50A to 57B are section views showing a method of manufacturing a thin film transistor device of a seventh embodiment of the present invention.

First, as shown in FIGS. 50A and 50B, a silicon nitride film 402a and a silicon oxide film 402b are respectively formed to thicknesses of 50 and 200 nm as a underlayer insulting film on a substrate 401 formed of insulating glass and or the like by use of a CVD method.

Next, a polysilicon film 403 is formed to a thickness of 50 nm on a predetermined region of the silicon oxide film 402b. Specifically, an amorphous silicon film is formed on the silicon oxide film 402b by use of a plasma CVD method. Thereafter, annealing is performed for two hours at a temperature of 450° C. in an atmosphere of nitrogen, and thus hydrogen in the amorphous silicon film is reduced.

Subsequently, a laser beam is irradiated onto the amorphous silicon film under a condition of power of 400 mJ/cm$^2$, and the amorphous silicon film is converted to polysilicon film. Thereafter, the polysilicon film is patterned by use of a photolithography technique.

After the polysilicon film 403 is formed in the above described manner, a silicon oxide film 404 is formed to a thickness of 30 nm on the entire surface of the resultant structure above the substrate 401 by use of a plasma CVD method. Thereafter, annealing is performed for two hours at a temperature of 450° C. in an atmosphere of nitrogen.

Figures 51A, 51B:
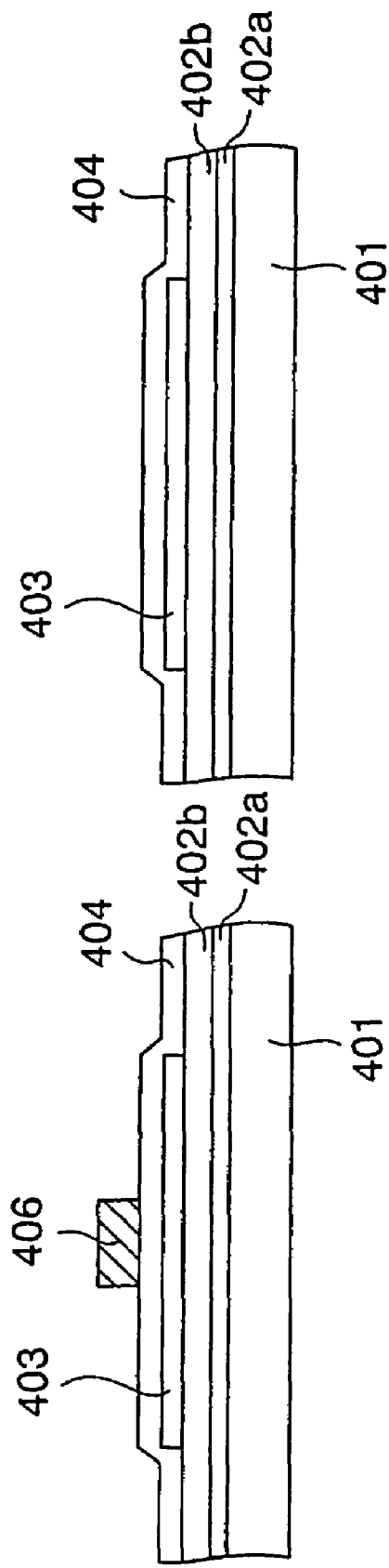
FIG. 51 is a section view (2) showing a method of manufacturing the thin film transistor device of the seventh embodiment of the present invention.

Next, an Al (aluminium) film 405 is formed to a thickness of 300 nm on the entire surface of the resultant structure above the substrate 401 by use of a sputtering method. Then, a resist pattern with a predetermined shape of the gate electrode is formed on the Al film 405, and the Al film 405 is wet-etched by use of this resist pattern as a mask, thus forming a gate electrode 406 of the low-voltage driven TFT as shown in FIG. 51A. An aqueous solution containing H$_3$PO$_4$+CH$_3$COOH+HNO$_3$ is used for etching the Al film. Moreover, in the high-voltage driven TFT formation region, the Al film 405 is entirely removed as shown in FIG. 51B.

Next, as shown in FIGS. 52A and 52B, a silicon oxide film 407 is formed to a thickness of 90 nm on the entire surface of the resultant structure above the substrate 401 by use of a plasma CVD method. Furthermore, an Al film 408 is formed to a thickness of 300 nm on the silicon oxide film 407 by use of a sputtering method.

Figure 53A:
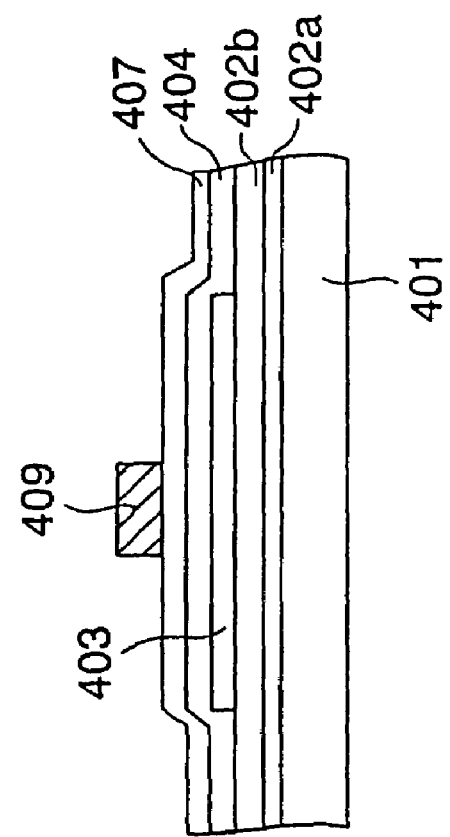
FIG. 53 is a section view (4) showing a method of manufacturing the thin film transistor device of the seventh embodiment of the present invention.
Figure 53B:
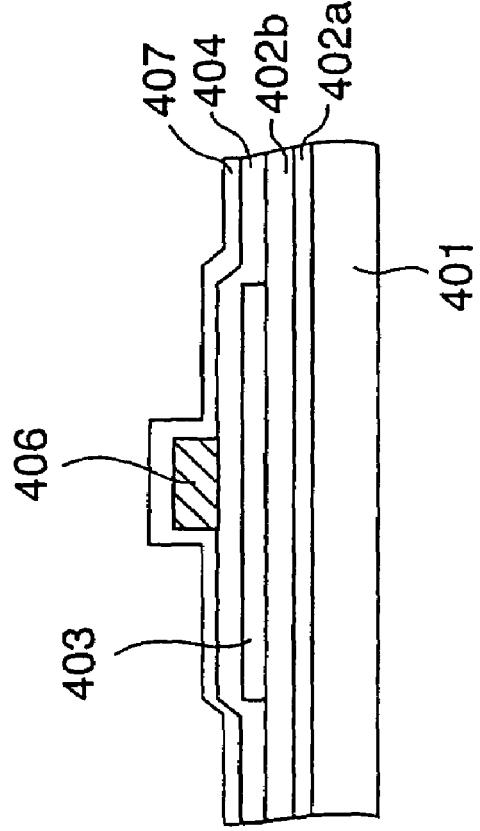

Thereafter, a resist pattern (not shown) with a predetermined shape of a gate electrode is formed on the Al film 408. Then, the Al film 408 is wet-etched using this resist pattern as a mask, thus forming a gate electrode 409 of the high-voltage driven TFT as shown in FIG. 53B. An aqueous solution containing H$_3$PO$_4$+CH$_3$COOH+HNO$_3$ is used as etchant. In this case, side-etching is performed so that a width of the gate electrode 409 is made narrower than the width of the resist pattern by an amount equivalent to the LDD region. Furthermore, as shown in FIG. 53A, the Al film 408 on the silicon oxide film 407 is entirely removed in the low-voltage driven TFT formation region.

Next, as shown in FIGS. 54A and 54B, the silicon oxide films 404 and 407 are subjected to anisotropic dry-etching by use of CHF$_3$ gas using the resist pattern as a mask. Thus, in the high-voltage driven TFT formation region, a step difference between the gate electrode 409 and the gate insulating film (the silicon oxide films 404 and 407) is formed. Thereafter, the resist pattern is removed.

Figure 55A:
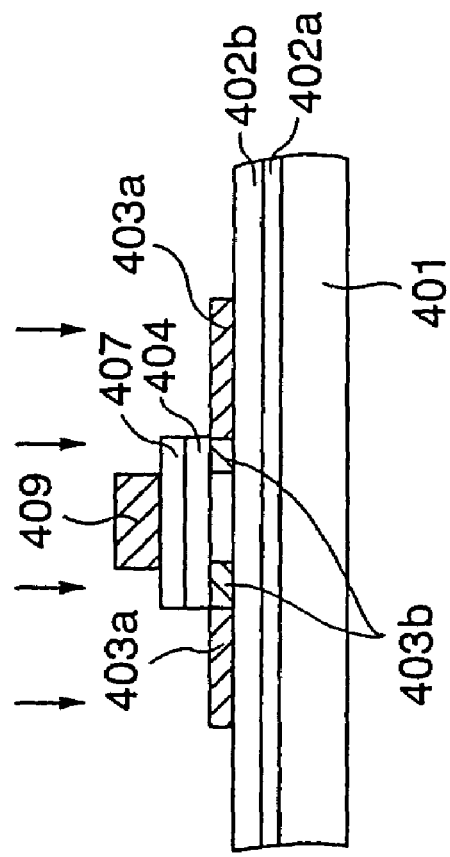
FIG. 55 is a section view (6) showing a method of manufacturing the thin film transistor device of the seventh embodiment of the present invention.
Figure 55B:
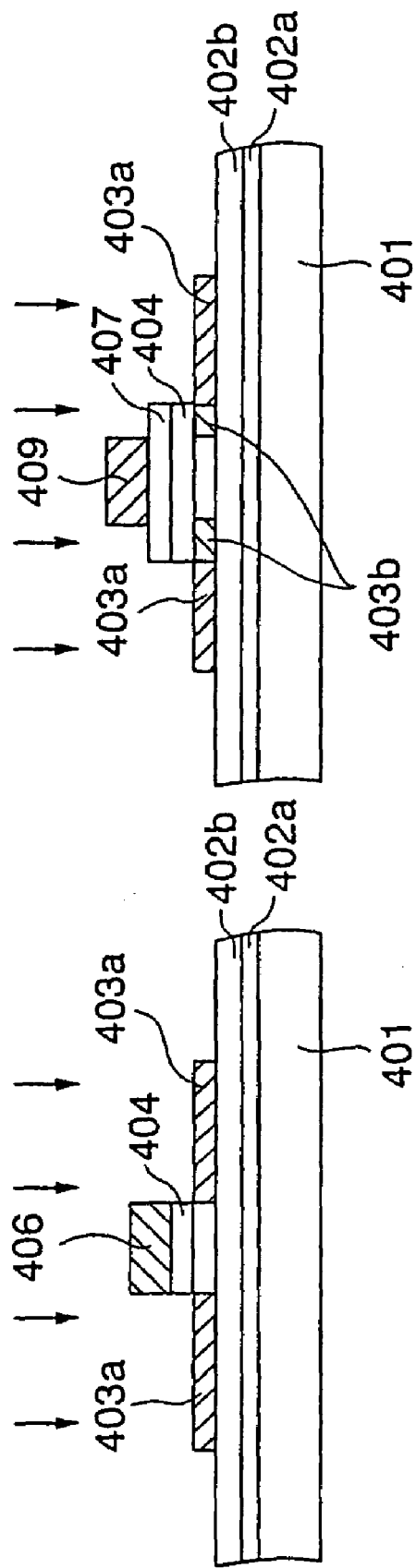

Subsequently, as shown in FIGS. 55A and 55B, impurities are injected into the polysilicon film 403, thus forming high concentration impurity regions 403a and LDD regions (low concentration impurity region) 403b serving as a source/drain. In the case of an n-type low-voltage driven TFT, P(phosphorus) is ion-implanted into the polysilicon film 403 under conditions of acceleration energy of 10 keV and a dose amount of 4×10$^{15}$ cm$^{-2}$ by use of PH$_3$/H$_2$ gas, thus forming high concentration impurity regions 403a. Moreover, in the case of a p-type low-voltage driven TFT, B(boron) is ion-implanted into the polysilicon film 403 under conditions of acceleration energy of 10 keV and a dose amount of 1×10$^{15}$ cm$^{-2}$ by use of B$_2$H$_6$/H$_2$ gas, thus forming high concentration impurity regions 403a.

In the case of an n-type high-voltage driven TFT, P(phosphorus) is ion-implanted into the polysilicon film 403 under conditions of acceleration energy of 90 keV and a dose amount of 1×10$^{14}$ cm$^{-2}$ by use of PH$_3$/H$_2$ gas. Subsequently, P(phosphorus) is ion-implanted into the polysilicon film 403 under conditions of acceleration energy of 10 keV and a dose amount of 1×10$^{15}$ cm$^{-2}$, thus forming high concentration impurity regions 403a and LDD regions 403b. Thereafter, a laser beam with power of 280 mJ/cm$^2$ is irradiated onto the entire surface of the resultant structure above the substrate 401, thus activating the impurities.

Next, as shown in FIGS. 56A and 56B, a silicon oxide film and a silicon nitride film as an interlayer insulating film 410 are sequentially formed to thicknesses of 30 and 370 nm on the entire surface of the resultant structure above the substrate 401 by use of a plasma CVD method. Thereafter, a resist film (not shown) in which opening portions for forming contact holes are provided is formed on the interlayer insulating film 410, and the interlayer insulating film 410 is etched by use of gas containing CF$_4$+O$_2$ and solutions of HF+NH$_4$F+H$_2$O respectively, thus forming contact holes respectively communicating with the high concentration impurity regions 403a and the gate electrodes 406 and 409. Thereafter, the resist film is removed.

Figure 57A:
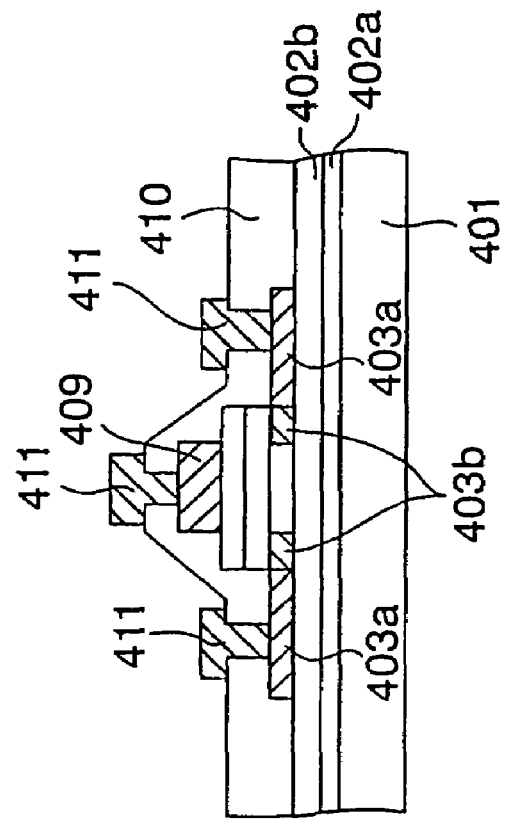
FIG. 57 is a section view (8) showing a method of manufacturing the thin film transistor device of the seventh embodiment of the present invention.
Figure 57B:
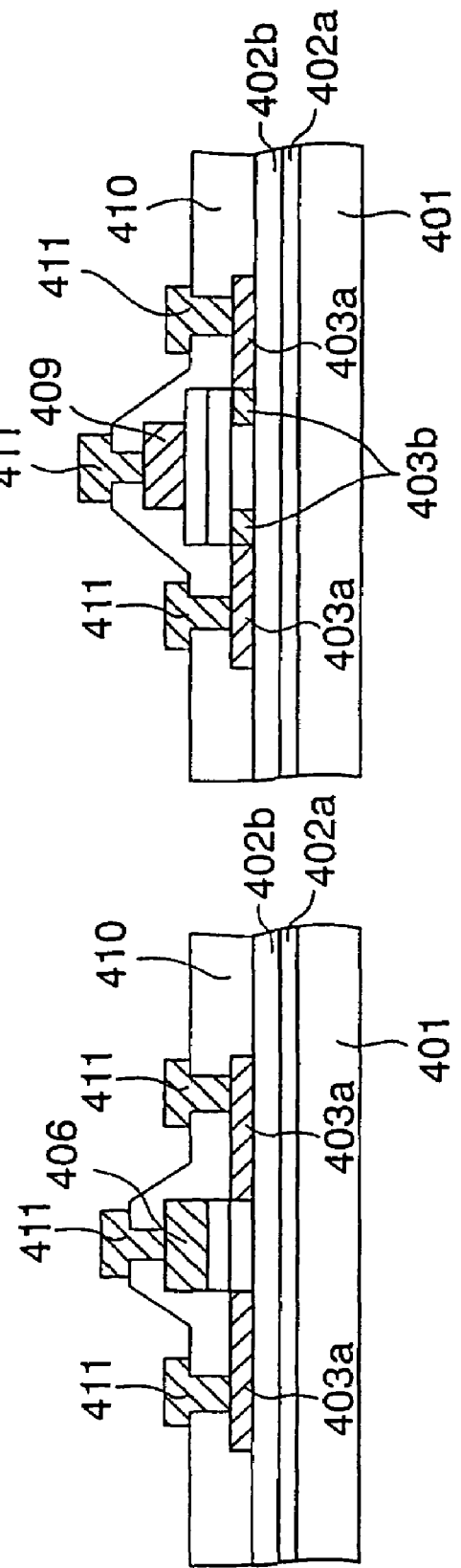

Subsequently, a Ti film, an Al film and a Ti film are sequentially formed to thicknesses of 100, 200 and 100 nm on the entire surface of the resultant structure above the substrate 401 by use of a sputtering method, thus forming a conductive film having a three-layered structure. Then, a resist film (not shown) with a predetermined pattern is formed on the conductive film, and the conductive film is patterned by use of gas containing Cl$_2$+BCl$_3$+CCl$_4$. Thus, as shown in FIGS. 57A and 57B, electrodes 411 which electrically are connected to the high concentration impurity regions 403a and the gate electrodes 406 and 409 are formed.

In the above described manner, the thin film transistor device of this embodiment is manufactured. In this embodiment, according to the foregoing method, the thin film transistor which has the thin gate insulating film and can perform a high speed operation at a low voltage, and the thin film transistor which has the thick gate insulating film and can operate at a high voltage can be formed in comparatively simple steps. In this case, since the thicknesses of the gate insulating films of the low and high-voltage driven TFTs can be controlled with a high precision, variations of characteristics of the TFTs is avoided. Moreover, since an interface between the polysilicon film and the gate insulating film is not influenced, deterioration of the characteristics of the TFTs is avoided.

What is claimed is:

1. A method of manufacturing a thin film transistor device, comprising:
   (1) a step for forming a semiconductor film on a substrate, and patterning said semiconductor film, thus forming a first semiconductor film in a low-voltage driven thin film transistor formation region and a second semiconductor film in a high-voltage driven thin film transistor formation region;
   (2) a step for forming a first insulating film on said first and second semiconductor films;
   (3) a step for forming a first gate electrode on said first insulating film in said low-voltage driven thin film transistor formation region;
   (4) a step for forming a second insulating film on the entire surface of the resultant structure above said substrate;
   (5) a step for forming a second gate electrode on said second insulating film in said high-voltage driven thin film transistor formation region; and
   (6) a step for etching said first and second insulating films, thus forming a first gate insulating film below said first gate electrode and a second gate insulating film below said second gate electrode, said second gate insulating film having a width larger than that of said second gate electrode.

2. A method of manufacturing a thin film transistor device according to claim 1, wherein said second gate insulating film has a width larger than that of said second gate electrode, and further comprising:
   a step for forming a pair of high concentration impurity regions by injecting impurities into said first semiconductor film of both sides of said first gate electrode, and forming a pair of high concentration impurity regions by injecting impurities into said second semiconductor film of both sides of said second insulating film, and forming a pair of low concentration impurity regions by introducing impurities into said second semiconductor film on both sides of said second gate electrodes under conditions that the impurities pass through said second gate insulating film.

3. A method of manufacturing a thin film transistor device, comprising:
   a step for forming a semiconductor film on a substrate, and patterning said semiconductor film, thus forming a first semiconductor film in a low-voltage driven thin film transistor formation region and a second semiconductor film in a high-voltage driven thin film transistor formation region;
   a step for forming a first insulating film on said first and second semiconductor films;
   a step for forming a first gate electrode on said first insulating film in said low-voltage driven thin film transistor formation region;
   a step for forming a second insulating film on the entire surface of said first gate electrode and said first insulating film above said substrate;
   a step for forming a second gate electrode on said second insulating film in said high-voltage driven thin film transistor formation region; and
   a step for etching said first and second insulating films, thus forming a first gate insulating film below said first gate electrode and a second gate insulating film below said second gate electrode, said second gate insulating film having a width larger than that of said second gate electrode.

4. A method of manufacturing a thin film transistor device according to claim 3, wherein said second gate insulating film has a width larger than that of said second gate electrode, and further comprising:
   a step for forming a pair of high concentration impurity regions by injecting impurities into said first semiconductor film of both sides of said first gate electrode, and forming a pair of high concentration impurity regions by injecting impurities into said second semiconductor film of both sides of said second insulating film, and forming a pair of low concentration impurity regions by introducing impurities into said second semiconductor film on both sides of said second gate electrodes under conditions that the impurities pass through said second gate insulating film.

* * * * *